US010941485B2

(12) United States Patent
Argibay et al.

(10) Patent No.: US 10,941,485 B2
(45) Date of Patent: Mar. 9, 2021

(54) DIAMOND-LIKE CARBON FILMS AND USES THEREOF

(71) Applicant: National Technology & Engineering Solutions of Sandia, LLC, Albuquerque, NM (US)

(72) Inventors: Nicolas Argibay, Albuquerque, NM (US); Michael T. Dugger, Tijeras, NM (US); Michael E. Chandross, Albuquerque, NM (US); Tomas Farley Babuska, Bethlehem, PA (US); Brendan L. Nation, Albuquerque, NM (US); John Curry, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 114 days.

(21) Appl. No.: 16/418,678

(22) Filed: May 21, 2019

(65) Prior Publication Data

US 2019/0352773 A1 Nov. 21, 2019

Related U.S. Application Data

(60) Provisional application No. 62/674,404, filed on May 21, 2018.

(51) Int. Cl.
| | | |
|---|---|---|
| *C23C 16/27* | (2006.01) | |
| *B05D 5/08* | (2006.01) | |
| *B05D 3/12* | (2006.01) | |
| *F01M 9/02* | (2006.01) | |

(52) U.S. Cl.
CPC ............ *C23C 16/276* (2013.01); *B05D 3/12* (2013.01); *B05D 5/08* (2013.01); *B05D 2202/40* (2013.01); *B05D 2350/65* (2013.01); *F01M 9/02* (2013.01)

(58) Field of Classification Search
CPC ........ B05D 3/12; B05D 5/08; B05D 2202/40
See application file for complete search history.

(56) References Cited

U.S. PATENT DOCUMENTS

| 5,554,415 | A | 9/1996 | Turchan et al. |
| 6,562,445 | B2 | 5/2003 | Iwamura |
| 8,071,164 | B1 | 12/2011 | Dugger et al. |
| 9,463,532 | B2 | 10/2016 | Boyle et al. |
| 10,199,788 | B1 | 2/2019 | Argibay et al. |
| 2005/0064196 | A1 | 3/2005 | Martin et al. |
| 2007/0082129 | A1 | 4/2007 | Shimoda et al. |
| 2009/0130325 | A1* | 5/2009 | Hirakuri ............. C23C 16/0245 427/450 |
| 2011/0064879 | A1* | 3/2011 | Wang ..................... C23C 16/18 427/255.28 |

(Continued)

OTHER PUBLICATIONS

Luo, "Tribofilms in solid lubricants" (2013) Sheffield Hallam University (Year: 2013).*

(Continued)

*Primary Examiner* — Nathan T Leong
(74) *Attorney, Agent, or Firm* — Helen S. Baca; Kevin W. Bieg

(57) ABSTRACT

The present invention relates to methods of forming a film between two surfaces, in which the film includes diamond-like carbon. Also provided herein are uses of such films, such in sliding contacts and in metal coatings.

17 Claims, 17 Drawing Sheets

(56) References Cited

U.S. PATENT DOCUMENTS

| | | | |
|---|---|---|---|
| 2011/0256356 A1* | 10/2011 | Tomantschger | C25D 17/008 428/172 |
| 2014/0014616 A1 | 1/2014 | Mosendz et al. | |
| 2014/0319432 A1 | 10/2014 | Goeke et al. | |
| 2014/0334991 A1 | 11/2014 | Johnson et al. | |
| 2017/0057877 A1 | 3/2017 | Cooley | |

OTHER PUBLICATIONS

International Search Report and the Written Opinion of the International Searching Authority for International Application No. PCT/US19/33346 (international filing date of May 21, 2019), dated Aug. 9, 2019 (8 pp.).
U.S. Appl. No. 15/649,496, filed Jul. 13, 2017, Nation.
U.S. Appl. No. 15/659,479, filed Jul. 25, 2017, Nation et al.
U.S. Appl. No. 15/659,477, filed Jul. 25, 2017, Nation et al.
U.S. Appl. No. 15/659,467, filed Jul. 25, 2017, Nation et al.
U.S. Appl. No. 15/950,905, filed Apr. 11, 2018, Leathe et al.
U.S. Appl. No. 15/968,618, filed May 1, 2018, Argibay et al.
Abdeljawad F et al., "Grain boundary segregation in immiscible nanocrystalline alloys," *Acta Mater.* 2017;126:528-539.
Argibay N et al., "In-situ tribochemical formation of self-lubricating diamond-like carbon films," *Carbon* 2018;138:61-68.
Argibay N et al., "Linking microstructural evolution and macroscale friction behavior in metals," *J. Mater. Sci.* 2017;52:2780-2799.
Argibay N et al., "On the thermal stability of physical vapor deposited oxide-hardened nanocrystalline gold thin films," *J. Appl. Phys.* 2015;117:145302 (13 pp.).
Argibay N et al., "The promise of stable nanocrystalline metals: ultra-low wear and diamond-like carbon from thin air," *Sandia Report* No. SAND2018-3004PE, Mar. 2018 (37 pp.).
Argibay N, "The connection between microstructural evolution and friction in metals: combining experiments, simulations and theory into a predictive model," *Sandia Report* No. SAND2018-6267C, Jun. 2018 (36 pp.).
Argibay N et al., "DLC from thin air: in situ formation of diamond-like carbon on ultralow wear metals," *Sandia Report* No. SAND2019-1663A, Jun. 2019 (3 pp.).
Argibay N et al., "In-situ tribochemical formation of self-lubricating DLC films," *Sandia Report* No. SAND2019-4358C, Jun. 2018 (1 p.).
Argibay N et al., "High thermal stability nanocrystalline gold films—part II," *Sandia Report* No. SAND2014-19612C, Nov. 2014 (31 pp.).
Argibay N et al., "Nanocrystalline Pt-Au MEMS electrical switches," *Sandia Report* No. SAND2017-11198C, Apr. 2017 (49 pp.).
Argibay N et al., "Is intrinsic nanocrystalline stability practically achievable? insights from investigations with Pt-Au alloys," *Sandia Report* No. SAND2017-11199C, Nov. 2016 (32 pp.).
Argibay N et al., "Ultralow wear of stable nanocrystalline metals," *Sandia Report* No. SAND2017-11319C, Oct. 2017 (22 pp.).
Asay DB et al., "Macro-to nanoscale wear prevention via molecular adsorption," *Langmuir* 2008;24:155-159.
Babuska T et al., "Low friction in metal contacts: linking microstructural evolution and tribology," *Sandia Report* No. SAND2017-5698C, May 2017 (19 pp.).
Barbour JC et al., "Elastic Recoil Detection: ERD," in *Handbook of Modern Ion Beam Materials Analysis* (J.R. Tesmer, M. Nastasi, eds.), Materials Research Society, Pittsburgh, PA, 1995, pp. 83-138.
Berman D et al., "Few layer graphene to reduce wear and friction on sliding steel surfaces," *Carbon* 2013;54:454-459.
Burch R et al., "A review of the selective reduction of $NO_x$ with hydrocarbons under lean-burn conditions with non-zeolitic oxide and platinum group metal catalysts," *Appl. Catal. B Environ.* 2002;39:283-303.
Casiraghi C et al., "Raman spectroscopy of hydrogenated amorphous carbons," *Phys. Rev. B* 2005;72:085401 (14 pp.).

Chen X et al., "Evolution of tribo-induced interfacial nanostructures governing superlubricity in a-C:H and a-C:H:Si films," *Nat. Commun.* 2017;8:1675 (13 pp.).
Chenoweth K et al., "ReaxFF reactive force field for molecular dynamics simulations of hydrocarbon oxidation," *J. Phys. Chem. A* 2008;112:1040-1053.
Clark BG et al., "Nanostructure stability and wear of binary nanocrystalline alloys," *Sandia Report* No. SAND2016-6443C, Jul. 2016 (59 pp.).
Crobu M et al., "Tribochemistry of bulk zinc metaphosphate glasses," *Tribol. Lett.* 2010;39:121-134.
Cui L et al., "Probing the low-friction mechanism of diamond-like carbon by varying of sliding velocity and vacuum pressure," *Carbon* 2014;66:259-266.
Curry JF et al., "Achieving ultralow wear with stable nanocrystalline metals," *Adv. Mater.* 2018;30:1802026 (7 pp.).
Curry JF et al., "Achieving ultralow wear with stable nanocrystalline metals," *Sandia Report* No. SAND2019-4357C, Jun. 2018 (1 p.).
Dickrell PL et al., "Temperature and water vapor pressure effects on the friction coefficient of hydrogenated diamondlike carbon films," *J. Tribol.* 2009;131:1-5.
Dugger MT et al., "Development of friction models and solid lubricant formulations for extreme environments," *Sandia Report* No. SAND2018-13131PE, Nov. 2018 (35 pp.).
Erdemir A et al., "Carbon-based tribofilms from lubricating oils," *Nature* 2016;536:67-71.
Erdemir A et al., "Tribology of diamond-like carbon films: recent progress and future prospects," *J. Phys. D. Appl. Phys.* 2006;39:R311—R327.
Erickson GM et al., "Paleo-tribology: development of wear measurement techniques and a three-dimensional model revealing how grinding dentitions self-wear to enable functionality," *Surf. Topogr. Metrol. Prop.* 2016;4:024001 (12 pp.).
Ferrari AC et al., "Interpretation of Raman spectra of disordered and amorphous carbon," *Phys. Rev. B* 2000;61:14095-14107.
Foiles SM, "Calculation of grain-boundary segregation in Ni—Cu alloys," *Phys. Rev. B* 1989;40:11502-11506.
Foiles SM et al., "Alloy stabilization of nanocrystalline grain structures: case study of Pt—Au," *Sandia Report* No. SAND2017-2067C, Feb. 2017 (18 pp.).
Furnish T et al., "Microstructural evolution and friction transitions in nanocrystalline alloys," *Sandia Report* No. SAND2016-6106C, Jun. 2016 (16 pp.).
Gosvami NN et al., "Mechanisms of antiwear tribofilm growth revealed in situ by single-asperity sliding contacts," *Science* 2015;348:102-106.
Heckman NM et al., "New nanoscale toughening mechanisms mitigate embrittlement in binary nanocrystalline alloys," *Nanoscale* 2018;10:21231-21243.
Heckman NM et al., "New nanoscale toughening mechanisms mitigate embrittlement in binary nanocrystalline alloys," *Sandia Report* No. SAND2018-11225C, Sep. 2018 (1 p.).
Hiratsuka K et al., "Tribo-catalysis in the synthesis reaction of carbon dioxide," *Tribol. Trans.* 2004;47:86-93.
Kajdas C et al., "Tribochemistry, tribocatalysis, and the negative-ion-radical action mechanism," *Proc. Inst. Mech. Eng. Part J: J. Eng. Tribol.* 2009;223:827-848.
Kim Hi et al., "Environmental effects on the friction of hydrogenated DLC films," *Tribol. Lett.* 2006;21:51-56.
Lu P et al., "On the thermal stability and grain boundary segregation in nanocrystalline PtAu alloys," *Materialia* 2019;6:100298 (9 pp.).
Marino MJ et al., "Is ultra-low friction needed to prevent wear of diamond-like carbon (DLC)? an alcohol vapor lubrication study for stainless steel/DLC interface," *Tribol. Lett.* 2011;42:285-291.
McKenzie DR et al., "Compressive-stress-induced formation of thin-film tetrahedral amorphous carbon," *Phys. Rev. Lett.* 1991;67:773-776.
Murdoch HA et al., "Stability of binary nanocrystalline alloys against grain growth and phase separation," *Acta Mater.* 2013;61:2121-2132.
Padilla II Ha et al., "A review of fatigue behaviors in nanocrystalline metals," *Exp. Mech.* 2010;50:5-23.

(56) References Cited

OTHER PUBLICATIONS

Periana RA et al., "Platinum catalysts for the high-yield oxidation of methane to a methanol derivative," *Science* 1998;280:560-564.
Qi Y et al., "Theoretical modeling of tribochemical reaction on Pt and Au contacts: mechanical load and catalysis," *ACS Appl. Mater. Interfaces* 2016;8:7529-7535.
Robertson J, "Diamond-like amorphous carbon," *Mater. Sci. Eng. R Rep.* 2002;37:129-281.
Rose F et al., "Complete characterization by Raman spectroscopy of the structural properties of thin hydrogenated diamond-like carbon films exposed to rapid thermal annealing," *J. Appl. Phys.* 2014;116:123516 (12 pp.).
Scharf TW et al., "Solid lubricants: a review," *J. Mater. Sci.* 2013;48:511-531.
Schmitz TL et al., "Wear-rate uncertainty analysis," *J. Tribol.* 2004;126:802-808.
Seki A et al., "Monte Carlo simulations of segregation at [001] twist boundaries in a Pt(Au) alloy-I. results," *Acta Metall. Mater.* 1991;39:3167-3177.
Serov A et al., "Review of non-platinum anode catalysts for DMFC and PEMFC application," *Appl. Catal. B Environ.* 2009;90:313-320.
Suh NP, "An overview of the delamination theory of wear," *Wear* 1977;44:1-16.
Sutton DC et al., "The friction of diamond-like carbon coatings in a water environment," *Friction* 2013;1:210-221.
Thompson CV, "Grain growth in thin films," *Annu. Rev. Mater. Sci.* 1990;20:245-268.
Vetter J, "60 years of DLC coatings: historical highlights and technical review of cathodic arc processes to synthesize various DLC types, and their evolution for industrial applications," *Surf. Coatings Technol.* 2014;257:213-240.
Wang B, "Recent development of non-platinum catalysts for oxygen reduction reaction," *J. Power Sources* 2005;152:1-15.
Yang L et al., "Well-dispersed PtAu nanoparticles loaded into anodic titania nanotubes: a high antipoison and stable catalyst system for methanol oxidation in alkaline media," *J. Phys. Chem. C* 2007;111:16613-16617.
Zhang J et al., "Highly active PtAu alloy nanoparticle catalysts for the reduction of 4-nitrophenol," *Nanoscale* 2014;6:2125-2130.
Zhang J et al., "On the mechanism of ZDDP antiwear film formation," *Tribol. Lett.* 2016;63:24 (15 pp.).

\* cited by examiner

DIAMOND-LIKE CARBON FILMS AND USES THEREOF

CROSS-REFERENCE TO RELATED APPLICATION

This application claims the benefit of U.S. Provisional Application No. 62/674,404, filed May 21, 2018, which is hereby incorporated by reference in its entirety.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to methods of forming a film between two surfaces, in which the film includes diamond-like carbon. Also provided herein are uses of such films, such in sliding contacts and in metal coatings.

BACKGROUND OF THE INVENTION

Surface reactions can arise between metal interfaces in different ways. In one instance, surface catalysis can promote the conversion and processing of organic species. In other instances, stress-induced surface changes can result in wear and damage of metal components. There is a need for additional methods and compositions to control such surface reactions.

SUMMARY OF THE INVENTION

The present invention relates to the formation of a tribofilm between two contacting surfaces. As described herein, such tribofilms can exhibit superior wear characteristic, including high hardness, high wear resistance, and/or low friction coefficients. In one non-limiting sample, the tribofilm includes diamond-like carbon and a plurality of nanoparticles including one or more metals (e.g., a binary alloy, such as a PtAu system or any other described herein).

In a first aspect, the present invention features a method of forming a film, the method including: providing a first surface including a first alloy (e.g., any described herein); contacting the first surface with a second surface in the presence of one or more organic compounds (e.g., volatile); and generating a film disposed between first and second surfaces. In some embodiments, the film includes diamond-like carbon. In other embodiments, the second surface includes a metal (e.g., any described herein, such as a conductive metal) or an alloy (e.g., any described herein, such as a binary alloy).

In some embodiments, contacting includes providing a continuous flow of the one or more organic compounds. In other embodiment, the continuous flow includes one or more volatile compounds in combination with a gas (e.g., any described herein).

In some embodiments, the one or more organic compounds includes an optionally substituted alcohol, an optionally substituted carboxylic acid, an optionally substituted acid anhydride, an optionally substituted alkane, an optionally substituted alkene, and/or an optionally substituted arene (e.g., any described herein). In other embodiments, the one or more organic compounds includes an alkanol, a phenol, an aldehyde, a ketone, and/or an alkane. Any organic compound can include a salt of any compound described herein or an anhydrate of any compound described herein. In addition, any organic compound can include any compound described herein including a protecting group, as described herein.

In some embodiments, the one or more organic compounds is present at a concentration of from about 0.001 ppb to about 20 ppb (e.g., from 0.001 ppb to 0.01 ppb, 0.001 ppb to 0.02 ppb, 0.001 ppb to 0.03 ppb, 0.001 ppb to 0.04 ppb, 0.001 ppb to 0.05 ppb, 0.001 ppb to 0.06 ppb, 0.001 ppb to 0.07 ppb, 0.001 ppb to 0.08 ppb, 0.001 ppb to 0.09 ppb, 0.001 ppb to 0.1 ppb, 0.001 ppb to 0.2 ppb, 0.001 ppb to 0.3 ppb, 0.001 ppb to 0.4 ppb, 0.001 ppb to 0.5 ppb, 0.001 ppb to 0.6 ppb, 0.001 ppb to 0.7 ppb, 0.001 ppb to 0.8 ppb, 0.001 ppb to 0.9 ppb, 0.001 ppb to 1 ppb, 0.001 ppb to 2 ppb, 0.001 ppb to 5 ppb, 0.001 ppb to 7 ppb, 0.001 ppb to 10 ppb, 0.001 ppb to 20 ppb, 0.005 ppb to 0.01 ppb, 0.005 ppb to 0.02 ppb, 0.005 ppb to 0.03 ppb, 0.005 ppb to 0.04 ppb, 0.005 ppb to 0.05 ppb, 0.005 ppb to 0.06 ppb, 0.005 ppb to 0.07 ppb, 0.005 ppb to 0.08 ppb, 0.005 ppb to 0.09 ppb, 0.005 ppb to 0.1 ppb, 0.005 ppb to 0.2 ppb, 0.005 ppb to 0.3 ppb, 0.005 ppb to 0.4 ppb, 0.005 ppb to 0.5 ppb, 0.005 ppb to 0.6 ppb, 0.005 ppb to 0.7 ppb, 0.005 ppb to 0.8 ppb, 0.005 ppb to 0.9 ppb, 0.005 ppb to 1 ppb, 0.005 ppb to 2 ppb, 0.005 ppb to 5 ppb, 0.005 ppb to 7 ppb, 0.005 ppb to 10 ppb, 0.005 ppb to 20 ppb, 0.01 ppb to 0.02 ppb, 0.01 ppb to 0.03 ppb, 0.01 ppb to 0.04 ppb, 0.01 ppb to 0.05 ppb, 0.01 ppb to 0.06 ppb, 0.01 ppb to 0.07 ppb, 0.01 ppb to 0.08 ppb, 0.01 ppb to 0.09 ppb, 0.01 ppb to 0.1 ppb, 0.01 ppb to 0.2 ppb, 0.01 ppb to 0.3 ppb, 0.01 ppb to 0.4 ppb, 0.01 ppb to 0.5 ppb, 0.01 ppb to 0.6 ppb, 0.01 ppb to 0.7 ppb, 0.01 ppb to 0.8 ppb, 0.01 ppb to 0.9 ppb, 0.01 ppb to 1 ppb, 0.01 ppb to 2 ppb, 0.01 ppb to 5 ppb, 0.01 ppb to 7 ppb, 0.01 ppb to 10 ppb, 0.01 ppb to 20 ppb, 0.02 ppb to 0.03 ppb, 0.02 ppb to 0.04 ppb, 0.02 ppb to 0.05 ppb, 0.02 ppb to 0.06 ppb, 0.02 ppb to 0.07 ppb, 0.02 ppb to 0.08 ppb, 0.02 ppb to 0.09 ppb, 0.02 ppb to 0.1 ppb, 0.02 ppb to 0.2 ppb, 0.02 ppb to 0.3 ppb, 0.02 ppb to 0.4 ppb, 0.02 ppb to 0.5 ppb, 0.02 ppb to 0.6 ppb, 0.02 ppb to 0.7 ppb, 0.02 ppb to 0.8 ppb, 0.02 ppb to 0.9 ppb, 0.02 ppb to 1 ppb, 0.02 ppb to 2 ppb, 0.02 ppb to 5 ppb, 0.02 ppb to 7 ppb, 0.02 ppb to 10 ppb, 0.02 ppb to 20 ppb, 0.05 ppb to 0.06 ppb, 0.05 ppb to 0.07 ppb, 0.05 ppb to 0.08 ppb, 0.05 ppb to 0.09 ppb, 0.05 ppb to 0.1 ppb, 0.05 ppb to 0.2 ppb, 0.05 ppb to 0.3 ppb, 0.05 ppb to 0.4 ppb, 0.05 ppb to 0.5 ppb, 0.05 ppb to 0.6 ppb, 0.05 ppb to 0.7 ppb, 0.05 ppb to 0.8 ppb, 0.05 ppb to 0.9 ppb, 0.05 ppb to 1 ppb, 0.05 ppb to 2 ppb, 0.05 ppb to 5 ppb, 0.05 ppb to 7 ppb, 0.05 ppb to 10 ppb, 0.05 ppb to 20 ppb, 0.07 ppb to 0.08 ppb, 0.07 ppb to 0.09 ppb, 0.07 ppb to 0.1 ppb, 0.07 ppb to 0.2 ppb, 0.07 ppb to 0.3 ppb, 0.07 ppb to 0.4 ppb, 0.07 ppb to 0.5 ppb, 0.07 ppb to 0.6 ppb, 0.07 ppb to 0.7 ppb, 0.07 ppb to 0.8 ppb, 0.07 ppb to 0.9 ppb, 0.07 ppb to 1 ppb, 0.07 ppb to 2 ppb, 0.07 ppb to 5 ppb, 0.07 ppb to 7 ppb, 0.07 ppb to 10 ppb, 0.07 ppb to 20 ppb, 0.1 ppb to 0.2 ppb, 0.1 ppb to 0.3 ppb, 0.1 ppb to 0.4 ppb, 0.1 ppb to 0.5 ppb, 0.1 ppb to 0.6 ppb, 0.1 ppb to 0.7 ppb, 0.1 ppb to 0.8 ppb, 0.1 ppb to 0.9 ppb, 0.1 ppb to 1 ppb, 0.1 ppb to 2 ppb, 0.1 ppb to 5 ppb, 0.1 ppb to 7 ppb, 0.1 ppb to 10 ppb, 0.1 ppb to 20 ppb, 0.2 ppb to 0.3 ppb, 0.2 ppb to 0.4 ppb, 0.2 ppb to 0.5 ppb, 0.2 ppb to 0.6 ppb, 0.2 ppb to 0.7 ppb, 0.2 ppb to 0.8 ppb, 0.2 ppb to 0.9 ppb, 0.2 ppb to 1 ppb, 0.2 ppb to 2 ppb, 0.2 ppb to 5 ppb, 0.2 ppb to 7 ppb, 0.2 ppb to 10 ppb, 0.2 ppb to 20 ppb, 0.5 ppb to 0.6 ppb, 0.5 ppb to 0.7 ppb, 0.5 ppb to 0.8 ppb, 0.5 ppb to 0.9 ppb, 0.5 ppb to 1 ppb, 0.5 ppb to 2 ppb, 0.5 ppb to 5 ppb, 0.5 ppb to 7 ppb, 0.5 ppb to 10 ppb, 0.5 ppb to 20 ppb, 0.7 ppb to 0.8 ppb, 0.7 ppb to 0.9 ppb, 0.7 ppb to 1 ppb, 0.7 ppb to 2 ppb, 0.7 ppb to 5 ppb, 0.7 ppb to 7 ppb, 0.7 ppb to 10 ppb, 0.7 ppb to 20 ppb, 1 ppb to 2 ppb, 1 ppb to 5 ppb, 1 ppb to 7 ppb, 1 ppb to 10 ppb, 1 ppb to 20 ppb, 2 ppb to 5 ppb, 2 ppb to 7 ppb, 2 ppb to 10 ppb, 2 ppb to 20 ppb, 5 ppb to 7 ppb, 5 ppb to 10 ppb, 5 ppb to 20 ppb, 7 ppb to 10 ppb, 7 ppb to 20 ppb, or 10 ppb to 20 ppb for each organic compound or for a combination of two or more organic compounds).

In some embodiments, the generating includes sliding the first surface against the second surface for a plurality of cycles (e.g., from about 50 to about 100,000 cycles or from about 2,000 to about 100,000 cycles of bi-directional sliding).

In some embodiments, the generating comprises sliding the first surface against the second surface at a contact pressure of from about 200 MPa to about 2 GPa (e.g., from 200 MPa to 300 MPa, 200 MPa to 400 MPa, 200 MPa to 500 MPa, 200 MPa to 600 MPa, 200 MPa to 700 MPa, 200 MPa to 800 MPa, 200 MPa to 900 MPa, 200 MPa to 1 GPa, 200 MPa to 1.1 GPa, 200 MPa to 1.2 GPa, 200 MPa to 1.3 GPa, 200 MPa to 1.4 GPa, 200 MPa to about 1.5 GPa, 250 MPa to 300 MPa, 250 MPa to 400 MPa, 250 MPa to 500 MPa, 250 MPa to 600 MPa, 250 MPa to 700 MPa, 250 MPa to 800 MPa, 250 MPa to 900 MPa, 250 MPa to 1 GPa, 250 MPa to 1.1 GPa, 250 MPa to 1.2 GPa, 250 MPa to 1.3 GPa, 250 MPa to 1.4 GPa, 250 MPa to 1.5 GPa, 300 MPa to 400 MPa, 300 MPa to 500 MPa, 300 MPa to 600 MPa, 300 MPa to 700 MPa, 300 MPa to 800 MPa, 300 MPa to 900 MPa, 300 MPa to 1 GPa, 300 MPa to 1.1 GPa, 300 MPa to 1.2 GPa, 300 MPa to 1.3 GPa, 300 MPa to 1.4 GPa, 300 MPa to 1.5 GPa, 350 MPa to 400 MPa, 350 MPa to 500 MPa, 350 MPa to 600 MPa, 350 MPa to 700 MPa, 350 MPa to 800 MPa, 350 MPa to 900 MPa, 350 MPa to 1 GPa, 350 MPa to 1.1 GPa, 350 MPa to 1.2 GPa, 350 MPa to 1.3 GPa, 350 MPa to 1.4 GPa, 350 MPa to 1.5 GPa, 400 MPa to 500 MPa, 400 MPa to 600 MPa, 400 MPa to 700 MPa, 400 MPa to 800 MPa, 400 MPa to 900 MPa, 400 MPa to 1 GPa, 400 MPa to 1.1 GPa, 400 MPa to 1.2 GPa, 400 MPa to 1.3 GPa, 400 MPa to 1.4 GPa, 400 MPa to 1.5 GPa, 450 MPa to 500 MPa, 450 MPa to 600 MPa, 450 MPa to 700 MPa, 450 MPa to 800 MPa, 450 MPa to 900 MPa, 450 MPa to 1 GPa, 450 MPa to 1.1 GPa, 450 MPa to 1.2 GPa, 450 MPa to 1.3 GPa, 450 MPa to 1.4 GPa, 450 MPa to 1.5 GPa, 500 MPa to 600 MPa, 500 MPa to 700 MPa, 500 MPa to 800 MPa, 500 MPa to 900 MPa, 500 MPa to 1 GPa, 500 MPa to 1.1 GPa, 500 MPa to 1.2 GPa, 500 MPa to 1.3 GPa, 500 MPa to 1.4 GPa, 500 MPa to 1.5 GPa, 600 MPa to 700 MPa, 600 MPa to 800 MPa, 600 MPa to 900 MPa, 600 MPa to 1 GPa, 600 MPa to 1.1 GPa, 600 MPa to 1.2 GPa, 600 MPa to 1.3 GPa, 600 MPa to 1.4 GPa, 600 MPa to 1.5 GPa, 700 MPa to 800 MPa, 700 MPa to 900 MPa, 700 MPa to 1 GPa, 700 MPa to 1.1 GPa, 700 MPa to 1.2 GPa, 700 MPa to 1.3 GPa, 700 MPa to 1.4 GPa, 700 MPa to about 1.5 GPa, 800 MPa to 900 MPa, 800 MPa to 1 GPa, 800 MPa to 1.1 GPa, 800 MPa to 1.2 GPa, 800 MPa to 1.3 GPa, 800 MPa to 1.4 GPa, 800 MPa to 1.5 GPa, 900 MPa to 1 GPa, 900 MPa to 1.1 GPa, 900 MPa to 1.2 GPa, 900 MPa to 1.3 GPa, 900 MPa to 1.4 GPa, 900 MPa to 1.5 GPa, 1 GPa to 1.1 GPa, 1 GPa to 1.2 GPa, 1 GPa to 1.3 GPa, 1 GPa to 1.4 GPa, 1 GPa to 1.5 GPa, or 1.2 GPa to 1.5 GPa).

In some embodiments, the film further includes a plurality of nanoparticles including the alloy (e.g., the first binary alloy, such as any described herein).

In some embodiments, the first surface is disposed on a first electric contact, and the second surface is disposed on a second electric contact.

In a second aspect, the present invention features a sliding contact including: a first surface including a first alloy (e.g., a first binary alloy); a second surface including a metal (e.g., any metal herein, such as one including a noble metal) or a second alloy (e.g., a second binary alloy); and a film disposed between the first and second surfaces, where the film includes diamond-like carbon and a plurality of nanoparticles including the first alloy.

In some embodiments, the first alloy and/or the second alloy is a binary alloy, where the binary alloy includes a plurality of columnar grains and where at least one grain has a grain diameter of less than about 100 nm and/or an aspect ratio of at least one grain is 1:2 or greater.

In any embodiment herein, the one or more organic compounds include one or more volatile organic compounds (e.g., any described herein).

In any embodiment herein, the diamond-like carbon includes hydrogenated amorphous carbon. In some embodiments, the hydrogenated amorphous carbon includes graphitic carbon and of from about 1% to 30% hydrogen.

In any embodiment herein, the film (e.g., the tribofilm) has a thickness of from about 20 nm to about 500 nm (e.g., from about 20 nm to 50 nm, 20 nm to 75 nm, 20 nm to 100 nm, 20 nm to 125 nm, 20 nm to 150 nm, 20 nm to 175 nm, 20 nm to 200 nm, 20 nm to 250 nm, 20 nm to 300 nm, 20 nm to 350 nm, 20 nm to 400 nm, 20 nm to 450 nm, 30 nm to 50 nm, 30 nm to 75 nm, 30 nm to 100 nm, 30 nm to 125 nm, 30 nm to 150 nm, 30 nm to 175 nm, 30 nm to 200 nm, 30 nm to 250 nm, 30 nm to 300 nm, 30 nm to 350 nm, 30 nm to 400 nm, 30 nm to 450 nm, 30 nm to 500 nm, 50 nm to 75 nm, 50 nm to 100 nm, 50 nm to 125 nm, 50 nm to 150 nm, 50 nm to 175 nm, 50 nm to 200 nm, 50 nm to 250 nm, 50 nm to 300 nm, 50 nm to 350 nm, 50 nm to 400 nm, 50 nm to 450 nm, 50 nm to 500 nm, 70 nm to 75 nm, 70 nm to 100 nm, 70 nm to 125 nm, 70 nm to 150 nm, 70 nm to 175 nm, 70 nm to 200 nm, 70 nm to 250 nm, 70 nm to 300 nm, 70 nm to 350 nm, 70 nm to 400 nm, 70 nm to 450 nm, 70 nm to 500 nm, 90 nm to 100 nm, 90 nm to 125 nm, 90 nm to 150 nm, 90 nm to 175 nm, 90 nm to 200 nm, 90 nm to 250 nm, 90 nm to 300 nm, 90 nm to 350 nm, 90 nm to 400 nm, 90 nm to 450 nm, 90 nm to 500 nm, 100 nm to 125 nm, 100 nm to 150 nm, 100 nm to 175 nm, 100 nm to 200 nm, 100 nm to 250 nm, 100 nm to 300 nm, 100 nm to 350 nm, 100 nm to 400 nm, 100 nm to 450 nm, 100 nm to 500 nm, 125 nm to 150 nm, 125 nm to 175 nm, 125 nm to 200 nm, 125 nm to 250 nm, 125 nm to 300 nm, 125 nm to 350 nm, 125 nm to 400 nm, 125 nm to 450 nm, 125 nm to 500 nm, 150 nm to 175 nm, 150 nm to 200 nm, 150 nm to 250 nm, 150 nm to 300 nm, 150 nm to 350 nm, 150 nm to 400 nm, 150 nm to 450 nm, 150 nm to 500 nm, 175 nm to 200 nm, 175 nm to 250 nm, 175 nm to 300 nm, 175 nm to 350 nm, 175 nm to 400 nm, 175 nm to 450 nm, 175 nm to 500 nm, 200 nm to 250 nm, 200 nm to 300 nm, 200 nm to 350 nm, 200 nm to 400 nm, 200 nm to 450 nm, 200 nm to 500 nm, 250 nm to 300 nm, 250 nm to 350 nm, 250 nm to 400 nm, 250 nm to 450 nm, 250 nm to 500 nm, 300 nm to 350 nm, 300 nm to 400 nm, 300 nm to 450 nm, 300 nm to 500 nm, 350 nm to 400 nm, 350 nm to 450 nm, 350 nm to 500 nm, 400 nm to 450 nm, 400 nm to 500 nm, or 450 nm to 500 nm).

In any embodiment herein, the alloy (e.g., the first binary alloy) includes at least one columnar grain (e.g., a plurality of columnar grains). In further embodiments, at least one grain has a grain diameter of less than about 100 nm and/or an aspect ratio of at least one grain is 1:2 or greater (e.g., from about 1:5 to about 1:10 or any other ratios or ranges described herein). In other embodiments, at least one grain has a grain length greater than about 100 nm (e.g., including any other grain length or ranges herein). In yet other embodiments, an average grain diameter of the plurality of columnar grains is less than about 100 nm (e.g., including any other grain diameter or ranges herein), and/or an average grain length of the plurality of columnar grains in greater than about 100 nm (e.g., including any other grain length or ranges herein).

In any embodiment herein, the alloy includes columnar grains with a grain diameter (e.g., an average grain diameter) of less than about 100 nm (e.g., less than about 90 nm, 80 nm, 75 nm, 70 nm, 60 nm, 50 nm, 40 nm, 30 nm, 25 nm, 20 nm, 15 nm, 10 nm, 5 nm, 2 nm, or less) and/or of from about 0.5 nm to about 150 nm (e.g., including any range described herein); and/or a grain length (e.g., an average grain length) of greater than about 100 nm (e.g., greater than about 200 nm, 500 nm, 750 nm, 1000 nm) and/or of from about 20 nm to about 2000 nm (e.g., including any range described herein).

In any embodiment herein, the alloy (e.g., provided as a layer or a film) has a thickness greater than about 10 nm and/or less than about 1000 nm (e.g., of from about 10 nm to 25 nm, 10 nm to 50 nm, 10 nm to 75 nm, 10 nm to 100 nm, 10 nm to 250 nm, 10 nm to 500 nm, 10 nm to 750 nm, 20 nm to 25 nm, 20 nm to 50 nm, 20 nm to 75 nm, 20 nm to 100 nm, 20 nm to 250 nm, 20 nm to 500 nm, 20 nm to 750 nm, 20 nm to 1000 nm, 30 nm to 50 nm, 30 nm to 75 nm, 30 nm to 100 nm, 30 nm to 250 nm, 30 nm to 500 nm, 30 nm to 750 nm, 30 nm to 1000 nm, 50 nm to 75 nm, 50 nm to 100 nm, 50 nm to 250 nm, 50 nm to 500 nm, 50 nm to 750 nm, 50 nm to 1000 nm, 75 nm to 100 nm, 75 nm to 250 nm, 75 nm to 500 nm, 75 nm to 750 nm, 75 nm to 1000 nm, 100 nm to 250 nm, 100 nm to 500 nm, 100 nm to 750 nm, 100 nm to 1000 nm, 250 nm to 500 nm, 250 nm to 750 nm, 250 nm to 1000 nm, 500 nm to 750 nm, 500 nm to 1000 nm, and 750 nm to 1000 nm). In other embodiments, the alloy is deposited on a substrate by physical vapor deposition, chemical vapor deposition, sputter deposition, cold spray, electron beam deposition, atomic layer deposition, electroplating, or electroless plating.

In any embodiment herein, the alloy (e.g., the binary alloy) includes one or more noble metals. In some embodiments, the noble metal(s) are selected from the group consisting of Ag, Al, Au, Ba, Be, Bi, Ca, Cd, Co, Cr, Cs, Cu, Fe, Ga, Ge, Hf, In, Ir, K, La, Li, Mg, Mn, Mo, Na, Nb, Ni, Os, Pb, Pd, Pt, Rb, Re, Rh, Ru, Sb, Sc, Sn, Sr, Ta, Tc, Th, Ti, Tl, V, W, Y, Zn, and Zr. In particular embodiments, the alloy (e.g., the binary alloy) includes Pt. In other embodiments, the alloy (e.g., the binary alloy) includes Pd.

In any embodiment herein, the alloy (e.g., the binary alloy) includes Pt and Au. In some embodiment, the alloy includes less than about 50 atomic percent (at. %) of Au. In some embodiment, the gold is preferentially segregated at grain boundaries. In other embodiments, the alloy is deposited on a substrate by physical vapor deposition, chemical vapor deposition, sputter deposition, electroplating, or electroless plating.

In any embodiment herein, the alloy includes a solvent and a solute. In further embodiments, the solute is preferentially segregated at grain boundaries. In other embodiments, the solvent is selected from the group consisting of Hf, La, Mo, Nb, Ni, Os, Pt, Re, Rh, Ru, Ta, Tc, Ti, V, W, Y, and Zr (e.g., or any other described herein). In yet other embodiments, the solute is selected from the group consisting of Ag, Al, Au, Ba, Be, Bi, Ca, Cd, Co, Cr, Cs, Cu, Fe, Ga, Ge, In, K, La, Li, Mg, Mn, Na, Ni, Pb, Rb, Sb, Sc, Sn, Sr, Th, Tl, Y, Zn, and Zr (e.g., or any other described herein). In some embodiments, the solvent includes Pt, and the solute includes Au. In some embodiments, Au is preferentially segregated at grain boundaries.

In any embodiment herein, the coating and/or contact and/or alloy includes a stable, nanocrystalline structure.

In any embodiment herein, the coating and/or contact and/or alloy includes Al—Pb, Al—Zn, Co—Cd, Co—Cu, Co—Pd, Cu—Ag, Cu—Bi, Cu—Pb, Cu—Y, Fe—Ag, Fe—Au, Fe—Cu, Fe—In, Fe—Mg, Hf—Mg, Hf—Sc, Hf—Ti, Ir—Ag, Ir—Au, Ir—Cu, Ir—Ni, Ir—Pd, Ir—Rh, La—Ba, La—Ca, La—Cr, La—Li, Mn—Cd, Mo—Au, Mo—Cr, Mo—Sc, Nb—Bi, Nb—Cu, Nb—Zr, Ni—Ag, Ni—Au, Ni—Cu, Ni—Pb, Ni—Sn, Ni—Tl, Os—Ag, Os—Cu, Os—Ni, Os—Pd, Os—Rh, Pd—Au, Pt—Au, Pt—Pd, Re—Cu, Re—Ni, Re—Pd, Re—Rh, Rh—Ag, Rh—Au, Rh—Co, Rh—Cu, Rh—Ni, Rh—Pd, Ru—Ag, Ru—Cu, Ru—Ni, Ru—Pd, Ru—Rh, Sc—Au, Sc—Ba, Sc—Cr, Sc—Cu, Sc—Sr, Sr—Mn, Ta—Bi, Ta—Cu, Ta—Hf, Ta—In, Ta—Zr, Tc—Cu, Tc—Ni, Tc—Pd, Th—Cr, Th—La, Th—Mo, Th—Sc, Th—Ti, Th—V, Th—Y, Ti—Ca, Ti—K, Ti—La, Ti—Mg, Ti—Sc, V—Cd, V—Cu, V—Sc, W—Au, W—Cr, W—Cu, W—Sb, W—Sc, W—Th, W—Y, Y—Ba, Y—Ca, Y—Cr, Y—Sr, Y—Tl, Y—V, Zr—Cs, Zr—K, Zr—Mg, Zr—Sc, Zr—Ti, or Zr—Y.

Additional details follow.

Definitions

As used herein, the term "about" means +/− 10% of any recited value. As used herein, this term modifies any recited value, range of values, or endpoints of one or more ranges.

By "alkaryl" is meant an aryl group, as defined herein, attached to the parent molecular group through an alkylene group, as defined herein. Similarly, by the term "alkheteroaryl" is meant a heteroaryl group, as defined herein, attached to the parent molecular group through an alkylene group. Other groups preceded by the prefix "alk-" are defined in the same manner. The alkaryl group can be substituted or unsubstituted. For example, the alkaryl group can be substituted with one or more substitution groups, as described herein for alkyl and/or aryl. Exemplary unsubstituted alkaryl groups are of from 7 to 16 carbons ($C_{7-16}$ alkaryl), as well as those having an alkylene group with 1 to 6 carbons and an aryl group with 4 to 18 carbons (i.e., $C_{1-6}$ alk-$C_{4-18}$ aryl).

By "alkenyl" is meant an optionally substituted $C_{2-24}$ alkyl group having one or more double bonds. The alkenyl group can be cyclic (e.g., $C_{3-24}$ cycloalkenyl) or acyclic. The alkenyl group can also be substituted or unsubstituted. For example, the alkenyl group can be substituted with one or more substitution groups, as described herein for alkyl.

By "alkyl" and the prefix "alk" is meant a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic (e.g., $C_{3-24}$ cycloalkyl) or acyclic. The alkyl group can be branched or unbranched. The alkyl group can also be substituted or unsubstituted. For example, the alkyl group can be substituted with one, two, three or, in the case of alkyl groups of two carbons or more, four substituents independently selected from the group consisting of: (1) $C_{1-6}$ alkoxy (e.g., —OAk, in which Ak is an alkyl group, as defined herein); (2) $C_{1-6}$ alkylsulfinyl (e.g., —S(O)Ak, in which Ak is an alkyl group, as defined herein); (3) $C_{1-6}$ alkylsulfonyl (e.g., —SO$_2$Ak, in which Ak is an alkyl group, as defined herein); (4) amino (e.g., —NR$^{N1}$R$^{N2}$, where each of R$^{N1}$ and R$^{N2}$ is, independently, H or optionally substituted alkyl, or R$^{N1}$ and R$^{N2}$, taken together with the nitrogen atom to which each are attached, form a heterocyclyl group); (5) aryl; (6) arylalkoxy (e.g., —OA$^L$Ar, in which A$^L$ is an alkylene group and Ar is an aryl group, as defined herein); (7) aryloyl (e.g., —C(O)Ar, in which Ar is an aryl group, as defined herein); (8) azido (e.g., an —N$_3$ group); (9) cyano (e.g., a —CN group); (10) carboxyaldehyde (e.g., a —C(O)H group); (11) C$_{3-8}$ cycloalkyl; (12) halo; (13) heterocyclyl (e.g., a 5-, 6- or 7-membered ring, unless otherwise specified, containing one, two, three, or four non-carbon heteroatoms (e.g., independently selected from the group consisting of nitrogen, oxygen, phosphorous, sulfur, or halo)); (14) heterocyclyloxy (e.g., —OHet, in which Het is a heterocyclyl group); (15) heterocyclyloyl (e.g., —C(O)Het, in which Het is a heterocyclyl group); (16) hydroxyl (e.g., a —OH group); (17) N-protected amino; (18) nitro (e.g., an —NO$_2$ group); (19) oxo (e.g., an =O group); (20) C$_{3-8}$ spirocyclyl (e.g., an alkylene diradical, both ends of which are bonded to the same carbon atom of the parent group to form a spirocyclyl group); (21) C$_{1-6}$ thioalkoxy (e.g., —SAk, in which Ak is an alkyl group, as defined herein); (22) thiol (e.g., an —SH group); (23) —CO$_2$R$^A$, where R$^A$ is selected from the group consisting of (a) hydrogen, (b) C$_{1-6}$ alkyl, (c) C$_{4-18}$ aryl, and (d) C$_{1-6}$ alk-C$_{4-18}$ aryl; (24) —C(O)NO$^B$R$^C$, where each of R$^B$ and R$^C$ is, independently, selected from the group consisting of (a) hydrogen, (b) C$_{1-6}$ alkyl, (c) C$_{4-18}$ aryl, and (d) C$_{1-6}$ alk-C$_{4-18}$ aryl; (25) —SO$_2$R$^D$, where R$^D$ is selected from the group consisting of (a) C$_{1-6}$ alkyl, (b) C$_{4-18}$ aryl, and (c) C$_{1-6}$ alk-C$_{4-18}$ aryl; (26) —SO$_2$NR$^E$R$^F$, where each of R$^E$ and R$^F$ is, independently, selected from the group consisting of (a) hydrogen, (b) C$_{1-6}$ alkyl, (c) C$_{4-18}$ aryl, and (d) C$_{1-6}$ alk-C$_{4-18}$ aryl; and (27) —NR$^G$R$^H$, where each of R$^G$ and R$^H$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alk-C$_{4-18}$ aryl, (h) C$_{3-8}$ cycloalkyl, and (i) C$_{1-6}$ alk-C$_{3-8}$ cycloalkyl, wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a C$_{1-3}$, C$_{1-6}$, C$_{1-12}$, C$_{1-16}$, C$_{1-18}$, C$_{1-20}$, or C$_{1-24}$ alkyl group.

By "alkylene" is meant a multivalent (e.g., bivalent, trivalent, tetravalent, etc.) form of an alkyl group, as described herein. Exemplary alkylene groups include methylene, ethylene, propylene, butylene, etc. In some embodiments, the alkylene group is a C$_{1-3}$, C$_{1-6}$, C$_{1-12}$, C$_{1-16}$, C$_{1-18}$, C$_{1-20}$, C$_{1-24}$, C$_{2-3}$, C$_{2-6}$, C$_{2-12}$, C$_{2-16}$, C$_{2-18}$, C$_{2-20}$, or C$_{2-24}$ alkylene group. The alkylene group can be branched or unbranched. The alkylene group can also be substituted or unsubstituted. For example, the alkylene group can be substituted with one or more substitution groups, as described herein for alkyl.

By "aryl" is meant a group that contains any carbon-based aromatic group including, but not limited to, benzyl, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one, two, three, four, or five substituents independently selected from the group consisting of: (1) C$_{1-6}$ alkanoyl (e.g., —C(O)Ak, in which Ak is an alkyl group, as defined herein); (2) C$_{1-6}$ alkyl; (3) C$_{1-6}$ alkoxy (e.g., —OAk, in which Ak is an alkyl group, as defined herein); (4) C$_{1-6}$ alkoxy-C$_{1-6}$ alkyl (e.g., an alkyl group, which is substituted with an alkoxy group —OAk, in which Ak is an alkyl group, as defined herein); (5) C$_{1-6}$ alkylsulfinyl (e.g., —S(O)Ak, in which Ak is an alkyl group, as defined herein); (6) C$_{1-6}$ alkylsulfinyl-C$_{1-6}$ alkyl (e.g., an alkyl group, which is substituted by an alkylsulfinyl group —S(O)Ak, in which Ak is an alkyl group, as defined herein); (7) C$_{1-6}$ alkylsulfonyl (e.g., —SO$_2$Ak, in which Ak is an alkyl group, as defined herein); (8) C$_{1-6}$ alkylsulfonyl-C$_{1-6}$ alkyl (e.g., an alkyl group, which is substituted by an alkylsulfonyl group —SO$_2$Ak, in which Ak is an alkyl group, as defined herein); (9) aryl; (10) amino (e.g., —NR$^{N1}$R$^{N2}$, where each of R$^{N1}$ and R$^{N2}$ is, independently, H or optionally substituted alkyl, or R$^{N1}$ and R$^{N2}$, taken together with the nitrogen atom to which each are attached, form a heterocyclyl group); (11) C$_{1-6}$ aminoalkyl (e.g., meant an alkyl group, as defined herein, substituted by an amino group); (12) heteroaryl; (13) C$_{1-6}$ alk-C$_{4-18}$ aryl (e.g., A$^L$Ar, in which A$^L$ is an alkylene group and Ar is an aryl group, as defined herein); (14) aryloyl (e.g., —C(O)Ar, in which Ar is an aryl group, as defined herein); (15) azido (e.g., an —N$_3$ group); (16) cyano (e.g., a —CN group); (17) C$_{1-6}$ azidoalkyl (e.g., a —N$_3$ azido group attached to the parent molecular group through an alkyl group, as defined herein); (18) carboxyaldehyde (e.g., a —C(O)H group); (19) carboxyaldehyde-C$_{1-6}$ alkyl (e.g., —A$^L$C(O)H, in which A$^L$ is an alkylene group, as defined herein); (20) C$_{3-8}$ cycloalkyl; (21) C$_{1-6}$ alk-C$_{3-8}$ cycloalkyl (e.g., —A$^L$Cy, in which A$^L$ is an alkylene group and Cy is a cycloalkyl group, as defined herein); (22) halo (e.g., F, Cl, Br, or I); (23) C$_{1-6}$ haloalkyl (e.g., an alkyl group, as defined herein, substituted with one or more halo); (24) heterocyclyl; (25) heterocyclyloxy (e.g., —OHet, in which Het is a heterocyclyl group); (26) heterocyclyloyl (e.g., —C(O)Het, in which Het is a heterocyclyl group); (16) hydroxyl (e.g., a —OH group); (27) hydroxyl (e.g., a OH group); (28) C$_{1-6}$ hydroxyalkyl (e.g., an alkyl group, as defined herein, substituted by one to three hydroxyl groups, with the proviso that no more than one hydroxyl group may be attached to a single carbon atom of the alkyl group); (29) nitro (e.g., an —NO$_2$ group); (30) C$_{1-6}$ nitroalkyl (e.g., an alkyl group, as defined herein, substituted by one to three nitro groups); (31) N-protected amino; (32) N-protected amino-C$_{1-6}$ alkyl; (33) oxo (e.g., an =O group); (34) C$_{1-6}$ thioalkoxy (e.g., —SAk, in which Ak is an alkyl group, as defined herein); (35) thio-C$_{1-6}$ alkoxy-C$_{1-6}$ alkyl (e.g., an alkyl group, which is substituted by an thioalkoxy group —SAk, in which Ak is an alkyl group, as defined herein); (36) —(CH$_2$)$_r$CO$_2$R$^A$, where r is an integer of from zero to four, and R$^A$ is selected from the group consisting of (a) hydrogen, (b) C$_{1-6}$ alkyl, (c) C$_{4-18}$ aryl, and (d) C$_{1-6}$ alk-C$_{4-18}$ aryl; (37) —(CH$_2$)$_r$CONR$^B$R$^C$, where r is an integer of from zero to four and where each R$^B$ and R$^G$ is independently selected from the group consisting of (a) hydrogen, (b) C$_{1-6}$ alkyl, (c) C$_{4-18}$ aryl, and (d) C$_{1-6}$ alk-C$_{4-18}$ aryl; (38) —(CH$_2$)$_r$SO$_2$R$^D$, where r is an integer of from zero to four and where R$^D$ is selected from the group consisting of (a) C$_{1-6}$ alkyl, (b) C$_{4-18}$ aryl, and (c) C$_{1-6}$ alk-C$_{4-18}$ aryl; (39) —(CH$_2$)$_r$SO$_2$NR$^E$R$^F$, where r is an integer of from zero to four and where each of R$^E$ and R$^F$ is, independently, selected from the group consisting of (a) hydrogen, (b) C$_{1-6}$ alkyl, (c) C$_{4-18}$ aryl, and (d) C$_{1-6}$ alk-C$_{4-18}$ aryl; (40) —(CH$_2$)$_r$NR$^G$R$^H$, where r is an integer of from zero to four and where each of R$^G$ and R$^H$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alk-C$_{4-18}$ aryl, (h) C$_{3-8}$ cycloalkyl, and (i) $C_{1-6}$ alk-$C_{3-8}$ cycloalkyl, wherein in one embodiment no two groups are bound to the nitrogen atom through a carbonyl group or a sulfonyl group; (41) thiol; (42) perfluoroalkyl (e.g., an alkyl group, as defined herein, having each hydrogen atom substituted with a fluorine atom); (43) perfluoroalkoxy (e.g., —ORf, in which Rf is an alkyl group, as defined herein, having each hydrogen atom substituted with a fluorine atom); (44) aryloxy (e.g., —OAr, where Ar is an optionally substituted aryl group, as described herein); (45) cycloalkoxy (e.g., —OCy, in which Cy is a cycloalkyl group, as defined herein); (46) cycloalkylalkoxy (e.g., —OA$^L$Cy, in which A$^L$ is an alkylene group and Cy is a cycloalkyl group, as defined herein); and (47) arylalkoxy (e.g., —OA$^L$Ar, in which A$^L$ is an alkylene group and Ar is an aryl group, as defined herein). In particular embodiments, an unsubstituted aryl group is a $C_{4-18}$, $C_{4-14}$, $C_{4-12}$, $C_{4-10}$, $C_{6-18}$, $C_{6-14}$, $C_{6-12}$, or $C_{6-10}$ aryl group.

By "carbonyl" is meant a —C(O)— group, which can also be represented as >C=O.

By "carboxyaldehyde" is meant a —C(O)H group.

By "carboxyl" is meant a —CO$_2$H group.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.]heptyl and the like. The cycloalkyl group can also be substituted or unsubstituted. For example, the cycloalkyl group can be substituted with one or more groups including those described herein for alkyl. The cycloalkyl group can include one or more double bonds.

By "halo" is meant F, Cl, Br, or I.

By "haloalkyl" is meant an alkyl group, as defined herein, substituted with one or more halo.

By "heteroalkyl" is meant an alkyl group, as defined herein, containing one, two, three, or four non-carbon heteroatoms (e.g., independently selected from the group consisting of nitrogen, oxygen, phosphorous, sulfur, or halo).

By "heteroaryl" is meant a subset of heterocyclyl groups, as defined herein, which are aromatic, i.e., they contain 4n+2 pi electrons within the mono- or multicyclic ring system.

By "heterocyclyl" is meant a 5-, 6- or 7-membered ring, unless otherwise specified, containing one, two, three, or four non-carbon heteroatoms (e.g., independently selected from the group consisting of nitrogen, oxygen, phosphorous, sulfur, or halo). The 5-membered ring has zero to two double bonds and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include thiiranyl, thietanyl, tetrahydrothienyl, thianyl, thiepanyl, aziridinyl, azetidinyl, pyrrolidinyl, piperidinyl, azepanyl, pyrrolyl, pyrrolinyl, pyrazolyl, pyrazolinyl, pyrazolidinyl, imidazolyl, imidazolinyl, imidazolidinyl, pyridyl, homopiperidinyl, pyrazinyl, piperazinyl, pyrimidinyl, pyridazinyl, oxazolyl, oxazolidinyl, isoxazolyl, isoxazolidiniyl, morpholinyl, thiomorpholinyl, thiazolyl, thiazolidinyl, isothiazolyl, isothiazolidinyl, indolyl, quinolinyl, isoquinolinyl, benzimidazolyl, benzothiazolyl, benzoxazolyl, furyl, thienyl, thiazolidinyl, isothiazolyl, isoindazolyl, triazolyl, tetrazolyl, oxadiazolyl, uricyl, thiadiazolyl, pyrimidyl, tetrahydrofuranyl, dihydrofuranyl, tetrahydrothienyl, dihydrothienyl, dihydroindolyl, tetrahydroquinolyl, tetrahydroisoquinolyl, pyranyl, dihydropyranyl, dithiazolyl, benzofuranyl, benzothienyl, and the like.

By "hydroxyl" is meant —OH.

By "protecting group" is meant any group intended to protect a reactive group against undesirable synthetic reactions. Commonly used protecting groups are disclosed in "Greene's Protective Groups in Organic Synthesis," John Wiley & Sons, New York, 2007 (4th ed., eds. P. G. M. Wuts and T. W. Greene), which is incorporated herein by reference. O-protecting groups include an optionally substituted alkyl group (e.g., forming an ether with reactive group O), such as methyl, methoxymethyl, methylthiomethyl, benzoyloxymethyl, t-butoxymethyl, etc.; an optionally substituted alkanoyl group (e.g., forming an ester with the reactive group O), such as formyl, acetyl, chloroacetyl, fluoroacetyl (e.g., perfluoroacetyl), methoxyacetyl, pivaloyl, t-butylacetyl, phenoxyacetyl, etc.; an optionally substituted aryloyl group (e.g., forming an ester with the reactive group O), such as —C(O)—Ar, including benzoyl; an optionally substituted alkylsulfonyl group (e.g., forming an alkylsulfonate with reactive group O), such as —SO$_2$—R$^{S1}$, where R$^{S1}$ is optionally substituted $C_{1-12}$ alkyl, such as mesyl or benzylsulfonyl; an optionally substituted arylsulfonyl group (e.g., forming an arylsulfonate with reactive group O), such as —SO$_2$—R$^{S4}$, where R$^{S4}$ is optionally substituted $C_{4-18}$ aryl, such as tosyl or phenylsulfonyl; an optionally substituted alkoxycarbonyl or aryloxycarbonyl group (e.g., forming a carbonate with reactive group O), such as —C(O)—OR$^{T1}$, where R$^{T1}$ is optionally substituted $C_{1-12}$ alkyl or optionally substituted $C_{4-18}$ aryl, such as methoxycarbonyl, methoxymethylcarbonyl, t-butyloxycarbonyl (Boc), or benzyloxycarbonyl (Cbz); or an optionally substituted silyl group (e.g., forming a silyl ether with reactive group O), such as —Si—(R$^{T2}$)$_3$, where each R$^{T2}$ is, independently, optionally substituted $C_{1-12}$ alkyl or optionally substituted $C_{4-18}$ aryl, such as trimethylsilyl, t-butyldimethylsilyl, or t-butyldiphenylsilyl. N-protecting groups include, e.g., formyl, acetyl, benzoyl, pivaloyl, t-butylacetyl, alanyl, phenylsulfonyl, benzyl, Boc, and Cbz. Such protecting groups can employ any useful agent to cleave the protecting group, thereby restoring the reactivity of the unprotected reactive group.

By "salt" is meant an ionic form of a compound or structure (e.g., any formulas, compounds, or compositions described herein), which includes a cation or anion compound to form an electrically neutral compound or structure. Salts are well known in the art. For example, non-toxic salts are described in Berge S M et al., "Pharmaceutical salts," *J. Pharm. Sci.* 1977 January;66(1):1-19; and in "Handbook of Pharmaceutical Salts: Properties, Selection, and Use," Wiley-VCH, April 2011 (2nd rev. ed., eds. P. H. Stahl and C. G. Wermuth. The salts can be prepared in situ during the final isolation and purification of the compounds of the invention or separately by reacting the free base group with a suitable organic acid (thereby producing an anionic salt) or by reacting the acid group with a suitable metal or organic salt (thereby producing a cationic salt). Representative anionic salts include acetate, adipate, alginate, ascorbate, aspartate, benzenesulfonate, benzoate, bicarbonate, bisulfate, bitartrate, borate, bromide, butyrate, camphorate, camphorsulfonate, chloride, citrate, cyclopentanepropionate, digluconate, dihydrochloride, diphosphate, dodecylsulfate, edetate, ethanesulfonate, fumarate, glucoheptonate, gluconate, glutamate, glycerophosphate, hemisulfate, heptonate, hexanoate, hydrobromide, hydrochloride, hydroiodide, hydroxyethanesulfonate, hydroxynaphthoate, iodide, lactate, lactobionate, laurate, lauryl sulfate, malate, maleate, malonate, mandelate, mesylate, methanesulfonate, methylbromide, methylnitrate, methylsulfate, mucate, 2-naphthalenesulfonate, nicotinate, nitrate, oleate, oxalate, palmitate, pamoate, pectinate, persulfate, 3-phenylpropionate, phosphate, picrate, pivalate, polygalacturonate, propionate, salicylate, stearate, subacetate, succinate, sulfate, tannate, tartrate, theophyllinate, thiocyanate, triethiodide, toluenesulfonate, undecanoate, valerate salts, and the like. Representative cationic salts include metal salts, such as alkali or alkaline earth salts, e.g., barium, calcium (e.g., calcium edetate), lithium, magnesium, potassium, sodium, and the like; other metal salts, such as aluminum, bismuth, iron, and zinc; as well as nontoxic ammonium, quaternary ammonium, and amine cations, including, but not limited to ammonium, tetramethylammonium, tetraethylammonium, methylamine, dimethylamine, trimethylamine, triethylamine, ethylamine, pyridinium, and the like. Other cationic salts include organic salts, such as chloroprocaine, choline, dibenzylethylenediamine, diethanolamine, ethylenediamine, methylglucamine, and procaine.

By "anhydrate" is meant a form of a compound or structure (e.g., any formulas, compounds, or compositions described herein) generally lacking solvent molecules.

By "micro" is meant having at least one dimension that is less than 1 mm and, optionally, equal to or larger than about 1 µm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 µm but equal to or larger than about 1 nm. For instance, a nanostructure (e.g., any structure described herein, such as a nanoparticle) can have a length, width, height, cross-sectional dimension, circumference, radius (e.g., external or internal radius), or diameter that is less than 1 µm but equal to or larger than 1 nm. In other instances, the nanostructure has a dimension that is of from about 1 nm to about 1 µm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

Figure 1A:
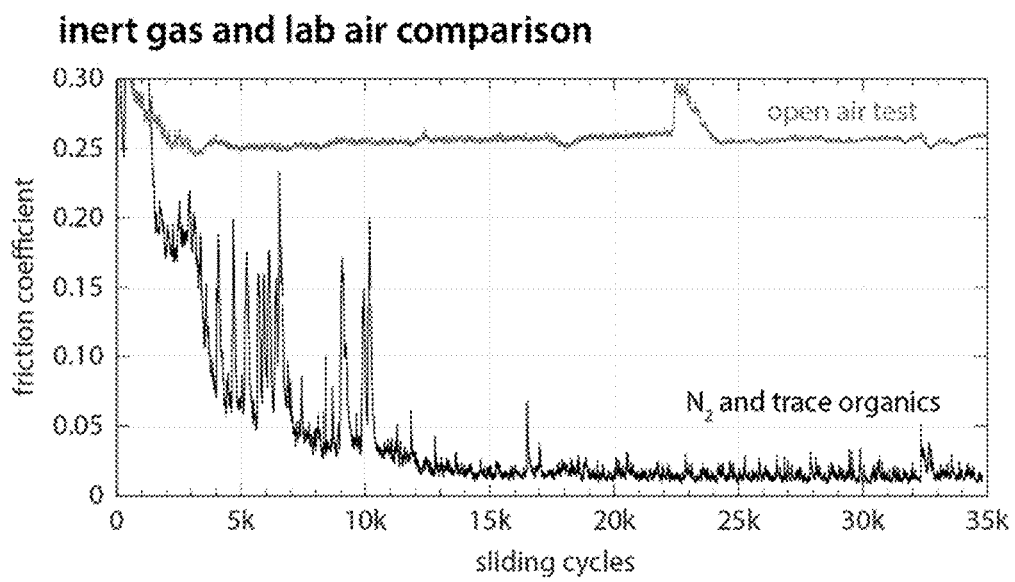
FIG. 1A-1D shows friction coefficient evolution with sliding cycles in variable environments including (A) lab air and dry $N_2$ with trace amounts of hydrocarbons, (B) dry nitrogen after a 2 k cycle run-in using an impinging $N_2$ stream with concentrated isopropanol (IPA)/$H_2O$ vapor, (C) dry nitrogen after a longer run-in under an impinging stream of $N_2$ with a high concentration of (IPA)/$H_2O$, vapor and (D) a combination of high concentration hexanes and a passively evaporated, lower concentration source of hexanes.

Diamond-like carbon (DLC) films exhibit the lowest known wear rates and friction coefficients of any material. They are widely used as wear resistant lubricants in applications ranging from satellites to automobiles.

Herein, we describe methods for generating low friction films (e.g., having a friction coefficient <0.05) including DLC. These films can be formed in situ from organic compounds (e.g., hydrocarbons and alcohols provided as vapor species) at a low temperature (e.g., at ambient temperatures). Without wishing to be limited by mechanism, this process occurs by stress-assisted surface catalysis, e.g. in the form of sliding contacts with catalytic metallic surface (s) (e.g., a Pt-based binary alloy, as described herein). In part, the method includes contacting at least one of two surfaces, in which at least one surface includes an ultra-low wear catalytic alloy whose wear rate is sufficiently low to enable DLC formation. In one embodiment, the alloy is an ultra-low wear metal alloy having thermodynamically stable nanocrystalline microstructures that are both fatigue and wear resistant (e.g. a $Pt_{0.9}Au_{0.1}$ alloy). In some embodiments, the in situ grown DLC tribofilms (e.g., $sp^2/sp^3$ hybridized carbon films) grow and persist for hundreds of thousands of sliding cycles, imparting friction coefficients as low as $\mu=0.01$ in a nitrogen purged laboratory environment and effectively preventing any wear on the PtAu film/substrate.

Traditionally, DLC is generated in film form through high temperature (e.g., more than about 500° C.) chemical vapor deposition and sputter deposition routes using DLC targets. In contrast, the methods herein employ mechanical shear at ambient conditions (e.g., ambient temperatures, such as of from about 20° C. to about 30° C.) to generate DLC within the tribofilm. The resulting tribofilm can be used in any component, including combustion engines, turbine engines and nano-/micro-electromechanical systems (NEMS/MEMS). Furthermore, such tribofilms can be generated in situ, as well as regenerated in situ. Such regeneration can be useful if, e.g., additional lubrication is needed without disassembling the component. Rather, an organic compound can be delivered by using a carrier gas, and then the component can be operated to provide a sufficient mechanical stress to regenerate the tribofilm at the contact interface. Once the tribofilm is formed, the organic compound can be removed by purging the component with inert air.

The film (e.g., a tribofilm) can be characterized in any useful manner. In some embodiments, the film includes a friction coefficient $\mu$ less than about 0.05 and/or a specific wear rate of less than about $10^{-6}$ mm$^3$/N-m (e.g., less than about $10^{-9}$ mm$^3$/N-m). In particular embodiments, we provide alloys and films having wear rates that are sufficiently low on a highly wear resistant catalytic surface (e.g., a PtAu film surface), even at moderate to high contact stresses (e.g., about 1 GPa or greater). Furthermore, such alloys allow for the formation of DLC in situ from hydrocarbon vapor found in typical ambient conditions.

We provide details on how to tailor the in situ formation of such tribofilms. In one non-limiting embodiment, the method includes use of a binary metal alloy that exhibits stable nanocrystallinity. For instance, such alloys (e.g., $Pt_{0.9}Au_{0.1}$) can be provided as a surface prepared in thin film form. Such films can, e.g., provide a stable nanocrystalline surface that renders the grain structure intrinsically insensitive to stress and temperature, as well as exhibit extremely low wear rates (e.g., specific wear rates much less than about $10^{-6}$ mm$^3$/N-m).

In some instances, the method includes controlling the presence of oxygen and water during tribofilm formation. Thus, in one non-limiting instance, the in situ formation of a tribofilm (including DLC) on these surfaces under shear includes providing organic compounds with a low partial pressure of oxygen and water (e.g., about less than about 100 ppm for each). Such conditions can be achieved in any useful manner, such as by purging the gas environment around the alloy surface to allow for the stress-assisted catalysis of organic compounds (e.g., ambient hydrocarbons) into hydrogenated amorphous carbon. In certain conditions, ambient air may include a sufficiently high oxygen concentration that inhibits the reaction pathway for DLC formation. For example and without limitation, the presence of oxygen could consume the organic compounds and generate volatile species (e.g., CO and $CO_2$) that would not be beneficial for forming a DLC. Beneficial conditions can be attained by controlling the content of the input carrier gas. In another instance, if the catalyst surface wears at any appreciable rate, then DLC formation may be reduced due to partial removal of the alloy film. Finally, in another non-limiting instance, the applied stress must be sufficiently high to promote the formation of DLC. Methods for making and testing such tribofilms are described herein.

Films Including Diamond-Like Carbon

The present invention relates, in part, to a tribofilm including diamond-like carbon (DLC). This tribofilm is a persistent composite (e.g., nanocomposite) that arises from contact between two surfaces. In one non-limiting instance, one of the surfaces includes a binary alloy (e.g., any described herein, such as the PtAu system). The tribofilm can optionally include a plurality of nanoparticles dispersed within the DLC, in which the nanoparticles are formed from wearing against one of the surfaces. Thus, if one of the surfaces includes a binary alloy, then the nanoparticles within the tribofilm can be formed from that binary alloy.

The tribofilm can include a plurality of layers, in which at least one layer includes DLC and a plurality of nanoparticles. In some embodiments, the tribofilm includes a first layer including hydrogenated amorphous carbon and a plurality of nanoparticles having a first mean particle size; and a second layer including hydrogenated amorphous carbon and a plurality of nanoparticles having a second mean particle size, in which the first and second mean particles sizes are different.

The DLC can include hydrogenated amorphous carbon. The amorphous carbon can be in graphitic form and/or include of from about 1% to 70% hydrogen (e.g., 1 at. % to 5 at. %, 1 at. % to 10 at. %, 1 at. % to 15 at. %, 1 at. % to 20 at. %, 1 at. % to 25 at. %, 1 at. % to 30 at. %, 1 at. % to 35 at. %, 1 at. % to 40 at. %, 1 at. % to 45 at. %, 1 at. % to 50 at. %, 1 at. % to 55 at. %, 1 at. % to 60 at. %, 1 at. % to 65 at. %, 5 at. % to 10 at. %, 5 at. % to 15 at. %, 5 at. % to 20 at. %, 5 at. % to 25 at. %, 5 at. % to 30 at. %, 5 at. % to 35 at. %, 5 at. % to 40 at. %, 5 at. % to 45 at. %, 5 at. % to 50 at. %, 5 at. % to 55 at. %, 5 at. % to 60 at. %, 5 at. % to 65 at. %, 5 at. % to 70 at. %, 10 at. % to 15 at. %, 10 at. % to 20 at. %, 10 at. % to 25 at. %, 10 at. % to 30 at. %, 10 at. % to 35 at. %, 10 at. % to 40 at. %, 10 at. % to 45 at. %, 10 at. % to 50 at. %, 10 at. % to 55 at. %, 10 at. % to 60 at. %, 10 at. % to 65 at. %, 10 at. % to 70 at. %, 15 at. % to 20 at. %, 15 at. % to 25 at. %, 15 at. % to 30 at. %, 15 at. % to 35 at. %, 15 at. % to 40 at. %, 15 at. % to 45 at. %, 15 at. % to 50 at. %, 15 at. % to 55 at. %, 15 at. % to 60 at. %, 15 at. % to 65 at. %, 15 at. % to 70 at. %, 20 at. % to 25 at. %, 20 at. % to 30 at. %, 20 at. % to 35 at. %, 20 at. % to 40 at. %, 20 at. % to 45 at. %, 20 at. % to 50 at. %, 20 at. % to 55 at. %, 20 at. % to 60 at. %, 20 at. % to 65 at. %, 20 at. % to 70 at. %, 25 at. % to 30 at. %, 25 at. % to 35 at. %, 25 at. % to 40 at. %, 25 at. % to 45 at. %, 25 at. % to 50 at. %, 25 at. % to 55 at. %, 25 at. % to 60 at. %, 25 at. % to 65 at. %, 25 at. % to 70 at. %, 30 at. % to 35 at. %, 30 at. % to 40 at. %, 30 at. % to 45 at. %, 30 at. % to 50 at. %, 30 at. % to 55 at. %, 30 at. % to 60 at. %, 30 at. % to 65 at. %, 30 at. % to 70 at. %, 35 at. % to 40 at. %, 35 at. % to 45 at. %, 35 at. % to 50 at. %, 35 at. % to 55 at. %, 35 at. % to 60 at. %, 35 at. % to 65 at. %, 35 at. % to 70 at. %, 40 at. % to 45 at. %, 40 at. % to 50 at. %, 40 at. % to 55 at. %, 40 at. % to 60 at. %, 40 at. % to 65 at. %, 40 at. % to 70 at. %, 45 at. % to 50 at. %, 45 at. % to 55 at. %, 45 at. % to 60 at. %, 45 at. % to 65 at. %, 45 at. % to 70 at. %, 50 at. % to 55 at. %, 50 at. % to 60 at. %, 50 at. % to 65 at. %, 50 at. % to 70 at. %, 55 at. % to 60 at. %, 55 at. % to 65 at. %, 55 at. % to 70 at. %, 60 at. % to 65 at. %, 60 at. % to 70 at. %, or 65 at. % to 70 at. % of H). The presence of hybridized $sp^2/sp^3$ carbon can indicate the form of carbon present within the tribofilm, in which graphitic carbon is an amorphous carbon with a significant fraction of $sp^2$ content.

The tribofilm can further include a plurality of nanoparticles (e.g., formed from the material of a first surface). In one non-limiting instance, the nanoparticles include a binary alloy. In other instances, the nanoparticles have a mean particle size of from about 5 nm to about 250 nm (e.g., from about 5 nm to 10 nm, 5 nm to 20 nm, 5 nm to 30 nm, 5 nm to 40 nm, 5 nm to 50 nm, 5 nm to 60 nm, 5 nm to 70 nm, 5 nm to 80 nm, 5 nm to 90 nm, 5 nm to 100 nm, 5 nm to 110 nm, 5 nm to 120 nm, 5 nm to 130 nm, 5 nm to 140 nm, 5 nm to 150 nm, 5 nm to 160 nm, 5 nm to 170 nm, 5 nm to 180 nm, 5 nm to 190 nm, 5 nm to 200 nm, 5 nm to 210 nm, 5 nm to 220 nm, 5 nm to 230 nm, 5 nm to 240 nm, 5 nm to 250 nm, 10 nm to 20 nm, 10 nm to 30 nm, 10 nm to 40 nm, 10 nm to 50 nm, 10 nm to 60 nm, 10 nm to 70 nm, 10 nm to 80 nm, 10 nm to 90 nm, 10 nm to 100 nm, 10 nm to 110 nm, 10 nm to 120 nm, 10 nm to 130 nm, 10 nm to 140 nm, 10 nm to 150 nm, 10 nm to 160 nm, 10 nm to 170 nm, 10 nm to 180 nm, 10 nm to 190 nm, 10 nm to 200 nm, 10 nm to 210 nm, 10 nm to 220 nm, 10 nm to 230 nm, 10 nm to 240 nm, 10 nm to 250 nm, 25 nm to 30 nm, 25 nm to 40 nm, 25 nm to 50 nm, 25 nm to 60 nm, 25 nm to 70 nm, 25 nm to 80 nm, 25 nm to 90 nm, 25 nm to 100 nm, 25 nm to 110 nm, 25 nm to 120 nm, 25 nm to 130 nm, 25 nm to 140 nm, 25 nm to 150 nm, 25 nm to 160 nm, 25 nm to 170 nm, 25 nm to 180 nm, 25 nm to 190 nm, 25 nm to 200 nm, 25 nm to 210 nm, 25 nm to 220 nm, 25 nm to 230 nm, 25 nm to 240 nm, 25 nm to 250 nm, 50 nm to 60 nm, 50 nm to 70 nm, 50 nm to 80 nm, 50 nm to 90 nm, 50 nm to 100 nm, 50 nm to 110 nm, 50 nm to 120 nm, 50 nm to 130 nm, 50 nm to 140 nm, 50 nm to 150 nm, 50 nm to 160 nm, 50 nm to 170 nm, 50 nm to 180 nm, 50 nm to 190 nm, 50 nm to 200 nm, 50 nm to 210 nm, 50 nm to 220 nm, 50 nm to 230 nm, 50 nm to 240 nm, 50 nm to 250 nm, 75 nm to 80 nm, 75 nm to 90 nm, 75 nm to 100 nm, 75 nm to 110 nm, 75 nm to 120 nm, 75 nm to 130 nm, 75 nm to 140 nm, 75 nm to 150 nm, 75 nm to 160 nm, 75 nm to 170 nm, 75 nm to 180 nm, 75 nm to 190 nm, 75 nm to 200 nm, 75 nm to 210 nm, 75 nm to 220 nm, 75 nm to 230 nm, 75 nm to 240 nm, 75 nm to 250 nm, 100 nm to 110 nm, 100 nm to 120 nm, 100 nm to 130 nm, 100 nm to 140 nm, 100 nm to 150 nm, 100 nm to 160 nm, 100 nm to 170 nm, 100 nm to 180 nm, 100 nm to 190 nm, 100 nm to 200 nm, 100 nm to 210 nm, 100 nm to 220 nm, 100 nm to 230 nm, 100 nm to 240 nm, 100 nm to 250 nm, 125 nm to 130 nm, 125 nm to 140 nm, 125 nm to 150 nm, 125 nm to 160 nm, 125 nm to 170 nm, 125 nm to 180 nm, 125 nm to 190 nm, 125 nm to 200 nm, 125 nm to 210 nm, 125 nm to 220 nm, 125 nm to 230 nm, 125 nm to 240 nm, 125 nm to 250 nm, 150 nm to 160 nm, 150 nm to 170 nm, 150 nm to 180 nm, 150 nm to 190 nm, 150 nm to 200 nm, 150 nm to 210 nm, 150 nm to 220 nm, 150 nm to 230 nm, 150 nm to 240 nm, 150 nm to 250 nm, 200 nm to 210 nm, 200 nm to 220 nm, 200 nm to 230 nm, 200 nm to 240 nm, or 200 nm to 250 nm).

Methods of Forming a Film

The present invention relates to methods of forming a film, as well as structures including such a film. In one non-limiting embodiment, the film is a tribofilm, in which a persistent composite is formed in situ between a first surface and a second surface. In one embodiment, the first surface includes a binary alloy (e.g., any described herein), and the second surface can include a metal or an alloy. Furthermore, the film is generated by contacting the first and second surfaces in the presence of organic compound(s), which supply the carbon source for the amorphous carbon within the tribofilm.

The method can include providing a first surface, contacting the first surface with a second surface in the presence of organic compound(s), and generating a film (e.g., a tribofilm) disposed between the first and second surfaces. The first surface can include any useful material having sufficient wear resistance, sufficient hardness, and/or reduced friction coefficient, such as a binary alloy. Exemplary methods of forming an alloy are described herein.

Contact between the first and second surfaces can occur in any useful manner, such as a sliding contact (e.g., bidirectional, reciprocating, and/or unidirectional translation across a surface), a rotating contact, a translating contact, etc. Contact can include repeated cycles, such as a sliding contact between the first and second surfaces for a plurality of cycles (e.g., from about 50 to about 100,000 cycles of bi-directional sliding, including from about 50 to 100, 50 to 250, 50 to 500, 50 to 750, 50 to 1,000, 50 to 2,000, 50 to 5,000, 50 to 10,000, 50 to 50,000, 50 to 100,000, 100 to 250, 100 to 500, 100 to 750, 100 to 1,000, 100 to 2,000, 100 to 5,000, 100 to 10,000, 100 to 50,000, 100 to 100,000, 250 to 500, 250 to 750, 250 to 1,000, 250 to 2,000, 250 to 5,000, 250 to 10,000, 250 to 50,000, 250 to 100,000, 500 to 1,000, 500 to 2,000, 500 to 5,000, 500 to 10,000, 500 to 50,000, 500 to 100,000, 750 to 1,000, 750 to 2,000, 750 to 5,000, 750 to 10,000, 750 to 50,000, 750 to 100,000, 1,000 to 2,000, 1,000 to 5,000, 1,000 to 10,000, 1,000 to 50,000, 1,000 to 100,000, 2,000 to 5,000, 2,000 to 10,000, 2,000 to 50,000, 2,000 to 100,000, 5,000 to 10,000, 5,000 to 50,000, 5,000 to 100,000, 10,000 to 50,000, 10,000 to 100,000, 25,000 to 50,000, 25,000 to 100,000, 50,000 to 100,000, or 75,000 to 100,000 cycles).

In particular embodiments, sliding is performed in the presence of one or more organic compounds (e.g., any described herein). In some embodiments, the organic compound(s) are volatile and provided with a carrier gas to transport the organic compound(s) to the interface between the first and second surfaces. If higher local concentration of the organic compound(s) are required to form the tribofilm, then the concentration of the organic compound(s) within the carrier gas can be increased and/or the flow rate of carrier gas can be increased to deliver additional organic compound(s) to the interface.

By repeatedly contact the two surfaces, a tribofilm can be generated. The film can include, e.g., diamond-like carbon and/or nanoparticles formed from an alloy (e.g., any described herein).

Organic Compounds

The present invention can include the use of organic compounds. In particular embodiments, such compounds are useful in providing a carbon source during film generation. As described herein, such generated films can include diamond-like carbon. In some embodiments, the organic compounds are provided in having a low partial pressure of oxygen and/or water (e.g., less than about 100 ppm for each of oxygen and water).

Exemplary organic compounds include volatile organic compounds (VOCs), an optionally substituted alcohol (e.g., ROH, in which R is an optionally substituted alkyl, optionally substituted alkenyl, optionally substituted cycloalkyl, optionally substituted alkaryl, or optionally substituted aryl; or a compound including hydroxyl), an optionally substituted carboxylic acid (e.g., $RCO_2H$, in which R is an optionally substituted alkyl, optionally substituted aryl, or optionally substituted alkaryl; or a compound including carboxyl), an optionally substituted acid anhydride (e.g., $R^1C(O)OC(O)R^2$, in which each of $R^1$ and $R^2$ is, independently, an optionally substituted alkyl, optionally substituted alkaryl, optionally substituted aryl, or $R^1$ and $R^2$, when taken together, form an optionally substituted alkylene, such as a —$CH_2CH_2$— group or a —CH═CH— group), an optionally substituted acetal (e.g., $R^1OC(R^3)(R^4)OR^2$, in which each of $R^1$ and $R^2$ is, independently, an optionally substituted alkyl, optionally substituted alkaryl, optionally substituted aryl, or $R^1$ and $R^2$, when taken together, form an optionally substituted alkylene, such as a —$CH_2CH_2$— group or a —CH═CH— group; and in which each of $R^3$ and $R^4$ is, in dependently, H, optionally substituted alkyl, or optionally substituted aryl), an optionally substituted alkane (e.g., RH, in which R is an optionally substituted alkyl or optionally substituted cycloalkyl), an optionally substituted alkene (e.g., RH, in which R is an optionally substituted alkenyl), and/or an optionally substituted arene (e.g., RH, in which R is an optionally substituted aryl or optionally substituted alkaryl).

Further exemplary compounds include an alkanol (e.g., ROH, in which R is an optionally substituted alkyl, optionally substituted cycloalkyl, or optionally substituted alkenyl), a phenol (e.g., ROH, in which R is an optionally substituted aryl), an aldehyde (e.g., RC(O)H, in which R is an optionally substituted alkyl, optionally substituted alkaryl, or optionally substituted aryl; or a compound including carboxyaldehyde), a ketone (e.g., $R^1C(O)R^2$, in which each of $R^1$ and $R^2$ is, independently, an optionally substituted alkyl, optionally substituted alkaryl, or optionally substituted aryl, or $R^1$ and $R^2$, when taken together, form an optionally substituted alkylene, such as a —$CH_2CH_2$— group or a —CH═CH— group; or a compound including carbonyl between two organic moieties), an alkene (e.g., RH, in which R is an optionally substituted $C_{2-24}$ alkenyl), and/or an alkane (e.g., RH, in which R is an optionally substituted $C_{1-24}$ alkyl). Yet other exemplary compounds include a haloalkane (e.g., ROH, in which R is an optionally substituted $C_{1-6}$ haloalkyl), a haloalkene (e.g., ROH, in which R is an optionally substituted $C_{2-6}$ haloalkenyl), an alkanol (e.g., ROH, in which R is an optionally substituted $C_{1-24}$ alkyl), a phenol (e.g., ROH, in which R is an optionally substituted $C_{4-18}$ aryl), an alkane (e.g., RH, in which R is an optionally substituted $C_{1-24}$ alkyl), or an aromatic compound (e.g., a compound including one or more optionally substituted $C_{4-18}$ aryl). In some embodiments, any alkyl group herein can include a heteroalkyl group or an alkylene group, as defined herein. In other embodiments, any aryl group herein can include a heteroaryl group, as defined herein.

In other embodiments, the organic compound is a VOC. In one instance, a VOC is an organic chemical compound that can evaporate under normal indoor atmospheric conditions of temperature and pressure, e.g., VOC is any organic compound having an initial boiling point less than or equal to 250° C. measured at a standard atmospheric pressure of 101.3 kPa. Exemplary, non-limiting VOCs include an alcohol (e.g., ethanol or isopropanol), a hydrocarbon (e.g., a saturated alkane, a haloalkane, or a cycloalkane, such as propane, butane, methyl chloride, or limonene), aromatic hydrocarbons (e.g., benzene or toluene), aldehydes (e.g., formaldehyde or hexanal), ketones (e.g., acetone), etc.

In some embodiments, the organic compound is provided in a mixture with a carrier gas. Exemplary carrier gases include an inert gas (e.g., $N_2$ or He), water vapor, oxygen (e.g., $O_2$), helium, nitrogen, argon, ambient air, or combinations thereof.

Alloys, Including Binary Alloys

The present invention includes the use of an alloy (e.g., a binary alloy) on at least one surface, in which a tribofilm is then formed in proximity to this surface. The alloy (e.g., a binary alloy) can be characterized by a base material (e.g., a solvent) and a dopant (e.g., a solute). Exemplary solvents include a metal, such as silver (Ag), aluminum (Al), gold (Au), cobalt (Co), chromium (Cr), copper (Cu), iron (Fe), hafnium (Hf), iridium (Ir), lanthanum (La), manganese (Mn), molybdenum (Mo), niobium (Nb), nickel (Ni), osmium (Os), palladium (Pd), platinum (Pt), rhenium (Re), rhodium (Rh), ruthenium (Ru), scandium (Sc), strontium (Sr), tantalum (Ta), technetium (Tc), thorium (Th), titanium (Ti), vanadium (V), tungsten (W), yttrium (Y), and zirconium (Zr). Exemplary solutes include a metal, such as silver (Ag), aluminum (Al), gold (Au), barium (Ba), beryllium (Be), bismuth (Bi), calcium (Ca), cadmium (Cd), cobalt (Co), chromium (Cr), cesium (Cs), copper (Cu), iron (Fe), gallium (Ga), germanium (Ge), hafnium (Hf), indium (In), potassium (K), lanthanum (La), lithium (Li), magnesium (Mg), manganese (Mn), molybdenum (Mo), sodium (Na), niobium (Nb), nickel (Ni), lead (Pb), palladium (Pd), rubidium (Rb), rhodium (Rh), antimony (Sb), scandium (Sc), tin (Sn), strontium (Sr), tantalum (Ta), thorium (Th), titanium (Ti), thallium (Tl), vanadium (V), tungsten (W), yttrium (Y), zinc (Zn), and zirconium (Zr).

In particular embodiments, the alloy includes one solvent (e.g., any herein) and one solute (e.g., any herein), in which the solvent and the solute are different. The solute can be present in any useful amount. In one non-limiting instance, the solute is present at an amount of about 1 atomic percent (at. %) or greater and/or of from about 1 at. % to about 50 at. % (e.g., from 1 at. % to 10 at. %, 1 at. % to 10 at. %, 1 at. % to 15 at. %, 1 at. % to 20 at. %, 1 at. % to 25 at. %, 1 at. % to 30 at. %, 1 at. % to 35 at. %, 1 at. % to 40 at. %, 1 at. % to 45 at. %, 2 at. % to 10 at. %, 2 at. % to 15 at. %, 2 at. % to 20 at. %, 2 at. % to 25 at. %, 2 at. % to 30 at. %, 2 at. % to 35 at. %, 2 at. % to 40 at. %, 2 at. % to 45 at. %, 2 at. % to 50 at. %, 5 at. % to 10 at. %, 5 at. % to 15 at. %, 5 at. % to 20 at. %, 5 at. % to 25 at. %, 5 at. % to 30 at. %, 5 at. % to 35 at. %, 5 at. % to 40 at. %, 5 at. % to 45 at. %, 5 at. % to 50 at. %, 10 at. % to 15 at. %, 10 at. % to 20 at. %, 10 at. % to 25 at. %, 10 at. % to 30 at. %, 10 at. % to 35 at. %, 10 at. % to 40 at. %, 10 at. % to 45 at. %, 10 at. % to 50 at. %, 15 at. % to 20 at. %, 15 at. % to 25 at. %, 15 at. % to 30 at. %, 15 at. % to 35 at. %, 15 at. % to 40 at. %, 15 at. % to 45 at. %, 15 at. % to 50 at. %, 20 at. % to 25 at. %, 20 at. % to 30 at. %, 20 at. % to 35 at. %, 20 at. % to 40 at. %, 20 at. % to 45 at. %, 20 at. % to 50 at. %, 25 at. % to 30 at. %, 25 at. % to 35 at. %, 25 at. % to 40 at. %, 25 at. % to 45 at. %, 25 at. % to 50 at. %, 30 at. % to 35 at. %, 30 at. % to 40 at. %, 30 at. % to 45 at. %, 30 at. % to 50 at. %, 35 at. % to 40 at. %, 35 at. % to 45 at. %, 35 at. % to 50 at. %, 40 at. % to 45 at. %, 40 at. % to 50 at. %, and 45 at. % to 50 at. %). In another non-limiting instance, the solute is present at of from about 1 vol. % to about 60 vol. % (e.g., from 1 vol. % to 10 vol. %, 1 vol. % to 20 vol. %, 1 vol. % to 30 vol. %, 1 vol. % to 40 vol. %, 1 vol. % to 50 vol. %, 2 vol. % to 10 vol. %, 2 vol. % to 20 vol. %, 2 vol. % to 30 vol. %, 2 vol. % to 40 vol. %, 2 vol. % to 50 vol. %, 2 vol. % to 60 vol. %, 5 vol. % to 10 vol. %, 5 vol. % to 20 vol. %, 5 vol. % to 30 vol. %, 5 vol. % to 40 vol. %, 5 vol. % to 50 vol. %, 5 vol. % to 60 vol. %, 10 vol. % to 20 vol. %, 10 vol. % to 30 vol. %, 10 vol. % to 40 vol. %, 10 vol. % to 50 vol. %, 10 vol. % to 60 vol. %, 15 vol. % to 20 vol. %, 15 vol. % to 30 vol. %, 15 vol. % to 40 vol. %, 15 vol. % to 50 vol. %, 15 vol. % to 60 vol. %, 20 vol. % to 30 vol. %, 20 vol. % to 40 vol. %, 20 vol. % to 50 vol. %, 20 vol. % to 60 vol. %, 25 vol. % to 40 vol. %, 25 vol. % to 50 vol. %, 25 vol. % to 60 vol. %, 30 vol. % to 40 vol. %, 30 vol. % to 50 vol. %, 30 vol. % to 60 vol. %, 35 vol. % to 40 vol. %, 35 vol. % to 50 vol. %, 35 vol. % to 60 vol. %, 40 vol. % to 50 vol. %, 40 vol. % to 60 vol. %, 45 vol. % to 50 vol. %, 45 vol. % to 60 vol. %, and 50 vol. % to 60 vol. %).

In particular embodiments, the alloy includes Pt and Au. In certain embodiments, the alloy displays high aspect ratio grain structures having grain diameters <100 nm and with >50% of the Au segregated to grain boundaries. In other embodiments, the alloy possesses nanocrystalline structures of high thermodynamic stability, which in turn provides materials having unprecedented thermo-mechanical stability and other beneficial physical characteristics. Exemplary characteristics include low specific wear rates (e.g., less than about 1×10$^{-8}$ mm$^3$/N-m), low friction coefficients (e.g., μ of from about 0.2 to about 0.3), low resistivity (e.g., in the range of about 10$^{-8}$ Ω·m), and/or high endurance limit (e.g., numerous cycling even at high stress).

In particular embodiments, the alloy is a binary alloy. Exemplary binary alloys include Ag—La, Ag—Sc, Ag—Y, Ba—Pd, Ba—Pt, Be—Ti, Bi—Pd, Ca—Pt, Cd—Pd, Co—Al, Co—As, Co—Ga, Co—Ge, Co—Hf, Co—Nb, Co—Sc, Co—Ta, Co—Ti, Co—Y, Co—Zr, Cr—Pt, Cu—Sc, Fe—Al, Fe—As, Fe—Hf, Fe—Zr, Hf—Bi, Hf—Co, Hf—Ni, Hf— Os, Hf—Re, Hf—Tl, Ir—Ge, La—Ag, La—Ir, La—Rh, La—Zn, Mn—Ga, Mn—Pd, Mn—Sb, Nb—Co, Nb—Ni, Nb—Re, Nb—Sb, Ni—Ga, Ni—Ge, Ni—Hf, Ni—La, Ni—Nb, Ni—Ta, Ni—Th, Ni—Y, Os—As, Os—V, Os—Y, Pt—Bi, Pt—Mn, Re—As, Re—Hf, Re—Nb, Re—Ta, Re—Ti, Rh—Sb, Rh—Sn, Rh—Zn, Ru—Ga, Ru—La, Ru—V, Ru—Y, Sc—Ag, Sc—Ni, Sc—Os, Sc—Ru, Sc—Tc, Sn—Pd, Sr—Pd, Sr—Pt, Ta—Ga, Ta—Ni, Ta—Re, Ta—Sb, Tc—La, Tc—Th, Tc—Y, Th—Ir, Th—Rh, Ti—Be, Ti—Bi, Ti—Co, Ti—Ni, Ti—Pb, Ti—Sn, Ti—Zn, V—Ru, V—Sb, V—Tc, W—As, W—Si, Y Ag, Y—Ir, Y—Rh, Y—Zn, Zn—Hf, Zn—La, Zn—Sc, Zn—Y, Zr—Be, Zr—Co, Zr—Ni, and Zr—Re.

In other embodiments, the alloy is a binary alloy including Pt (e.g., Pt—Ag, Pt—Au, Pt—Cu, Pt—Fe, Pt—Ge, Pt—Hf, Pt—In, Pt—Mo, Pt—Ni, Pt—Pb, Pt—Sb, or Pt—Sn).

In some embodiments, the alloy is a binary alloy including Pd (e.g., Pd—Ag, Pd—Au, Pd—Ba, Pd—Ca, Pd—Cs, Pd—Cu, Pd—Fe, Pd—Ge, Pd—In, Pd—K, Pd—Mo, Pd—Ni, Pd—Pb, Pd—Sb, or Pd—Sn).

In some embodiments, the alloy is a binary alloy including Ni (e.g., Ni—Ag, Ni—Au, Ni—Cu, Ni—Ge, Ni—In, Ni—Nb, Ni—Pd, Ni—Pt, Ni—Sb, Ni—Sn, or Ni—Ti).

Further exemplary binary alloys (e.g., having nanocrystalline metastability) include Fe—Sc, Hf—Ag, Ir—Cd, Ir—Cr, Ir—In, Ir—Mg, Ir—Mn, Ir—Sb, Ir—Zn, La—Au, Mo—Al, Mo—Ge, Mo—Pd, Nb—Ga, Nb—Sn, Nb—Zn, Ni—In, Ni—Mg, Ni—Zn, Os—Ga, Os—Ge, Os—P, Os—Zn, Pd—Mn, Pt—K, Pt—Na, Pt—Tl, Re—Al, Re—Ga, Re—Ge, Re—Sc, Rh—Bi, Rh—Cd, Rh—In, Rh—Mg, Rh—Mn, Rh—Tl, Ru—Ge, Ru—Mg, Ru—Zn, Sc—Cu, Ta—Al, Ta—Fe, Ta—Sn, Ta—Zn, Tc—Ge, Tc—V, Tc—Zn, Ti—Cd, Ti—In, V—Ga, W—Al, W—Ge, W—Hf, W—Ir, W—Pt, W—Zr, Zr—Ag, and Zr—Cu.

Yet other exemplary alloys include Al—Pb, Al—Zn, Co—Cd, Co—Cu, Co—Pd, Cu—Ag, Cu—Bi, Cu—Pb, Cu—Y, Fe—Ag, Fe—Au, Fe—Cu, Fe—In, Fe—Mg, Hf—Mg, Hf—Sc, Hf—Ti, Ir—Ag, Ir—Au, Ir—Cu, Ir—Ni, Ir—Pd, Ir—Rh, La—Ba, La—Ca, La—Cr, La—Li, Mn—Cd, Mo—Au, Mo—Cr, Mo—Sc, Nb—Bi, Nb—Cu, Nb—Zr, Ni—Ag, Ni—Au, Ni—Cu, Ni—Pb, Ni—Sn, Ni—Tl, Os—Ag, Os—Cu, Os—Ni, Os—Pd, Os—Rh, Pd—Au, Pt—Au, Pt—Pd, Re—Cu, Re—Ni, Re—Pd, Re—Rh, Rh—Ag, Rh—Au, Rh—Co, Rh—Cu, Rh—Ni, Rh—Pd, Ru—Ag, Ru—Cu, Ru—Ni, Ru—Pd, Ru—Rh, Sc—Au, Sc—Ba, Sc—Cr, Sc—Cu, Sc—Sr, Sr—Mn, Ta—Bi, Ta—Cu, Ta—Hf, Ta—In, Ta—Zr, Tc—Cu, Tc—Ni, Tc—Pd, Th—Cr, Th—La, Th—Mo, Th—Sc, Th—Ti, Th—V, Th—Y, Ti—Ca, Ti—K, Ti—La, Ti—Mg, Ti—Sc, V—Cd, V—Cu, V—Sc, W—Au, W—Cr, W—Cu, W—Sb, W—Sc, W—Th, W—Y, Y—Ba, Y—Ca, Y—Cr, Y—Sr, Y—TL, Y—V, Zr—Cs, Zr—K, Zr—Mg, Zr—Sc, Zr—Ti, and Zr—Y.

In particular embodiments, the alloy includes one or more of the following: Hf, La, Mo, Nb, Ni, Os, Pt, Re, Rh, Ru, Ta, Tc, Ti, V, W, Y, and Zr (e.g., as a solvent). In other embodiments, the alloy includes one or more of the following: Ag, Al, Au, Ba, Be, Bi, Ca, Cd, Co, Cr, Cs, Cu, Fe, Ga, Ge, In, K, La, Li, Mg, Mn, Na, Ni, Pb, Rb, Sb, Sc, Sn, Sr, Th, Tl, Y, Zn, and Zr (e.g., as a solute).

The alloy can be characterized by any useful feature. In one embodiment, the alloy is a binary alloy including a base material (e.g., a solvent) and a dopant (e.g., a solute). Exemplary solvents and solutes (e.g., a metal solvent and a metal solute) are described herein. In one non-limiting instance, the alloy includes a structure having segregation of the solute at grain boundaries. In particular embodiments, more than about 50% of the solute is segregated to grain boundaries (e.g., more than about 60%, 70%, 80%, or greater).

In another embodiment, the alloy has a nanocrystalline structure. In a further embodiment, the nanocrystalline structure is characterized by a plurality of crystalline grains. In at least some embodiments, a nanocrystalline structure refers to the size of a grain (a crystal or a crystalline grain) having a dimension that is less than or equal to about 1000 nm (e.g., less than or equal to about 500 nm, 200 nm, 100 nm, 50 nm, 20 nm, 10 nm, 5 nm, 2 nm, or less). For example, the grain size may be between about 1000 nm and about 2 nm (e.g., about 500 nm and about 2 nm, about 200 nm and about 2 nm, about 100 nm and about 2 nm, about 50 nm and about 2 nm, about 30 nm and about 2 nm, about 20 and about 2 nm, about 10 nm and about 2 nm). The size may refer to the largest dimension of the grain or an average dimension determined by measuring that dimension for a plurality of grains. An "average" may be measured by any suitable techniques. A dimension may refer to the diameter, length, width, and/or height, depending on the geometry of the grain. In some instances, a nanocrystalline material may also refer to a material including an amorphous microstructure or a metastable microstructure. In one non-limiting instance, a metastable nanocrystalline phase can refer to a nanocrystalline structure that is more energetically favorable than the single phase solid solution at that solute content, but less favorable than macroscopic phase separation of the system into two solid solutions.

An alloy herein can be characterized by a grain size. In one instance, the alloy includes grain (e.g., at least one grain or a plurality of grains) having a grain diameter (e.g., an average grain diameter) of less than about 100 nm (e.g., less than about 90 nm, 80 nm, 75 nm, 70 nm, 60 nm, 50 nm, 40 nm, 30 nm, 25 nm, 20 nm, 15 nm, 10 nm, 5 nm, 2 nm, or less). In another non-limiting instance, the alloy includes a grain (e.g., at least one grain or a plurality of grains) having a grain diameter (e.g., an average grain diameter) of from about 0.5 nm to about 150 nm (e.g., from 0.5 nm to 5 nm, 0.5 nm to 10 nm, 0.5 nm to 20 nm, 0.5 nm to 30 nm, 0.5 nm to 40 nm, 0.5 nm to 50 nm, 0.5 nm to 60 nm, 0.5 nm to 70 nm, 0.5 nm to 80 nm, 0.5 nm to 90 nm, 0.5 nm to 100 nm, 0.5 nm to 125 nm, 1 nm to 5 nm, 1 nm to 10 nm, 1 nm to 20 nm, 1 nm to 30 nm, 1 nm to 40 nm, 1 nm to 50 nm, 1 nm to 60 nm, 1 nm to 70 nm, 1 nm to 80 nm, 1 nm to 90 nm, 1 nm to 100 nm, 1 nm to 125 nm, 1 nm to 150 nm, 5 nm to 10 nm, 5 nm to 20 nm, 5 nm to 30 nm, 5 nm to 40 nm, 5 nm to 50 nm, 5 nm to 60 nm, 5 nm to 70 nm, 5 nm to 80 nm, 5 nm to 90 nm, 5 nm to 100 nm, 5 nm to 125 nm, 5 nm to 150 nm, 10 nm to 20 nm, 10 nm to 30 nm, 10 nm to 40 nm, 10 nm to 50 nm, 10 nm to 60 nm, 10 nm to 70 nm, 10 nm to 80 nm, 10 nm to 90 nm, 10 nm to 100 nm, 10 nm to 125 nm, 10 nm to 150 nm, 15 nm to 20 nm, 15 nm to 30 nm, 15 nm to 40 nm, 15 nm to 50 nm, 15 nm to 60 nm, 15 nm to 70 nm, 15 nm to 80 nm, 15 nm to 90 nm, 15 nm to 100 nm, 15 nm to 125 nm, 15 nm to 150 nm, 20 nm to 30 nm, 20 nm to 40 nm, 20 nm to 50 nm, 20 nm to 60 nm, 20 nm to 70 nm, 20 nm to 80 nm, 20 nm to 90 nm, 20 nm to 100 nm, 20 nm to 125 nm, 20 nm to 150 nm, 30 nm to 40 nm, 30 nm to 50 nm, 30 nm to 60 nm, 30 nm to 70 nm, 30 nm to 80 nm, 30 nm to 90 nm, 30 nm to 100 nm, 30 nm to 125 nm, 30 nm to 150 nm, 40 nm to 50 nm, 40 nm to 60 nm, 40 nm to 70 nm, 40 nm to 80 nm, 40 nm to 90 nm, 40 nm to 100 nm, 40 nm to 125 nm, 40 nm to 150 nm, 50 nm to 60 nm, 50 nm to 70 nm, 50 nm to 80 nm, 50 nm to 90 nm, 50 nm to 100 nm, 50 nm to 125 nm, 50 nm to 150 nm, 60 nm to 70 nm, 60 nm to 80 nm, 60 nm to 90 nm, 60 nm to 100 nm, 60 nm to 125 nm, 60 nm to 150 nm, 70 nm to 80 nm, 70 nm to 90 nm, 70 nm to 100 nm, 70 nm to 125 nm, 70 nm to 150 nm, 80 nm to 90 nm, 80 nm to 100 nm, 80 nm to 125 nm, 80 nm to 150 nm, 90 nm to 100 nm, 90 nm to 125 nm, 90 nm to 150 nm, 100 nm to 125 nm, and 100 nm to 150 nm).

In one non-limiting instance, the alloy includes grain (e.g., at least one grain or a plurality of grains) having a grain length (e.g., an average grain length) of greater than about 100 nm (e.g., greater than about 200 nm, 500 nm, 750 nm, 1000 nm). In another non-limiting instance, the alloy includes a grain (e.g., at least one grain or a plurality of grains) having a grain length (e.g., an average grain length) of from about 20 nm to about 2000 nm (e.g., from 20 nm to 50 nm, 20 nm to 75 nm, 20 nm to 100 nm, 20 nm to 200 nm, 20 nm to 300 nm, 20 nm to 400 nm, 20 nm to 500 nm, 20 nm to 750 nm, 20 nm to 1000 nm, 20 nm to 1500 nm, 50 nm to 75 nm, 50 nm to 100 nm, 50 nm to 200 nm, 50 nm to 300 nm, 50 nm to 400 nm, 50 nm to 500 nm, 50 nm to 750 nm, 50 nm to 1000 nm, 50 nm to 1500 nm, 50 nm to 2000 nm, 75 nm to 75 nm, 75 nm to 100 nm, 75 nm to 200 nm, 75 nm to 300 nm, 75 nm to 400 nm, 75 nm to 500 nm, 75 nm to 750 nm, 75 nm to 1000 nm, 75 nm to 1500 nm, 75 nm to 2000 nm, 100 nm to 75 nm, 100 nm to 100 nm, 100 nm to 200 nm, 100 nm to 300 nm, 100 nm to 400 nm, 100 nm to 500 nm, 100 nm to 750 nm, 100 nm to 1000 nm, 100 nm to 1500 nm, 100 nm to 2000 nm, 250 nm to 75 nm, 250 nm to 100 nm, 250 nm to 200 nm, 250 nm to 300 nm, 250 nm to 400 nm, 250 nm to 500 nm, 250 nm to 750 nm, 250 nm to 1000 nm, 250 nm to 1500 nm, 250 nm to 2000 nm, 500 nm to 75 nm, 500 nm to 100 nm, 500 nm to 200 nm, 500 nm to 300 nm, 500 nm to 400 nm, 500 nm to 500 nm, 500 nm to 750 nm, 500 nm to 1000 nm, 500 nm to 1500 nm, 500 nm to 2000 nm, 750 nm to 75 nm, 750 nm to 100 nm, 750 nm to 200 nm, 750 nm to 300 nm, 750 nm to 400 nm, 750 nm to 500 nm, 750 nm to 750 nm, 750 nm to 1000 nm, 750 nm to 1500 nm, 750 nm to 2000 nm, 1000 nm to 1500 nm, and 1000 nm to 2000 nm).

The grain can have any useful shape (e.g., a columnar shape). The shape can be characterized in any useful manner. In one non-limiting instance, the grain has an aspect ratio defined by a ratio of a first dimension (e.g., a grain diameter, including an average grain diameter) to a second dimension (e.g., a grain length, including an average grain length). The aspect ratio can be determined in any useful manner. In one instance, an aspect ratio is determined for each grain and then each ratio can be used to formulate an average. In another instance, an aspect ratio is determined by employing an average first dimension and an average second dimension. In one non-limiting embodiment, the aspect ratio is a ratio of a grain diameter: grain length. Exemplary aspect ratio includes 1:2 or greater (e.g., 1:3, 1:4, 1:5, 1:6, 1:7, 1:8, 1:9, 1:10, 1:15, 1:20, or greater). Yet other exemplary aspect ratios include that of from about 1:2 to about 1:100 (e.g., from 1:2 to 1:5, 1:2 to 1:10, 1:2 to 1:25, 1:2 to 1:50, 1:2 to 1:75, 1:2 to 1:100, 1:5 to 1:10, 1:5 to 1:25, 1:5 to 1:50, 1:5 to 1:75, 1:5 to 1:100, 1:10 to 1:25, 1:10 to 1:50, 1:10 to 1:75, and 1:10 to 1:100).

In yet another non-limiting embodiment, an average grain diameter of the plurality of columnar grains is less than about 100 nm (or any range described herein), and/or an average grain length of the plurality of columnar grains in greater than about 100 nm (or any range described herein).

In some embodiments, stability of the grain is characterized by minimal grain growth (e.g., at a temperature of from about 300° C. after weeks of exposure). Minimal grain growth can be determined in any useful manner (e.g., a growth less than about 30% of one or more grain dimensions, such as a growth of less than about 20% of one or more grain dimensions). Without wishing to be limited by mechanism, in some instances, the presence of columnar grains may impart resistance to stress-induced grain growth, which in turn may promote ultra-low wear behavior.

Methods of Forming an Alloy

The alloy can be formed in any useful manner. In some embodiments, the alloy can be used as a coating (e.g., a contact coating). These coatings can be deposited using various physical vapor deposition routes, including sputtering (e.g., magnetron sputtering), atomic layer deposition, pulsed laser deposition, and electron beam deposition; chemical vapor deposition routes; electrodeposition routes, including electroplating; plating routes, including electroless plating; thermal spraying routes, including cold spray; and other deformation-based techniques, such as equal channel angular pressing, high-pressure torsion, rapid forging, and surface mechanical attrition treatment. The coating may be further treated (e.g., annealed and/or processed).

Other methods include forming a thin film (e.g., by depositing an alloy on a substrate, such as in any deposition routes described herein) and optionally annealing the film or alloy (e.g., at a temperature greater than about 300° C.). In some embodiments, the methods can be optimized to achieve a particular microstructure (e.g., a plurality of columnar grains).

Methods herein can also include forming a device or a component thereof. In one non-limiting embodiment, the method includes forming an electrical contact (e.g., by depositing an alloy on a substrate and optionally annealing the alloy at a temperature greater than about 300° C.). Further steps can be included to process a surface of the contact, e.g., by exposing the film to a current source or to a heat source, thereby removing one or more insulating species from a surface of the film. If the electrical contact is formed from an alloy that preserves its nanocrystallinity and/or microstructure at high currents and/or high temperature, then the exposure step provides a simplified way to clean an electrical contact surface from debris without negatively impacting the wear parameters of the contact.

The alloys herein can be employed in any useful form (e.g., a thin film) and in any useful device (e.g., a device component, such as an electrical contact, including sliding electrical contacts). In particular embodiments, the alloys herein provide enhanced wear characteristics even as a thin film. Thus, function can be retained even at reduced thickness of the coating. Reduced thickness coating can have any useful thickness (e.g., greater than about 100 nm and/or less than about 5 µm, as well as any range described herein).

In one embodiment, the method includes depositing a binary alloy on a substrate; and annealing the alloy at a temperature greater than about 200° C. (e.g., after weeks of exposure at the temperature, including a temperature greater than about 250° C., 300° C., 350° C., 400° C., 450° C., or 500° C., or a temperature of from about 150° C. to about 650° C.). In other embodiments, the alloy includes a plurality of columnar grains (e.g., where at least one grain has a grain diameter of less than about 100 nm and/or an aspect ratio of at least one grain is 1:2 or greater). The alloy can be provided as a coating or a thin film.

In another embodiment, the method includes depositing a binary alloy on a substrate; annealing the alloy at a temperature greater than about 200° C. (e.g., after weeks of exposure at the temperature, including a temperature greater than about 250° C., 300° C., 350° C., 400° C., 450° C., or 500° C., or a temperature of from about 150° C. to about 650° C.), thereby forming an alloy film including a plurality of columnar grains, and where at least one grain has a grain diameter of less than about 100 nm and/or an aspect ratio of at least one grain is 1:2 or greater; and optionally exposing the film to a current source, thereby removing one or more insulating species from a surface of the alloy film.

EXAMPLES

Example 1

In Situ Tribochemical Formation of Self-Lubricating Diamond-Like Carbon Films

Diamond-like carbon (DLC) films were tribochemically formed on the surface of highly stable nanocrystalline Pt—Au alloys from ambient hydrocarbons. A sliding contact between an alumina sphere and Pt—Au coated steel exhibited extremely low friction coefficients (e.g., as low as $\mu=0.01$) after dry sliding in environments containing trace (e.g., ppb) organics. Ex situ analysis indicated that the change in friction coefficient was due to the formation of amorphous carbon films. Raman spectroscopy and elastic recoil analysis showed that these films include amorphous carbon (e.g., highly graphitic amorphous carbon or $sp^2/sp^3$ amorphous carbon) with as much as 20% hydrogen. Transmission electron microscopy indicated films with thicknesses exceeding 100 nm and were enhanced by the incorporation of worn Pt—Au nanoparticles, resulting in highly wear-resistant, low-friction DLC/Pt—Au nanocomposites. Atomistic simulations of hydrocarbons under shear between rigid Pt slabs using a reactive force field showed stress-induced changes in bonding through chain scission, a likely route towards the formation of these coatings. This novel demonstration of an in situ, tribochemical route for the formation of self-lubricating films has significant impact potential in a wide range of engineering applications.

Surface catalysis routes are often employed in industrial and commercial applications to process organic species [1-4]. Examples include the use of precious metals (e.g., Pt, Rh, and Pd) in catalytic converters to convert toxic constituents found in combustion engine exhaust gas (e.g. complex hydrocarbons such as unburned alkanes) into simpler and less toxic compounds like carbon dioxide and water [1]. In many cases, surface reaction rates are enhanced by increasing the temperature of the catalyst, or applying a shear stress [5-11].

While the promise of Pt—Au alloys has been previously discussed in the catalysis literature [12,13], we show that a unique subclass of Pt—Au alloys having highly stable nanocrystallinity [14] and extraordinary wear resistance [15] enabled the formation of diamond-like carbon (DLC) films, one of the most wear resistant and lubricious materials. Unlike conventional synthesis routes for DLC coatings, we show it is possible to generate highly lubricious and wear-resistant hydrogenated amorphous carbon films in situ through shear of a Pt—Au alloy surface in the presence of trace amounts of ambient organic adsorbates at room temperature in the absence of free oxygen.

DLC films can exhibit extraordinarily high hardness and wear resistance, and when sufficiently hydrogenated, some of the lowest friction coefficients of any solid [16-18]. Hydrogenated DLC, or more generally hydrogenated amorphous carbon (a-C:H), is found in a wide range of commercial applications (e.g. bearings, gears and mechanical linkages in satellites, wind turbines and automobiles) primarily as thin films, to impart low friction and high wear resistance [16,17,19]. While these materials share a common molecular structure of sp$^2$ and sp$^3$ hybridized carbon [18], they lack long-range order and are thus amorphous. When a-C:H exhibits extremely low friction in inert or vacuum environments (e.g., µ~0.001 to 0.05; 10N load [20]), it is generally attributed to hydrogen passivation of unterminated carbon surface bonds [21]. Unlike other low friction carbonaceous coatings that require humid requirements (e.g., a-C, graphite, etc.), a-C:H typically exhibits increasing friction coefficients with exposure to humidity (e.g., µ~0.2 to 0.3; 10N load [20,22])

DLC coatings are routinely manufactured via plasma enhanced-chemical vapor deposition (PECVD) from hydrocarbon feed gases [17]. A recent publication demonstrated how transition metal-nitride coatings can act as a catalyst for the formation of low-friction solid carbon films from fluid lubricants [6], but these films were observed outside of the region of contact and did not confer enhanced lubricity. Here, we show in situ tribochemical formation of thick, persistent, low friction a-C:H films from adventitious carbon and ambient organics, including simple alcohols and alkanes, at room temperature.

As described herein, we describe in situ tribochemical formation of low friction DLC films on Pt—Au alloy surfaces at room temperature from ambient hydrocarbons, simple alcohols, and alkanes. The films were nanocomposites, consisting of a mixture of DLC and Pt—Au nanoparticles. No material removal from the wear tracks produced in $N_2$ with trace organics was evident after as many as 100 k cycles of sliding at 1.1 GPa maximum Hertzian stress. The generation of Pt—Au nanoparticles, which were incorporated into the tribofilm, implies the possibility of forming electrically conductive, extremely wear resistant and low-friction DLC-metal nanocomposites in situ and at room temperature. While the use of precious metal films in electrical contact applications is commonplace, these films are in general unlubricated, so the formation of self-lubricating DLC films from trace organics at ambient temperature would have extraordinary utility in a wide range of engineering applications. The use of this approach—currently requiring precious metals—may be cost prohibitive except in the case of rolling element or simple bearings.

Another tantalizing application for stable nanocrystalline noble metal alloys like Pt—Au is in microelectromechanical systems, where the preferential formation of a conductive and wear resistant carbon-based nanocomposite lubricant may mitigate two key failure modes, namely the formation of insulating tribopolymer films and wear of metallic substrates, better than the vapor phase lubrication by molecular adsorption of simple hydrocarbons on silicon structures that has been previously reported [35]. Additional details follow.

Example 2

Experimental Methods

Provided herein are exemplary methods for some of the experimental data described herein.

Material synthesis: Thin films of Pt with 10 at. % Au (Pt—Au) were deposited by direct current (DC) magnetron sputtering using a cryo-pumped vacuum system with a base pressure of $2 \times 10^{-7}$ Torr. Films were prepared from a single, high purity Pt—Au deposition target (Refining Systems) that was pre-sputtered for approximately 5 min. prior to the start of each deposition to avoid incorporation of adventitious carbon or other impurities in the deposited films. Ultra-high purity Ar (99.999%) was used for all sputter processes, and substrates did not exceed 50° C. during deposition. A quartz crystal monitor was used to determine film thickness with Angstrom-level precision. Film composition was verified by Electron Microprobe Analysis (EMPA). A JEOL model JXA-8530F Microprobe operating at 7.0 keV incident energy (20 nA, 2 µm beam diameter) was used to determine the composition of a 1 µm thick Pt—Au witness film. The average of 50 spaced measurements was used to demonstrate a film composition of $Pt._{90}Au._{10}$, with uncertainty of +/− 0.5 at. % with 95% confidence or with an experimental accuracy of 1.89% relative to measured standards. Reference materials of known compositions for Pt and Au were used from Taylor Metal Standards (Charles Taylor Multi Element Standard No. 202, September 1976) using Pt $M_\alpha$ line and Au $M_\beta$ line for composition calculations. For brevity, we will refer to these simply as Pt—Au films in the Examples described herein. Friction experiments were performed on 2 µm thick Pt—Au films deposited on polished 440 C stainless steel coupons.

Tribological testing: The wear, friction, fatigue, and other mechanical properties of these films are described in detail in separate manuscripts [15,23]. Briefly, we found that these films exhibited extraordinarily high resistance to wear (wear rates of about $3 \times 10^{-9}$ mm$^3$/N-m), low and consistent friction coefficients (µ~0.25-0.3 over 100K cycles in laboratory air, more below), and high nanoindentation hardness (7.1+/−0.4 GPa) [15]. The ability of these films to withstand high applied stresses, coupled with the well-known catalytic properties of pure Pt and Pt—Au alloys, combined to enable the formation of DLC films.

Friction coefficients were measured for 3.2 mm diameter sapphire spheres sliding against the Pt—Au thin films deposited on steel using a 1 N normal force, corresponding to a 1.1 GPa maximum Hertz stress and 41 µm contact diameter. A sliding speed of 1 mm/s and wear track length of 2 mm were used in bi-directional sliding motion, exposing any given location on the wear track the ambient gas environment in the test chamber for approximately 2 seconds per contact pass. Tribological testing was performed on a modified Anton Paar Nano Tribometer housed in an acrylic glove box; modifications include a stepper motor (PI Instruments PLS 85), National Instruments data acquisition hardware (PXIe 1073 and 6361) and custom LabVIEW software. Position encoded normal and friction forces were acquired at 50 Hz. Experiments performed in lab air were performed with the gloves removed from the chamber, exposing the tribometer to ambient air that was temperature regulated to 20-22° C. at a relative humidity of 12-17%. For an oxygen-free environment, the box was purged using 34 L/min flow of ultra-high purity (UHP) nitrogen until <10 ppm of $O_2$ and $H_2O$ were present, measured using an Alpha Omega 3000 series oxygen analyzer and Michell Instruments S8000 precision chilled mirror hygrometer. Samples were also exposed to mixed flows of $N_2$ and isopropyl alcohol (IPA), or $N_2$ and anhydrous hexanes, in a nitrogen purged glove box. In both instances, a 34 L/min ultra-high-purity nitrogen stream was used to continuously purge the chamber, while a second 1.4 L/min stream of ultra-high-purity nitrogen was routed through a vessel filled with approximately 3 L of either water and IPA or anhydrous hexanes in liquid form. A diffuser stone was used to maximize exposure of the nitrogen gas to the liquid medium. In referencing data from these experiments in the Examples below, the term "high concentration" is used to describe situations in which the hydrocarbon stream was directed at the sliding contact, while "low concentration" is used when the hydrocarbon stream was directed away from the contact, thus implying dilution by mixing with the continuously flowing UHP nitrogen stream that is used to maintain a positive pressure in the glove box.

Microscopy: Raman spectroscopy was performed on tribofilms using a Horiba LabRam HR Spectrometer equipped with a 600 grooves/mm grating, a Synapse CCD detector, and a 50× microscope objective with a spectral resolution of 0.3 cm$^{-1}$ at 680 nm and 1800 gr/mm. A 532 nm laser line set at an output of 10 mW was used as the excitation source, resulting in an incident 1.5 mW on the sample surface as measured by a Pocket Laser Power meter 840011 with a 1.55 signal correction factor. Sampling was performed using a DuoScan method over a spot size of approximately 80 µm×60 µm. Using a pinhole setting of 100 µm, typical collection times ranged from 5 to 20 seconds with 20 scans collected to increase the signal to noise ratio. An FEI Helios G3 dual beam focused ion beam (FIB) with electron imaging and Ga-ion milling capabilities was used to image the wear track surfaces and to prepare electron transparent cross-sectional specimens for imaging via transmission electron microscope (TEM). An FEI Titan™ G2 80-200 scanning transmission electron microscope (STEM) with a Cs probe corrector operated at 200 keV was used in this study. An electron probe smaller than 0.13 nm with a convergence angle of 18.1 mrad, and a current of ~75 pA was used for data acquisition. A Bruker Contour GT-I optical interferometer was used to determine wear volumes. The entire length of each wear scar was imaged using the stitching feature on the Vision64 software, using a 10× objective and 2× magnified, providing a pixel resolution of 500 nm in the lateral and <1 nm in the vertical (height) directions. Wear rates were determined using topographical data from each track, excluding the ends of the wear tracks where sliding speeds vary and wear debris pile-up occurs from the reciprocating motion of the slider. The specific wear rate (K) of the PtAu track was calculated using the following expression:

$$K = \frac{A}{F_n \cdot N} \cdot 1000 \frac{mm}{m},$$

where A is the average wear track cross-sectional area, $F_n$ is the contact force, and N is the number of cycles. A more detailed explanation of volumetric wear rate calculations based on mean cross-sectional wear track analysis and the uncertainty of these calculations are provided elsewhere [24,25]

Gas composition analysis: Analysis was performed to identify the concentrations of organic species present in the dry nitrogen purged glove box that housed the friction testing apparatus. Samples were tested using a Perkin Elmer (Groton, Conn.) Turbo Matrix ATD thermal desorption unit. Gas samples were pumped through a pre-conditioned thermal desorption tube (Perkin Elmer Tenax TA Thermal Desorption Tubes, ¼" (6.35 mm) O.D.×3.5" (89 mm) long), and desorbed at 300° C. for 10 minutes. The outgassed species are trapped on a M041-3628 Air Monitoring Trap cooled to −30° C., desorbed at 40° C./s, and transferred via heated line to an Agilent 6890N using a J&W DB-1701 column (60 m×0.32 mm×1.0 µm). Analytes were detected with an Agilent 5975 Inert XL Mass Selection device (Chemstation version D.03.00.611).

A Tenax TA desorption tube was conditioned by purged heating and used to concentrate a flow-through gas sample at a measured flow rate of 0.4 L/min for 16 minutes, resulting in a total collection volume of 6.5 L. The same Tenax TA desorption tube was reanalyzed as a blank reference, and the chromatograms overlaid. The components not detected in the blank analysis were integrated using Agilent Chemstation software, and instrument response (as peak area) was compared to the response of a known mass of ethylene glycol. The resulting compounds could only be estimated at concentrations between 20 and 100 ng/L. These estimates assumed equivalent response factors.

Example 3

Figure 1B:
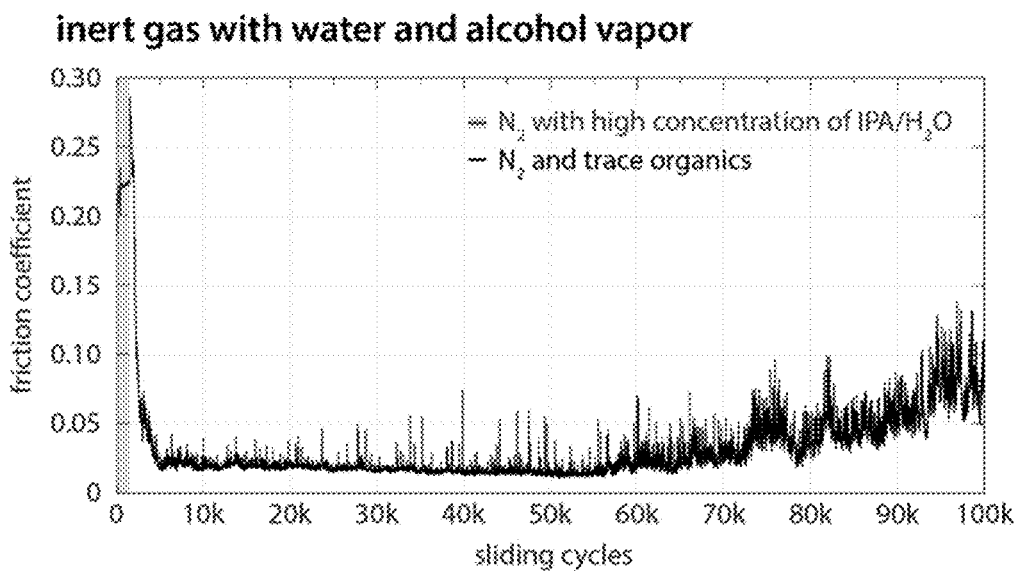
Figure 1C:
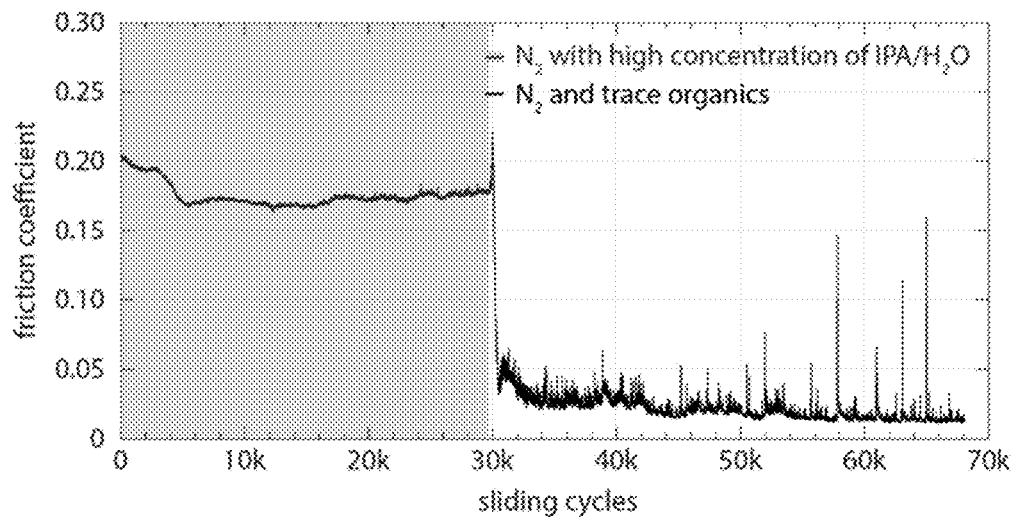
Figure 1D:
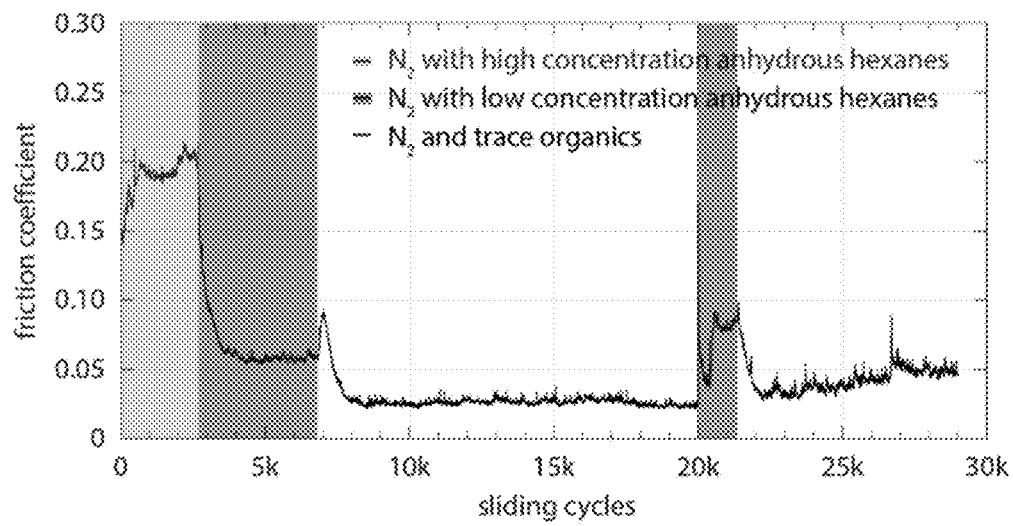
Figure 2A:
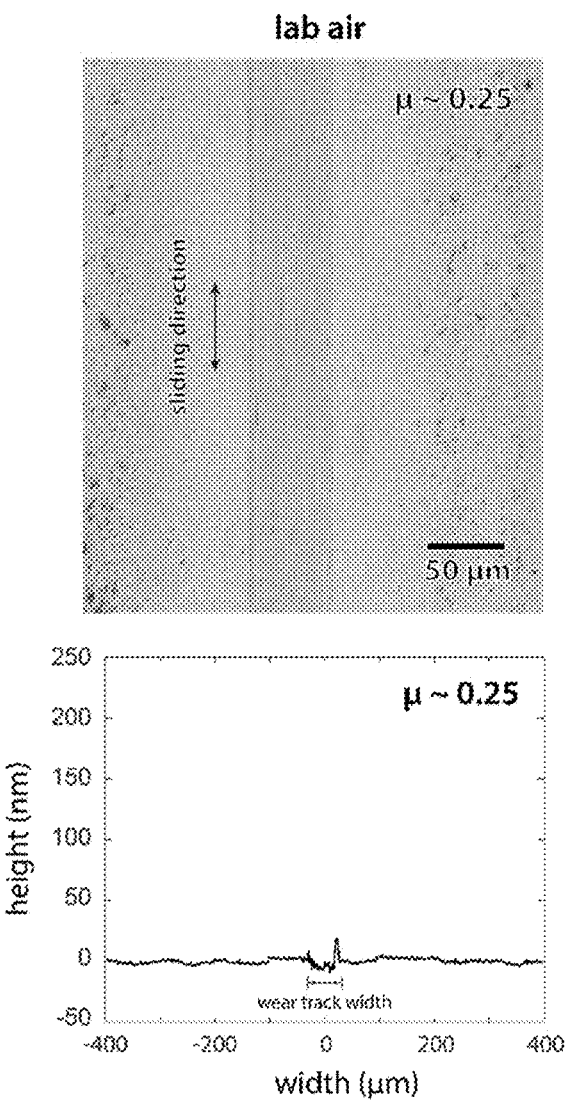
FIG. 2A-2C shows top-down scanning electron microscopy (SEM) images and average cross-section topography profiles of wear tracks established in (A) lab air and (B) ultra-high purity $N_2$ with trace organics, both corresponding to data in FIG. 1A, and (C) directed flow of $N_2$ with concentrated IPA/$H_2O$ vapor, corresponding to data in FIG. 1B.
Figure 2B:
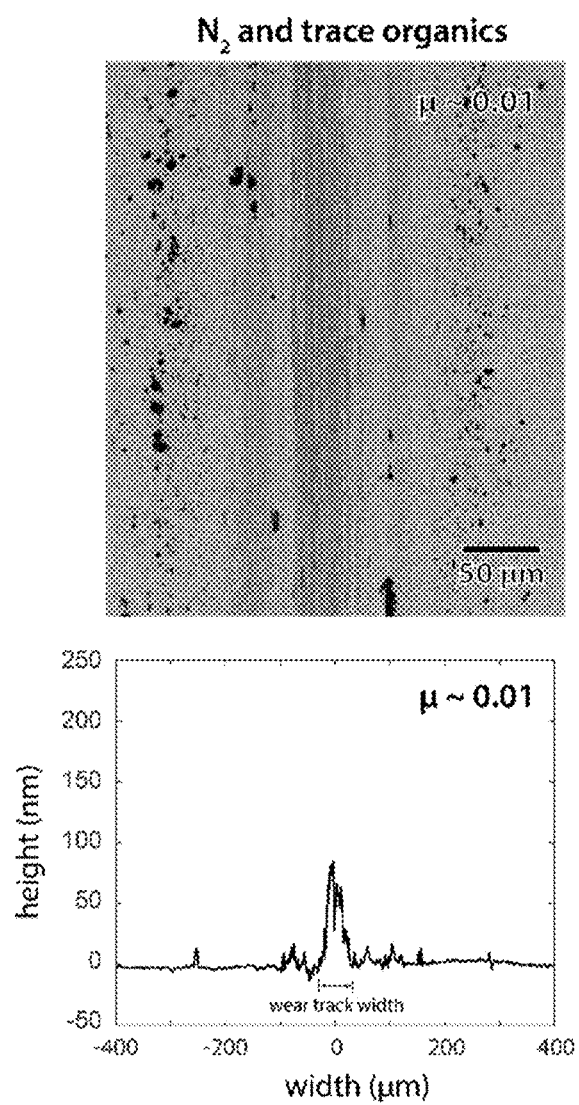
Figure 2C:
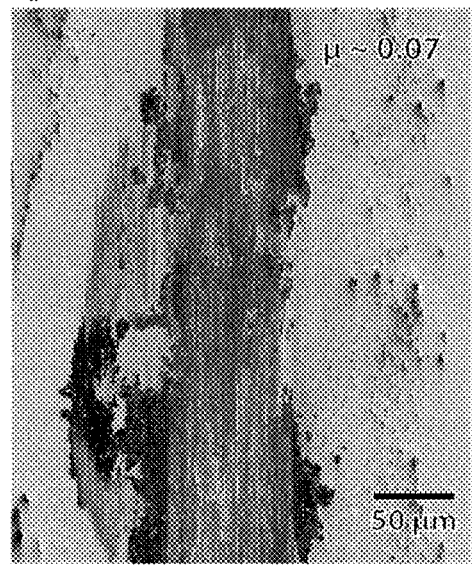
Figure 2C:
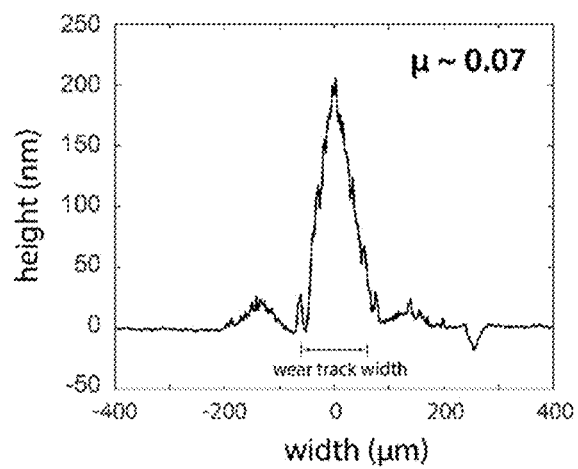

Understanding the Role of Environment on Friction Coefficient Evolution of DLC Films Friction coefficient data for sapphire spheres sliding against Pt—Au thin films in various operating environments are shown in FIG. 1A-1D, with representative SEM images of wear tracks and average wear track cross-section profiles shown in FIG. 2A-2C. FIG. 1A shows a representative friction coefficient measured in a temperature regulated (20-22° C.) laboratory air environment (12-17% RH). Although FIG. 1A only shows results up to 35K cycles, we found friction coefficients in open air consistently in the range µ=0.25 to 0.30 for up to 100 k sliding cycles, at which point this test was halted and the wear rate was determined. The top-down view of this wear track (FIG. 2A) shows that the depth of the wear scar was approximately 10 nm. Even at these high applied contact stresses (1.1 GPa maximum Hertz stress), the wear rate of the Pt—Au films in lab air was extremely low, K≅3×10$^{-9}$±1×10$^{-9}$ mm$^3$/N-m, and was equivalent to the wear rate of the sapphire balls [15].

When friction measurements were performed in dry $N_2$, friction coefficients were initially similar to the test in laboratory air, in the range µ=0.25-0.30, but dropped over approximately 10K cycles to a value of µ=0.01 (FIG. 1A). The friction coefficient measured in laboratory air (µ=0.25-0.30) and dry $N_2$ (µ=0.01) were similar to values for a-C:H DLC films under similar contact conditions [16]. As discussed in more detail below, surface profilometry, Raman spectroscopy, elastic recoil spectroscopy (ERDA), and TEM were used to determine that this reduction in friction coefficient was correlated with the tribochemical formation of 50-200 nm thick nanocomposite film, present throughout the wear track, consisting of a-C:H DLC and Pt-Au nanoparticles. Gas analysis was used to identify species and concentrations of trace hydrocarbons in the UHP nitrogen purged chamber at the end of the experiment shown in FIG. 1A. Table 1 shows the compounds that were detected from NIST library of gas samples from a dry $N_2$ purged glove box; concentrations were in the range 20-100 ng/L.

TABLE 1

Compounds identified from NIST library of gas samples
Compounds identified trichloroethylene
acetic acid
benzaldehyde
tridecane
phenol
acetophenone
2-heptyl-1,3-dioxolane
butylated hydroxytoluene
benzoylformic acid
phenylmaleic anhydride Trace amounts of several complex hydrocarbon gaseous species were identified with concentrations in the range 20-100 ng/L, assuming equivalent response factors. Assuming a linear growth rate of the DLC film in this environment, i.e., $N_2$ with trace organics, we can estimate whether this environment can generate a 50 nm thick film in the time required to complete a 35 k cycle test (see FIG. 1A and FIG. 2B). A 2 mm long, 50 μm wide wear track with a 50 nm thick DLC film (FIG. 2B) corresponds to approximately 7.5 ng of material generated on the wear track, based on a density estimate of 1.5 g/cm$^3$ [16]. The concentrations of any of the ambient organic species identified in the UHP nitrogen purged box exceeded 20 ng/L, inside the 420 L glove box.

Even if we ignore the continuous flow of nitrogen with similar concentrations of trace organics into the chamber at 34 L/min, corresponding to 680 ng/min of trace organics, there is well over 8,400 ng of trace organic material in the chamber to feed the tribochemical formation of DLC. The specific concentrations of hydrocarbons were only measured for the UHP dry $N_2$ case to verify that even a nominally pure source of nitrogen with ppb concentrations of trace organics contains more than enough hydrocarbons to amply sustain film growth. The concentrations of hexanes and IPA in the high and low concentration regimes were not quantified, as a systematic study of formation rates as a function of hydrocarbon concentrations and compositions was outside the scope this investigation. We rely on these qualitative statements of concentration simply to motivate future work to establish the correlation between DLC formation rates and environment composition.

Experiments were also performed to probe film formation kinetics by deliberately increasing the concentration of hydrocarbons present in the chamber. Friction coefficients of μ·0.2 were observed when a direct flow of $N_2$ carrying concentrated IPA and water vapor was impinged on the contact during sliding (FIG. 1B-1C), similar to values found in literature for friction coefficients of a-C:H under contact conditions at similar humidity [20,22,26]. In our case, the concentrated organic flow was introduced initially, and then switched off part way through the test, as indicated in the figures.

An additional experiment using both high and low concentrations of anhydrous hexanes (FIG. 1D) was used to try to decouple the role of water and hydrocarbons on film formation. When testing in an environment containing anhydrous hexanes, friction coefficients remained at similarly high levels (μ~0.2) and decreased by an order of magnitude after the flow of hexanes was reduced.

These results imply that (1) while humidity is known to significantly impact the friction behavior of hydrogenated DLC [16,26], the presence of water alone did not appear to inhibit the tribochemical formation of a-C:H DLC, and (2) that the friction coefficient exhibited a dependence on hydrocarbon concentration in the absence of water (FIG. 1D). These results agree with Marino et al. [27], who also showed that exposure of DLC films to varying concentrations of n-pentanol in both dry and wet Ar can cause significant variability in friction behavior. While this is not conclusive evidence that water plays a minor or negligible role, it suggests that the surface concentration of hydrocarbons alone can impact friction behavior. Other factors that likely contribute to friction behavior include the accumulation of partially decomposed hydrocarbons and the ongoing competition between conversion of hydrocarbons into DLC and wear.

Without wishing to be limited by mechanism, we hypothesize that, despite the presence of ambient organic species in the lab air environment, the combination of oxygen and water is necessary to inhibit film formation. The rate of film formation is clearly faster with higher concentration of organic species; this is evident in a comparison of data in FIG. 1A-1B. The addition of a concentrated stream of IPA for the initial 2 k cycles of sliding enhanced the rate of formation, as evident by the much more rapid transition to low friction when the stream was turned off (FIG. 1B). These data corroborate the hypotheses that water alone does not inhibit film formation, and that hydrocarbon surface concentration is one of the determining factors in friction behavior.

Example 4

Characterizing In Situ DLC Films

Figure 3A:
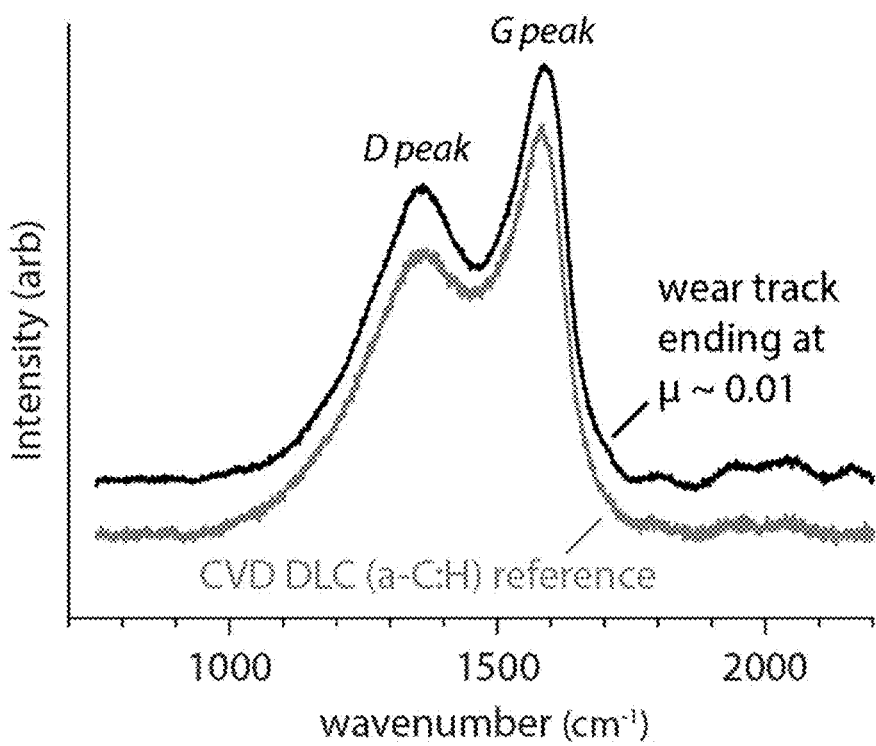
FIG. 3A-3B shows (A) Raman spectra acquired on the wear track shown in FIG. 2B ($N_2$ and trace organics) showing that the carbon films include hybridized $sp^2/sp^3$ carbon, and a plasma-assisted chemical vapor deposited diamond-like carbon (DLC) reference spectra. Also provided are (B) peak intensity ratios, G-peak position, and full-width half-max of the G-peak along the length of the entire wear track in discrete intervals of 100 µm along the centerline.
Figure 3B:
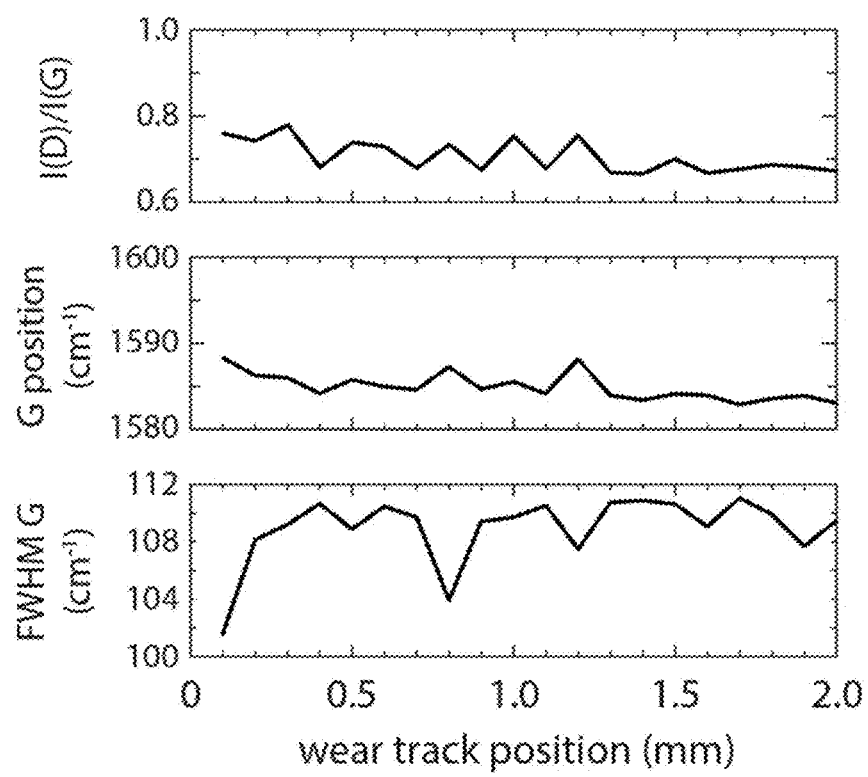
Figure 4A:
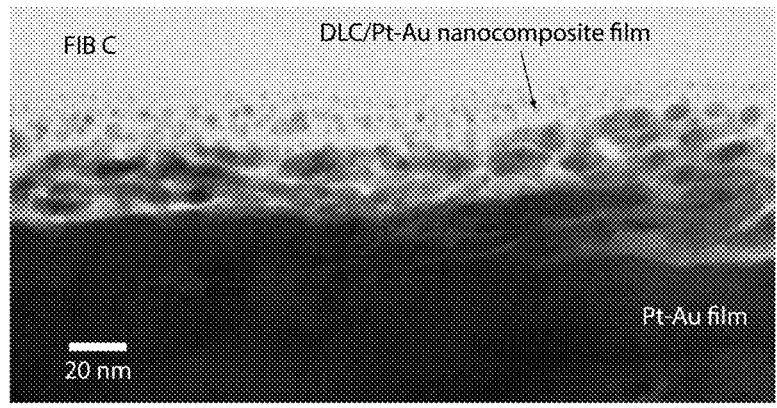
FIG. 4A-4D shows bright field transmission electron microscopy (TEM) images of wear track cross-sections corresponding to (A and B) FIG. 2B and to (C and D) FIG. 2C.
Figure 4B:
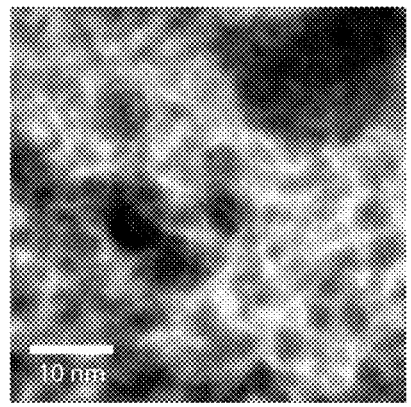
Figure 4C:
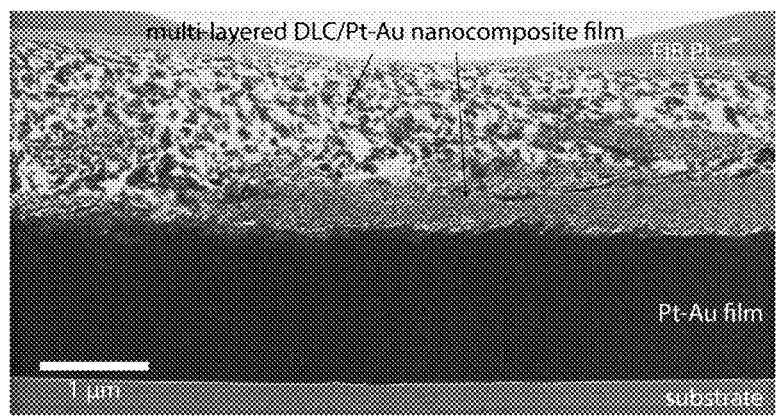
Figure 4D:
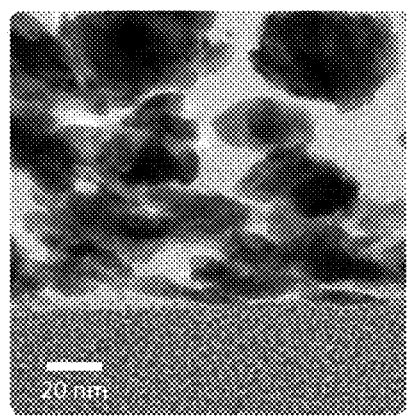

Raman spectroscopy was used to characterize the films formed on the low-friction wear tracks, and they were found in all cases to correspond to highly graphitic amorphous carbon or DLC, as shown in FIG. 3A-3B, where reference spectra for a PECVD hydrogenated DLC film (a-C:H) is also provided. The DLC film used for comparison was deposited on 13-8 PH stainless steel using plasma-assisted decomposition of tetramethylsilane and cyclohexane precursors, at a power of 250 W. The intensity, ratio, and position of D and G peaks shown in FIG. 3A-3B are generally used to characterize structure and ordering in carbon films [18,28,29].

The hydrogen concentration on the DLC tribofilm shown in FIG. 2B was determined to be 20% using ERDA [30], using a beam of 32 MeV $Si^{5+}$ ions from the Sandia National Laboratories 6 MeV terminal Van de Graaff generator impinged on the sample at an angle of 75° to the surface creating a 10-20 μm diameter spot size. Measurements were made along wear track centerlines, in the direction of sliding. A Si surface barrier detector was used to measure lighter atoms (i.e., C and H). A 12 μm aluminized Mylar foil placed in front of the detector prevented the high-energy Si ions from entering the detector, but was thin enough to transmit lighter ions of interest.

The ERDA-determined value of 20% H and Raman G-peak position of 1585 cm$^{-1}$ and I(D)/I(G) ratio of 0.7 (FIG. 3B) can be compared to comprehensive reference data published by other [18,28,31], suggesting that the tribofilms found in the wear track includes hydrogenated amorphous carbon (a-C:H). This agrees with literature reports that assign friction coefficients for a-C:H like those reported here, i.e. μ~0.001 to 0.05 in dry $N_2$ and μ~0.2 to 0.3 in humid air [16,18]. These reports allow us to rule out graphite; with majority sp$^2$ bonding, μ~0.5 to 0.6 in dry $N_2$, and μ~0. 1 to 0.2 in humid air; a-C, with mixed sp$^2$/sp$^3$ bonding, μ~0.6 to 0.7 in dry $N_2$, or ta-C, with majority sp$^3$ bonding, μ~0.7 in dry $N_2$ and μ~0.1 in 50% RH humid air [20]. While UV Raman techniques would determine sp$^3$ carbon content [32] of the DLC network formed, these tests were not performed. A systematic investigation into the conditions for film formation on these Pt—Au films and resulting DLC structures would be of great interest. Contrasting with the relatively high temperatures associated with CVD deposition of DLC films, the contact stresses and sliding speeds used in the present study are not expected to generate significant contact heating. This implies that the tribofilm formation takes place near room temperature, and is aided by the catalytic properties of the majority-Pt containing Pt—Au film.

TEM of wear track cross-sections corresponding to the data sets in FIG. 1A/2B and FIG. 1B/2C are shown in FIG. 4A-4D. TEM analysis revealed that the tribochemically formed DLC films includes a composite of Pt—Au nanoparticles and DLC. While the Pt—Au wear track does not show evidence of material removal in the form of volume loss, as would suggest zero wear of the metal film, there was a significant amount of Pt—Au in the form of nanoparticles incorporated into the DLC film that were generated through sliding. Without wishing to be limited by mechanism, it is possible that initial stages of film formation produced hard DLC nanoparticles that abraded the Pt—Au and drove the process of mixing, promoting continued film formation. The thicker films found in the 100 k cycle test with a short IPA/$H_2O$ run-in period appeared layered, with sharp variations in the density and size of Pt—Au nanoparticles. The thickness of the DLC film was greatest in the case where the system was impinged with an $N_2$ stream carrying high concentration of IPA and water for the first 2 k cycles of sliding (FIG. 1B), as shown in the SEM images (FIG. 2C). The DLC film was approximately 200 nm thick after a total of 100 k cycles of sliding. This contrasts with a 50 nm thick film found after 35 k cycles in the $N_2$ purged chamber with only trace ambient hydrocarbons, as seen in FIG. 1A, 2B. This discrepancy in the film thickness may simply be associated with a difference in total sliding cycles, as the wear track having a thicker film was subjected to nearly three times more cycles.

The gradual increase in friction coefficient to values of about $\mu$=0.1 at very long times, as observed in prolonged sliding experiments (FIG. 1B), suggests that there is a decreased ability for PtAu wear particles to reach the sliding surface, which can slow the catalytic actions necessary for further formation of DLC. TEM images of two cases ending in low ($\mu$~0.1) and even lower ($\mu$~0.01) friction behavior, corresponding to FIG. 4A-4B and FIG. 4C-4D, respectively, reveal significant differences in film morphology. The case ending in higher friction, exposed to more cycles, seems to have a lower density of metal particles, possibly limiting the ability of Pt to effectively assist in hydrocarbon decomposition. This may imply that there may be an optimum concentration (or concentration schedule) of organic species to promote continuous DLC formation. An excessive surface concentration of organic species may lead to starving the surface of Pt—Au and inhibit film formation, while too low a concentration may simply prolong the run-in process.

Referring to pressure-temperature phase diagrams for carbon [33], it is reasonable to expect that the contact stresses in these experiments are sufficient to enable the formation of $sp^2/sp^3$ bonds in the tribofilm. The high hardness of this alloy (H~7 GPa), coupled with evolving surface roughness, and the high surface-area-to-volume ratio and small curvature of interspersed Pt—Au nanoparticles all likely play a role in enabling and enhancing the decomposition and cross-linking of hydrocarbons into a predominately $sp^2/sp^3$ tribofilm. While the process of tribopolymer formation from benzene on the surface of Pt contacts has been shown by Qi et al. [5], the higher contact stresses accessible by virtue of our stable nanocrystalline Pt—Au alloy enable the formation of the more desirable self-lubricating DLC films. A conservative calculation of contact stress (i.e. Hertz maximum stress of 1.1 GPa) approaches the Berman-Simon boundary where the diamond allotrope of carbon is stable at room temperature [33]. Future systematic investigations could provide greater insight about the numerous factors impacting the formation of DLC/Pt—Au nanocomposite tribofilms, and possibly elucidate new methods to optimize this and related systems for greater engineering utility.

Example 5

Using MD for Evidence of Stress-Dependent Hydrocarbon Deposition

Figure 5A:
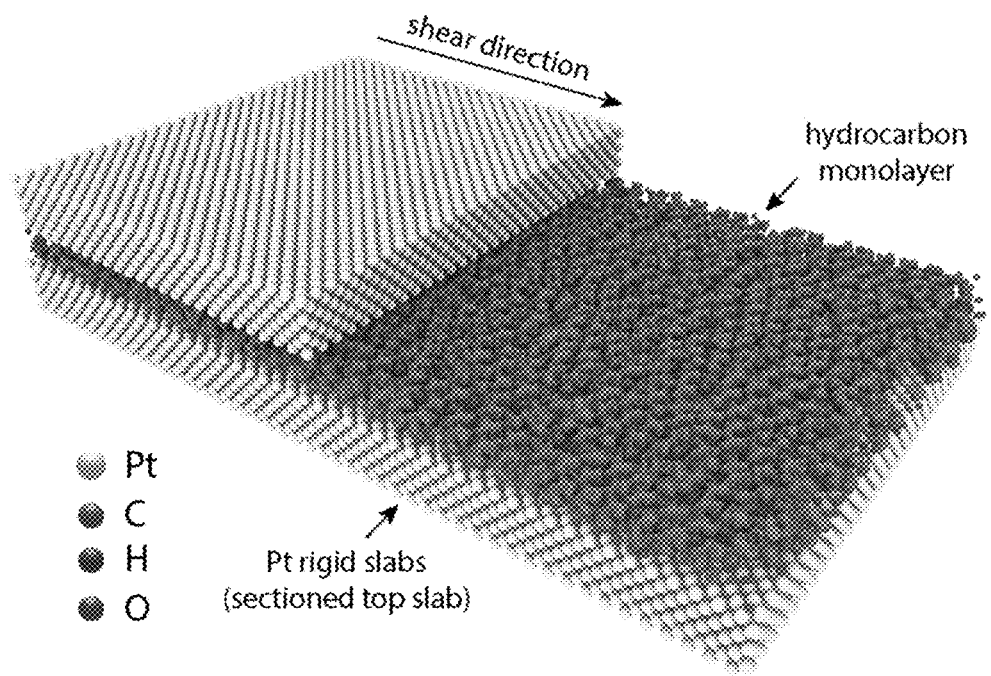
FIG. 5A-5B shows an (A) example sectioned view of shear simulations consisting of Pt rigid slabs (the top layer is sectioned here for clarity) with an initial single layer distribution of hydrocarbons. Also provided are (B) plan view images of sheared isopropyl alcohol and hexane at 1 GPa and 6 GPa.
Figure 5B:
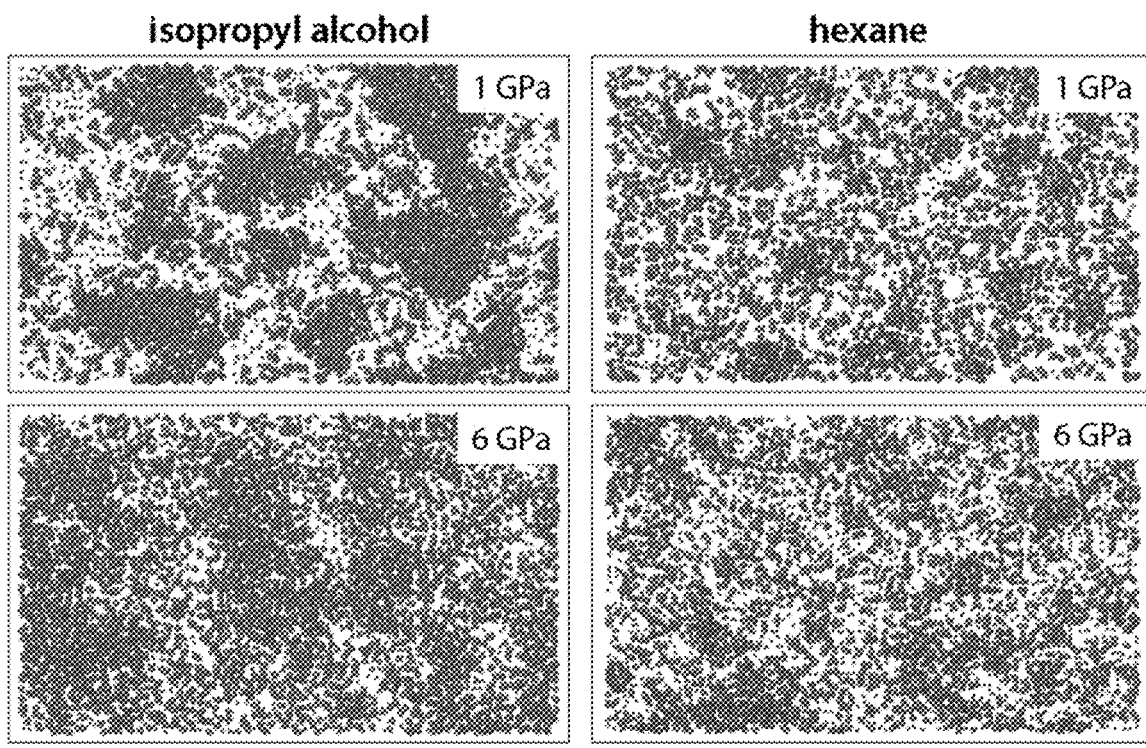

Chemically reactive molecular dynamics simulations were used to further explore the formation of these DLC films, by studying hydrocarbon chain scission under high applied stresses on a catalytic substrate. These simulations used a ReaxFF force field that was previously parameterized for hydrocarbon catalysis on Pt [34]. We studied two hydrocarbons, isopropyl alcohol (IPA) and hexane, initially applied in a single layer between two Pt slabs at room temperature as depicted in FIG. 5A. Because the pure Pt in this force field does not exhibit the high hardness of our Pt—Au films, we simulated this effect by holding the top and bottom Pt slabs rigid during the simulations. The top Pt slab had an applied velocity of 1 km/s, with two different normal pressures in an attempt to straddle the Berman-Simon boundary; a moderate pressure of 1 GPa, and (in a separate simulation) a much higher pressure of 6 GPa. Both systems had periodic boundary conditions applied in the directions transverse to the applied pressure. To study the chemistry that occurs in the wake of the contact we removed the applied load from the simulations after approximately 6 ns of shear, and allowed the systems to relax with a thermostat and barostat to 300 K and zero pressure. FIG. 5B shows in-plane images of the hydrocarbon layers after shear and relaxation.

Figure 6A:
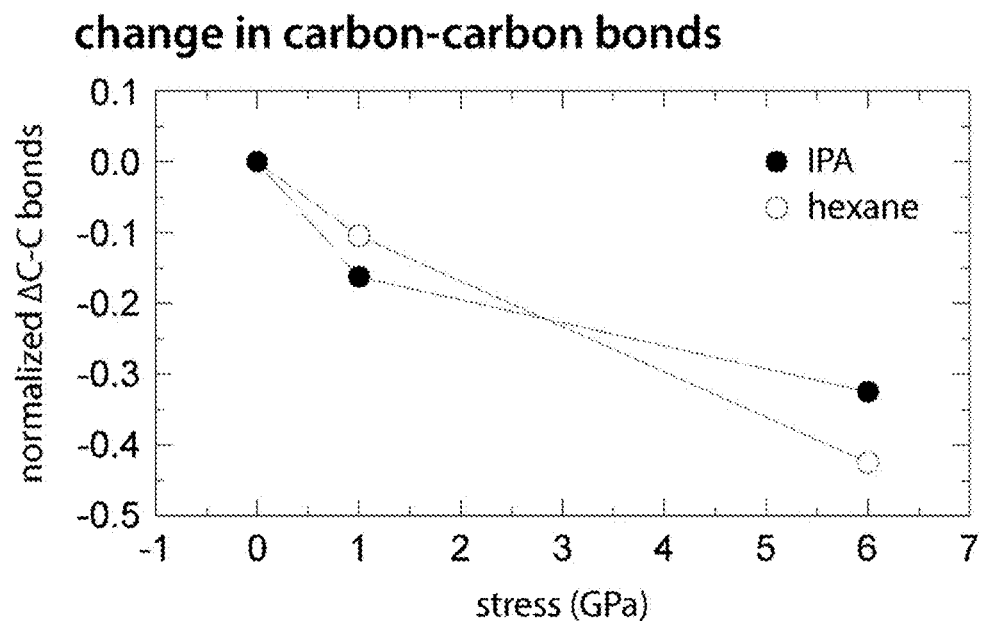
FIG. 6A-6B shows MD simulation results showing stress-dependent chain scission of isopropyl alcohol and hexane due to sliding shear between Pt plates; change in the number of (A) carbon-carbon and (B) hydrogen-hydrogen bonds normalized to the number of C and H atoms in the simulation, respectively.
Figure 6B:
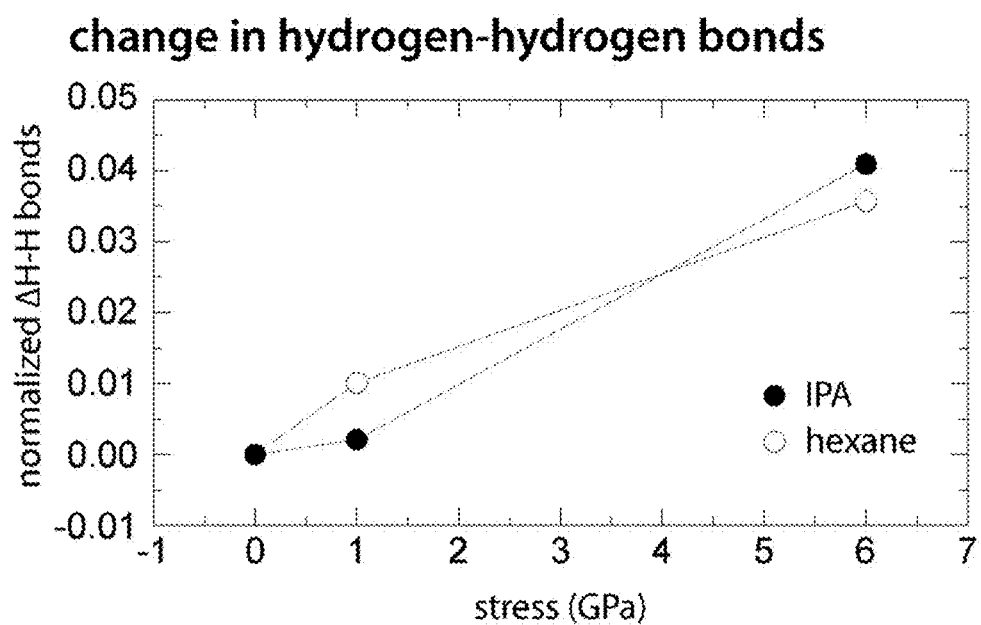

The number of C-C bonds and H-H bonds, shown in FIG. 6A-6B, are normalized by the total number of carbon and hydrogen atoms in each system, respectively. The number of carbon-carbon and hydrogen-hydrogen bonds based in each system were calculated from distance searches, with cutoffs of 1.54 Å for the C-C bonds (the length of a carbon $sp^3$ bond) and 1.00 Å for H-H bonds. The decrease in the number of C-C bonds indicates that hydrocarbons undergo chain scission, while the increasing number of H-H bonds also shows that hydrogens are stripped from the chains. Both effects leave undercoordinated carbon atoms exposed which increases the possibility of formation of DLC, especially with a lack of an adequate number of accessible hydrogen atoms for bonding with undercoordinated carbons (due to the formation of H2 molecules). The kinetics of DLC formation are relatively slow, and thus beyond the timescales accessible to our simulations. However, the cracking of longer hydrocarbons into smaller reactive species—a process enhanced by applying shear stress—indicates the propensity for tribochemistry at stresses commensurate with experiments.

Example 6

Formation and Characterization of an Exemplary Pt—Au Alloy System

The DLC films herein can be employed with any useful alloy system. One exemplary system includes a binary alloy having stable non-crystallinity characteristics with optimal wear rates. In this Example, we show one such alloy system including Pt and Au. In particular, we describe such alloys having wear rates about 100× lower rates than any reported nanocrystalline alloy, while exhibiting friction coefficients ($\mu$~0.2-0.3) similar to polytetrafluoroethylene nanocomposites.

PtAu thin films were deposited by direct current (DC) magnetron sputtering using a cryopumped vacuum system with a base pressure of $2\times10^{-7}$ Torr. A single, high purity PtAu target (Refining Systems) was used for all depositions. This target was pre-sputtered for ~5 min. prior to the start of each deposition to avoid incorporation of adventitious carbon or other impurities in the deposited films. Ultra-high purity Ar (99.999%) was used for all sputter processes, and substrates did not exceed 50° C. during deposition. A quartz crystal monitor was used to determine film thickness with Angstrom-level precision. Thickness calibrations conducted prior to depositions utilized a calibrated DEKTAK 3 (Veeco; Woodbury, N.Y.) surface profilometer and cross-section TEM. The 18 nm thin film and the ~2 μm thick film were deposited on polycrystalline NaCl and oxidized Si(100) substrates, respectively. The thick films deposited on a 150 mm diameter Si wafer showed an in-plane compressive residual stress of ~650 MPa, determined from wafer curvature.

Film composition was verified by Wavelength Dispersive Spectroscopy (also referred to as Electron Microprobe). A JEOL model JXA-8530F Microprobe operating at 7.0 keV incident energy (20 nA, 2 μm beam diameter) was used to determine the composition of a 1 μm thick PtAu witness film. The average of 50 spaced measurements demonstrated a film composition of $Pt_{.90}Au_{.10}$. Uncertainty in the measurement was +/−0.5 at. % with 95% confidence. For brevity in this Example, we often refer to this as simply PtAu.

To confirm the suppression of grain growth in Pt through grain boundary segregation of Au, thermal anneals were performed on both thin and thick films of pure Pt and PtAu. Results of thermal grain growth experiments on magnetron sputtered PtAu (10 at. % Au) are presented in FIG. 7A-7B, including in situ X-ray diffraction (XRD) annealed up to 700° C. and ex situ interrupted transmission electron microscopy (TEM) measurements of grain size for annealed specimens exposed to 500° C. Both 18 nm thick freestanding films as well as ~2 μm thick films on oxidized Si wafers were annealed, and are referred to as "thin" and "thick" films, respectively. These annealing temperatures represent homologous values $T/T_m$ of ~0.4 and 0.5 relative to the equilibrium solidus temperature (~1660° C.), a regime where grain growth is rampant for pure metal systems with nanoscale grain structures [38]. While the experimental grain growth in FIG. 7 is small, it is important to recognize that there are confounding factors that can act to cause stagnation of normal grain growth in columnar films [38].

Figure 7A:
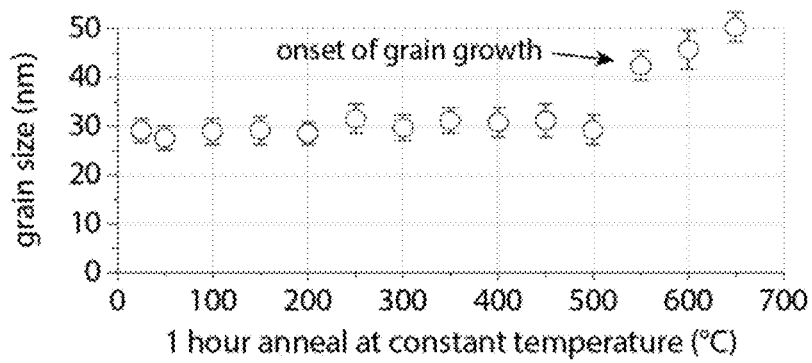
FIG. 7A-7F shows annealing grain growth data for PtAu films using (A) in situ X-ray diffraction (XRD) with incremental temperature steps and 1 hour holds with ~2 µm thick films, (B) interrupted transmission electron microscopy ultra-high vacuum (TEM UHV) anneals at 500° C., and molecular dynamics simulations with equiaxed grain structures for (C) pure Pt and (D) Pt—Au. (E) Thin film plan view scanning transmission electron microscopy, high-angle annular dark field (STEM-HAADF) images of thin films after 1 day of annealing for pure nanocrystalline Pt and 1 week for PtAu; both films had an initial average grain size of 7±3 nm. After coarsening rapidly into a steady-state condition in the first minute of the anneal, the PtAu grain size remained unchanged after up to 1 week, as shown in (B) while the pure Pt exhibited progressive abnormal grain growth. (F) Plan view composition map of an as-deposited thick film used for mechanical testing, showing heterogeneous Au segregation; additional characterization is provided in the supplemental. Also shown is a quantitative line scan of Au composition across the dashed line in (F), showing preferential segregation (i.e. above the global mean composition) to the grain boundary.
Figure 7B:
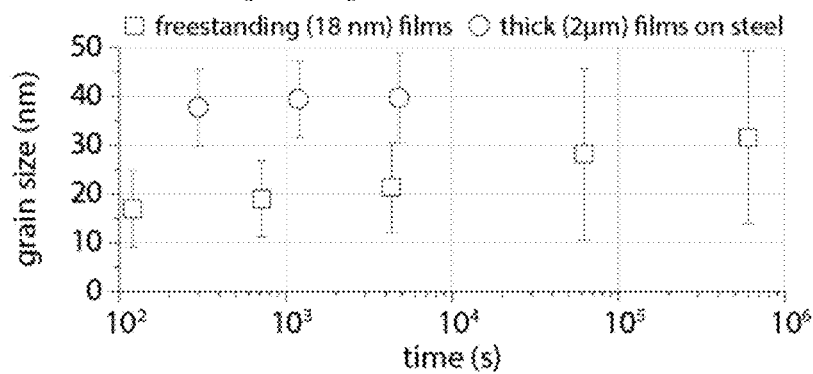
Figure 7C:
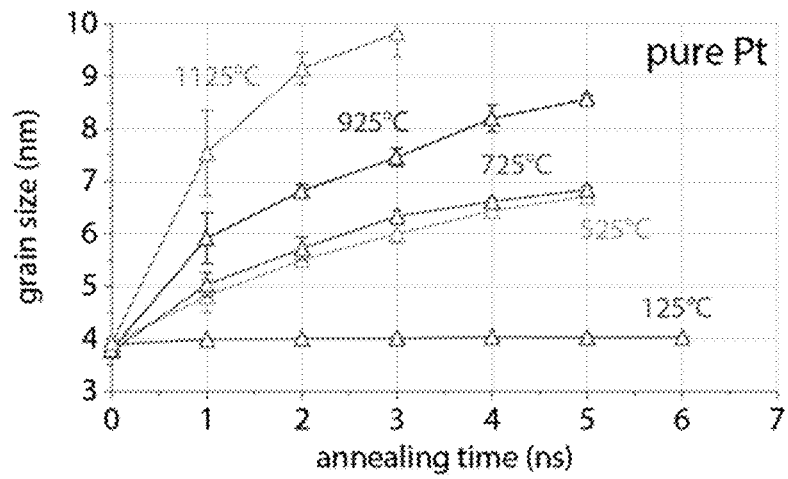
Figure 7D:
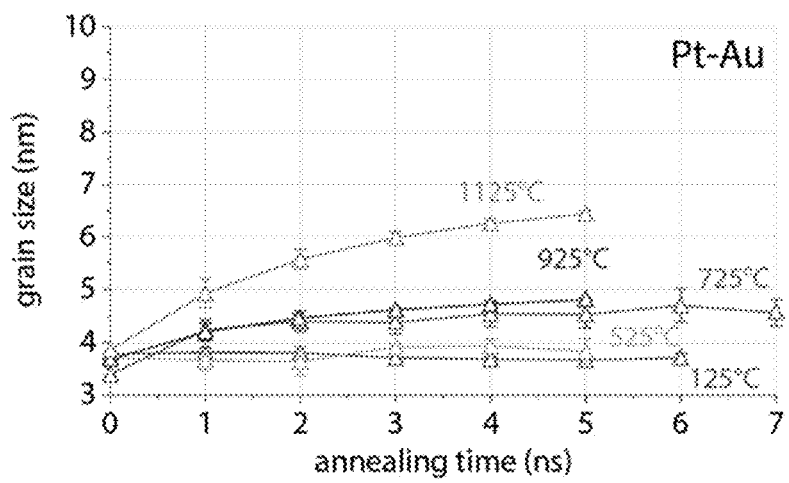

In FIG. 7C-7D, we show the result of grain growth simulations using equiaxed microstructures at varying temperature, comparing pure Pt and PtAu. It is clear that these simulations are in qualitative agreement with experiments showing negligible grain growth for this alloy up to 525° C.

Figure 7E:
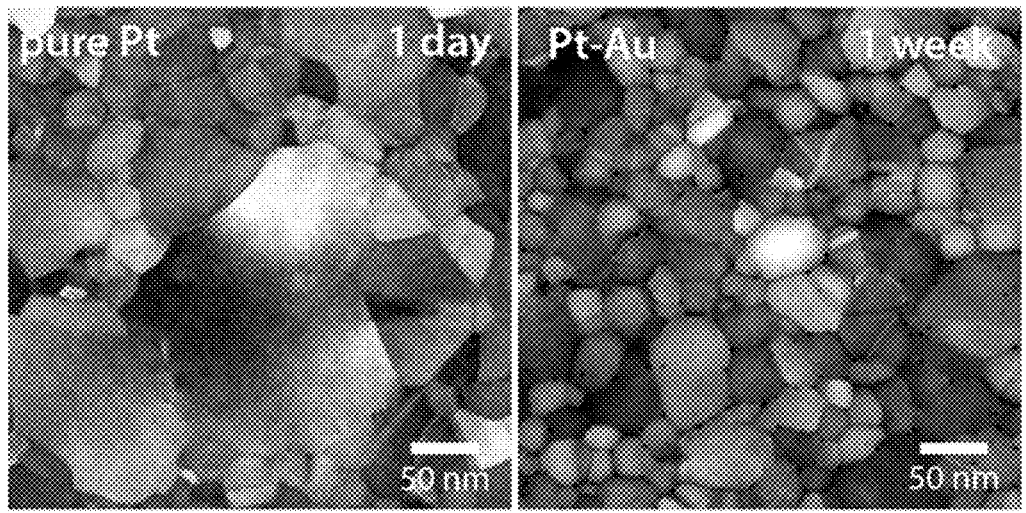
Figure 7F:
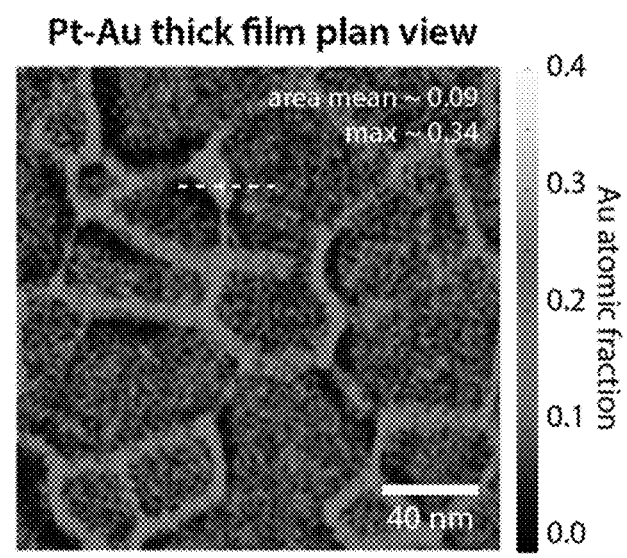

In FIG. 7E, we show representative plan-view TEM images of pure nanocrystalline Pt and PtAu thin films at varying stages of annealing, and a plan view composition map of a thick PtAu film is shown in FIG. 7F. In particular, FIG. 7E-7F shows representative scanning TEM high-angle annular dark-field (STEM-HAADF) images for thin films, and STEM energy dispersive X-ray spectroscopy (STEM-EDS) map and composition line scans for the thick film. Solute enrichment at boundaries and triple junctions was observed in both thin and thick films. For the ~2 μm thick film, solute denuded zones also appeared in the bulk grains adjacent to the boundaries as a result of the segregation behavior.

Typical of magnetron sputter-deposited metal films, all thick films used in this study had a columnar structure with large grain aspect ratios. Thus, for the thick films in annealing and mechanical testing, the reported grain sizes are the average columnar grain diameters based on plan-view images of films sectioned near the middle of the film thickness. In situ X-ray diffraction annealing data suggests a stable grain size of 40-50 nm at temperatures up to 600° C. In both the thin and thick films we found that Au segregated to grain boundaries and free surfaces, with highly heterogeneous distributions.

Segregation of Au in PtAu alloys was explored through equilibrium atomistic (off-lattice) Monte Carlo (MC) simulations. These simulations model the interatomic interactions by an embedded atom method (EAM) potential that predicts a bulk phase diagram in good agreement with experiment. A Metropolis MC algorithm was used to sample off-lattice thermal equilibrium configurations [39,40]. Note that since the procedures allow interchanges between distant atoms, this method does not reflect the kinetic pathways that the physical system will take to reach equilibrium, however the results are representative of equilibrium compositional arrangements.

Consistent with the bulk phase diagram, there are only dilute levels of Au in the grain interiors (see, e.g., plan view of a thick film columnar microstructure in FIG. 7F). The Au forms clusters in the structure, some at triple junctions and others within grain boundaries. Significantly, the Au clusters only occur on a subset of the grain boundaries, suggesting that the tendency towards segregation varies between boundaries. FIG. 7C-7D shows the evolution of the grain size for molecular dynamics anneals of the grain structures at temperatures ranging from 125° C. to 1125° C. The initial grain structure of the Pt was the result of a high-temperature anneal of 5 nm grains created from randomly rotated close-packed spherical nanoparticles with overlaps removed. The alloy cases started with the same initial configuration as the pure Pt case with Au atoms added and segregated via the MC simulations. There is a slight structural relaxation during the MC simulation, so the initial grain structures are similar but not identical. The grain size is determined through cluster labelling that identifies and counts the number of grains in the sample. For the case of pure Pt there is significant grain growth, whereas for the simulations with segregated Au the grain size is essentially unchanged below about 525° C., consistent with the experiments in FIG. 7A-7B.

Figure 8A:
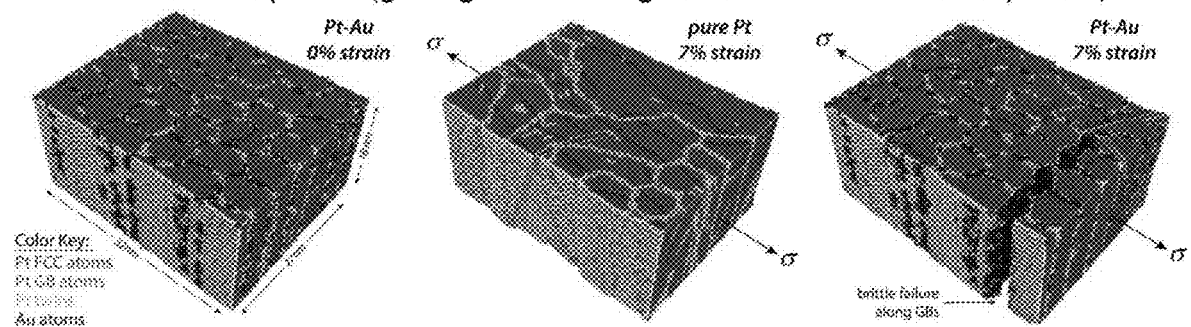
FIG. 8A-8D shows (A) snapshot images at 0 and 7% of uniaxial stress-strain molecular dynamics (MD) simulations; the initial grain structures of Pt and PtAu were identical. Stress-driven grain growth was observed with pure Pt, while the PtAu showed negligible grain growth until brittle fracture. Atoms are classified by a combination of common neighbor analysis and the centro-symmetry parameter, such that Pt and Au atoms in a local face-centered cubic (FCC) environment are colored blue and red, respectively; Pt twins are yellow and Pt at grain boundaries (GBs) and surfaces are gray. (B) Tensile specimen fatigue experiments on freestanding, columnar grained 5 µm thick films of PtAu show evidence of a relatively high endurance limit of about 1 GPa compared to other metals, see, e.g., [36]; because applied contact stresses were below the endurance limit of these films, inhibition of stress-driven grain growth and plastic deformation may have mitigated delamination wear, see, e.g., [37], dramatically reducing wear rate. (C) Experimental stress-strain data for 5 µm thick freestanding films of highly columnar through-the-thickness nanocrystalline pure Pt and PtAu. (D) MD simulation of uniaxial tension stress-strain data for columnar grained nanocrystalline pure Pt and PtAu, corresponding to the simulation snapshots shown in (A).

One notable consistency between the experimental microstructures and computational segregation calculations is that the distribution of Au is not uniform along the grain boundaries but rather occurs in clusters (see, e.g., FIG. 7F and FIG. 8A). In both cases, many of the clusters occur at triple junctions. For those grain boundaries where segregation occurs, Au is not dispersed uniformly along the boundary, but rather is localized to specific spots. In addition, many grain boundaries have minimal Au present after segregation. The qualitative similarities between the experimental and simulation results provide strong support to the assertion that alloy segregation to the grain boundary network is highly heterogeneous both within a given boundary as well as between boundaries of different types.

Figure 8B:
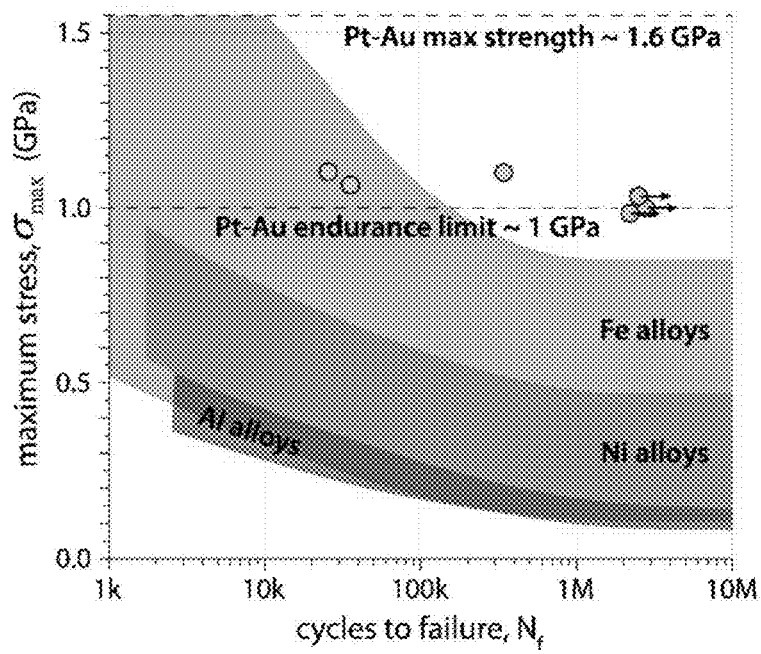

We also performed cyclic fatigue tests using 5 μm thick freestanding columnar grained PtAu dogbones in tension (FIG. 8B) and found no failure up to $3 \times 10^6$ cycles at maximum stresses above 1 GPa, implying a remarkably high endurance limit for these materials (fatigue tests were performed using force-control with an R-ratio of 0.3 and a frequency of 30 Hz—further details in supplemental information section at the end of this chapter). In FIG. 8B, arrows indicate where experiments concluded with no fatigue failure. For fatigue and tensile testing, ~5 μm-thick pure Pt and ~5 μm-thick $Pt_{.90}Au_{.10}$ films were deposited on oxidized Si(100) substrates and laser machined to shape. Laser machining involved a Clark MXR CPA-series Ti:sapphire femtosecond laser. This laser outputs a 775 nm, 150 fs pulse train at 1 kHz. The power was set to 20 mW and focused through a 5× Mitutoyo M Plano APO NIR objective to produce a focused spot on sample with a diameter of ~50 μm. The features were defined by translating the leveled specimen using a computer-controlled Aerotech stage with encoders. Table speed was 1.9 mm/sec. Ten passes were required to ablate through the PtAu films and define dog-bone test samples. Samples were delaminated from substrates by peeling.

Figure 8C:
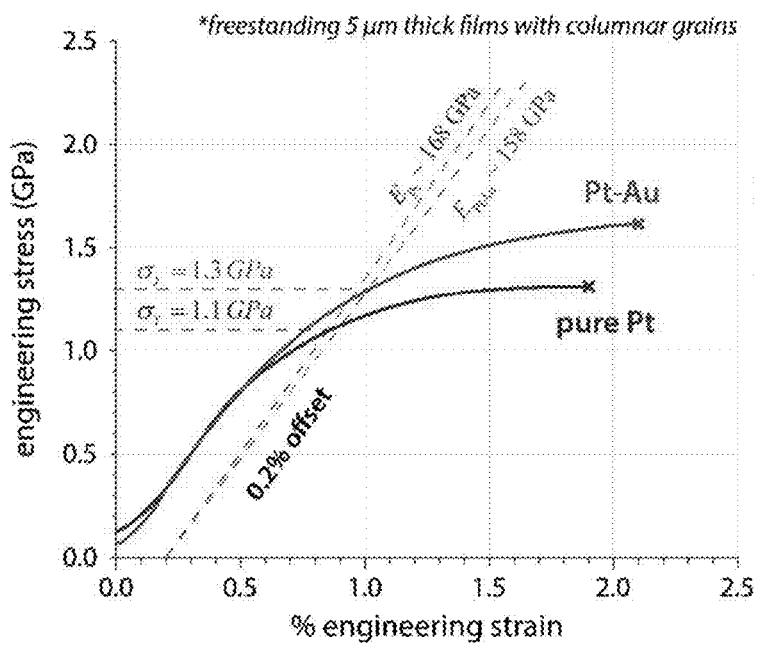
Figure 8D:
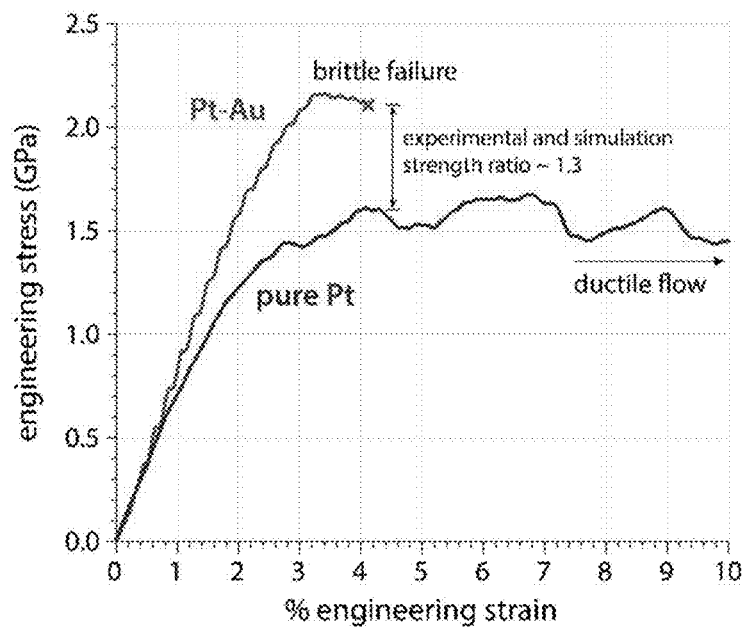

Uniaxial tension tests were used to test whether thermal stability also results in inhibition of mechanically-driven grain growth. A comparison of uniaxial tension experiments and simulations using columnar grained structures is shown in FIG. 8C-8D. A relatively low strain-to-failure of nanocrystalline PtAu was observed in experiments and simulations, and a ratio of ultimate strength for pure Pt and PtAu of 1.3 found in both cases. As expected, the smaller grain size in the simulations (5 nm compared to 50 nm in the tensile specimens) leads to higher strength, and the higher strain rates in the simulations lead to more ductility. However, the simulations are a valuable means of determining the atomic-scale mechanisms responsible for the strength and deformation behavior of these materials. For example, FIG. 8A shows that the pure Pt undergoes significant stress-driven grain growth, compared to the negligible grain growth of the PtAu alloy up to 7% strain. In addition, brittle fracture of the PtAu alloy along grain boundaries was obvious at approximately 4% strain; in FIG. 8A, we present snapshots at 7% where the crack is clearly visible in the PtAu, as is the grain growth and ductile flow of the pure Pt.

Overall, we describe binary nanocrystalline alloys that are intrinsically stable, resulting in a new class of alloys inherently impervious to abnormal thermal environments, large cyclic thermal stresses, and loss of wear-resistance in electrical-tribological components. We identified the highest wear resistance noble metal alloy, which can significantly improve the reliability, cost and efficiency of electrical systems, ranging from commercial devices like cell phones to utility-scale wind turbines.

Unlike conventional electrical contact alloys, which are sensitive to even modest stresses and temperatures, the ability of PtAu alloys to resist grain growth at extreme stresses and temperatures imparts extraordinary wear and fatigue resistance. A two-order-of-magnitude improvement in wear resistance, and concomitant resistance to thermally-driven aging mechanisms, enables several opportunities to dramatically reduce the cost and improve the reliability and performance of electrical devices in a broad range of applications.

Example 7

Nanocrystalline Pt—Au MEMS Electrical Switches

Solid state switches suffer from a critical inherent deficiency that has motivated the search for an alternative ohmic switch technology; fundamentally, semiconductor devices suffer from leakage current losses that draw power and drain batteries even in the off-state. This characteristic of solid state semiconductor devices can be mitigated using a mechanical micro-switch. In part, micro-electromechanical (MEMS) ohmic switches have been unable to replace semiconductor switches due to limitations on electrical insertion loss and switch life.

We propose MEMS switches based on highly stable nanocrystalline metal alloys that remove these limitations and enable the realization of their full potential as a substitute for solid state switches in a wide range of microelectronics applications such as cell phones and high efficiency sensors. Stable nanocrystalline alloys should enable operation at unprecedented temperatures than presently achievable with existing solid state or MEMS technologies.

Figure 9:
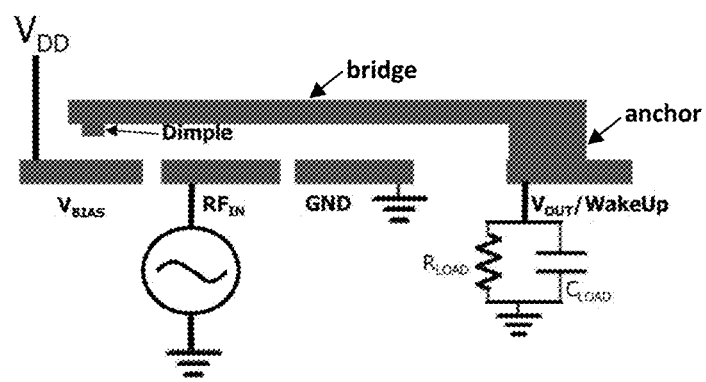
FIG. 9 shows a schematic of an exemplary resonant radiofrequency (RF) mico-electromechanical systems (MEMS) switch.

Any useful portion of a switch can include the alloy and/or DLC film described herein. FIG. 9 provides a schematic of an exemplary switch, in which the dimple located on a bridge is actuated (e.g., pulled towards the contact in which $V_{bias}$ is applied) in response to a modulation signal at the switch resonant frequency (e.g., about 100 kHz). The bridge can include an anchor at its proximal end and a dimple at its distal end.

Figure 10A:
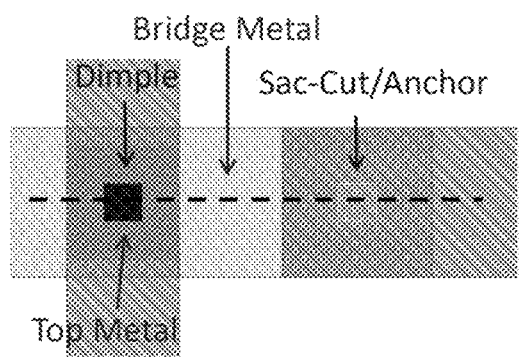
FIG. 10A-10B shows (A) a plan view of an exemplary switch and (B) a microscopy image of a focused ion beam (FIB) cross-section of a single contact structure prior to release (prior to etching of the sacrificial layer) along the dashed line in (A).
Figure 10B:
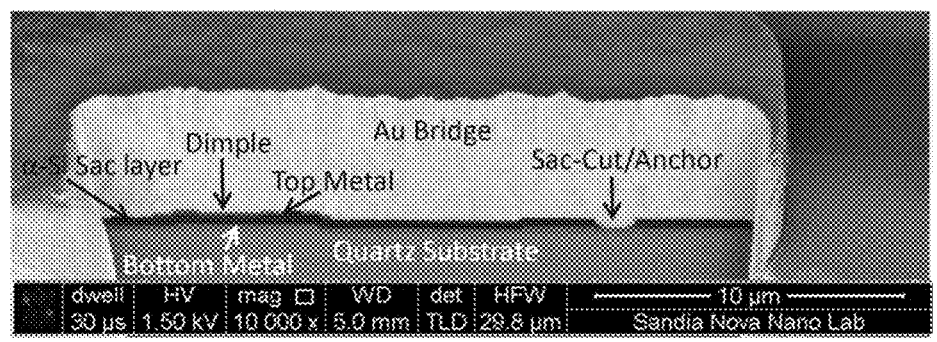
Figure 11:
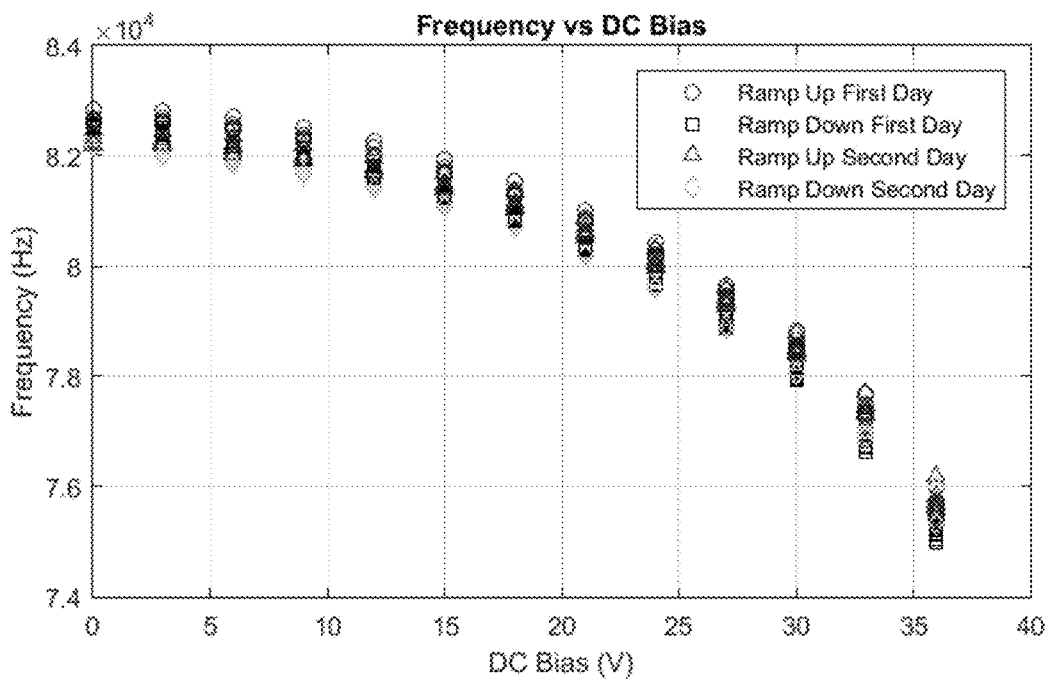
FIG. 11 shows preliminary data characterizing the frequency response of an exemplary PtAu switch while stepping up DC bias in increments of 2V.
Figure 12:
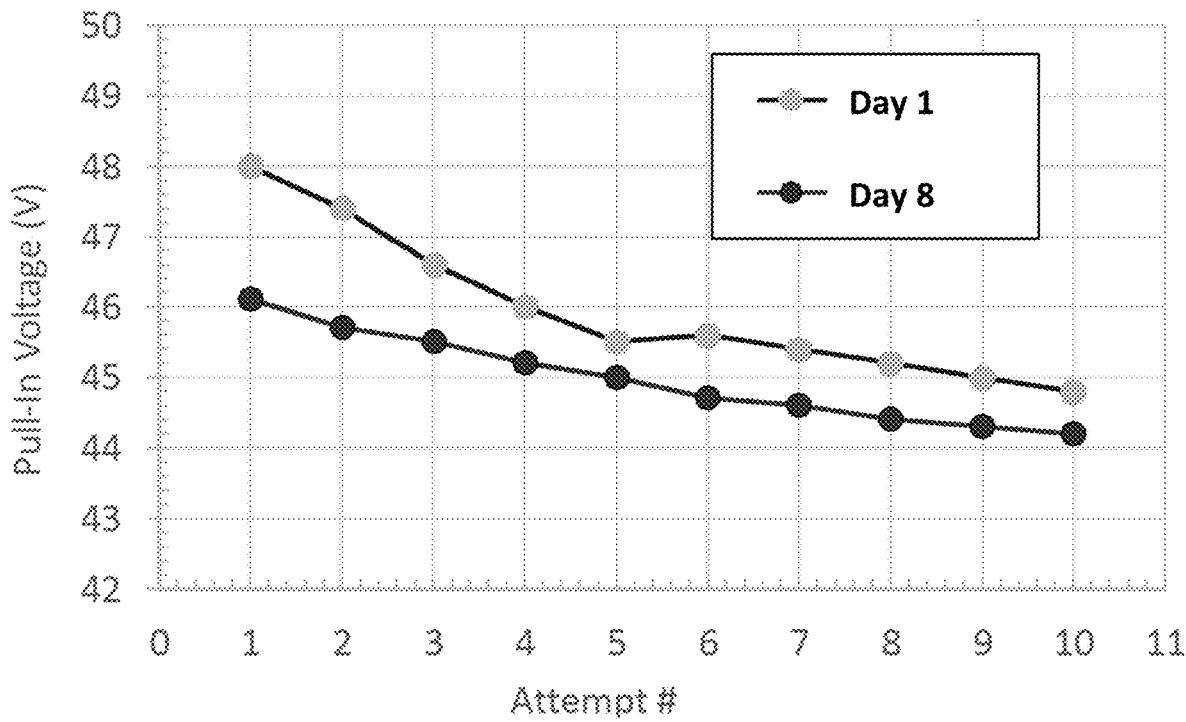
FIG. 12 shows preliminary data characterizing the pull-in voltage over one week.

FIG. 10A-10B provides an exemplary switch having a top metal layer, a bridge metal layer, and a bottom metal layer. As can be seen, the dimple is disposed on a distal end of the bridge and is in line with anchor region located at the proximal end. Upon removing the sacrificial layer (here, a-silicon, such as by dry etch release in $XeF_2$), the bridge will be suspended above lower metal contacts, which in turn are formed of the bottom metal. The upper metal contact (including the dimple) is formed of the top metal. Any of the metal layers or metal contacts can include the alloys and/or films described herein (e.g., the top metal layer, the bottom metal layer, the bridge, the upper metal contact, and/or the lower metal contacts). In some embodiments, the bridge includes a binary alloy (e.g., Pt and Au) and an optional DLC film (e.g., any described herein). In other embodiments, the lower metal contact includes a binary alloy (e.g., Pt and Au) and an optional DLC film (e.g., any described herein). FIG. 11 provides preliminary data characterizing a switch including the PtAu alloy, in which the frequency response was measured while increasing or decreasing the DC bias at 2V increments. This experiment was conducted on day 1 and a week later at day 8 (FIG. 12). For a given DC bias, the change in frequency as a function of attempt number was systematic and reproducible. Furthermore, the switch frequency decreased, i.e., softened over one week rather than stiffened.

In particular embodiments, the MEMS switch employs an alloy displaying thermodynamic and mechanical microstructural stability. One exemplary alloy includes a subset of nanocrystalline binary metal alloys (e.g. grain boundary solute segregated Pt-15 wt. % Au) to enable unprecedented long-life operation of ohmic MEMS switches. Three primary failure mechanisms associated with existing technology are addressed by implementation of these unique alloys: (1) the formation of insulating carbon-based deposits by decomposition and reaction of adsorbates, (2) adhesive failure through mechanical cycling of metal surfaces, and/or (3) loss of restoring force due to diffusional creep in the structural metal. Specifically, these three failure modes generate failure either by progressively larger insertion loss (i.e. contact resistance) or eventual unrecoverable contact adhesion.

The introduction of stable nanocrystalline alloys that also exhibit high catalytic activity for carbon decomposition (e.g. nanocrystalline Au stabilized Pt-matrix alloys) enables mitigation of all three critical failure modes. For example, Pt is a catalyst for the decomposition of organic contaminants into volatile carbonaceous gases (e.g. COx); this property can be used to create a self-cleaning of adsorbate contaminants that are the source of high-electrical resistance failure. Conversely, stress and temperature driven microstructural evolution of the contacting surfaces will eventually result in permanent contact adhesion and failure to separate or switch.

The same characteristics of these alloys that impart high thermal and mechanical stability can act to mitigate the eventual progression to failure through microstructural evolution. Additionally, these alloys are insensitive to temperature up to homologous temperatures of 0.5 or more (e.g. for Pt—Au, temperatures as high as 500° C. have been demonstrated), enabling operation of the contact at previously impractically high temperatures. The ability for high temperature operation greatly expands the design space, and enables higher current density operation and/or switch miniaturization for a given power requirement.

As also described herein, such alloys can be used in conjunction with DLC films, which can be formed in situ. Thus, in particular non-limiting embodiments, a MEMS switch can include a binary alloy (e.g., any described herein) and a DLC film, in which the film is formed in situ (e.g., employing any method described herein).

In other embodiments, these stable nanocrystalline alloys can serve as both the structural and contact surface material, greatly simplifying fabrication and effectively mitigating fabrication-defect related failure (e.g. film delamination). Additionally, microstructural evolution of the structural members of the MEMS switches has been associated with variability over time in the operating performance; for example, the voltage required to close the contact can change over time as a function of increasing total cycles of operation. Avoiding multilayer structures of dissimilar materials by using monolithic devices made of highly stable nanocrystalline alloys should reduce or mitigate variability in device response to input signals.

Example 8

Load-Dependent Friction Behavior of DLC PtAu Tribofilm

Figure 13A:
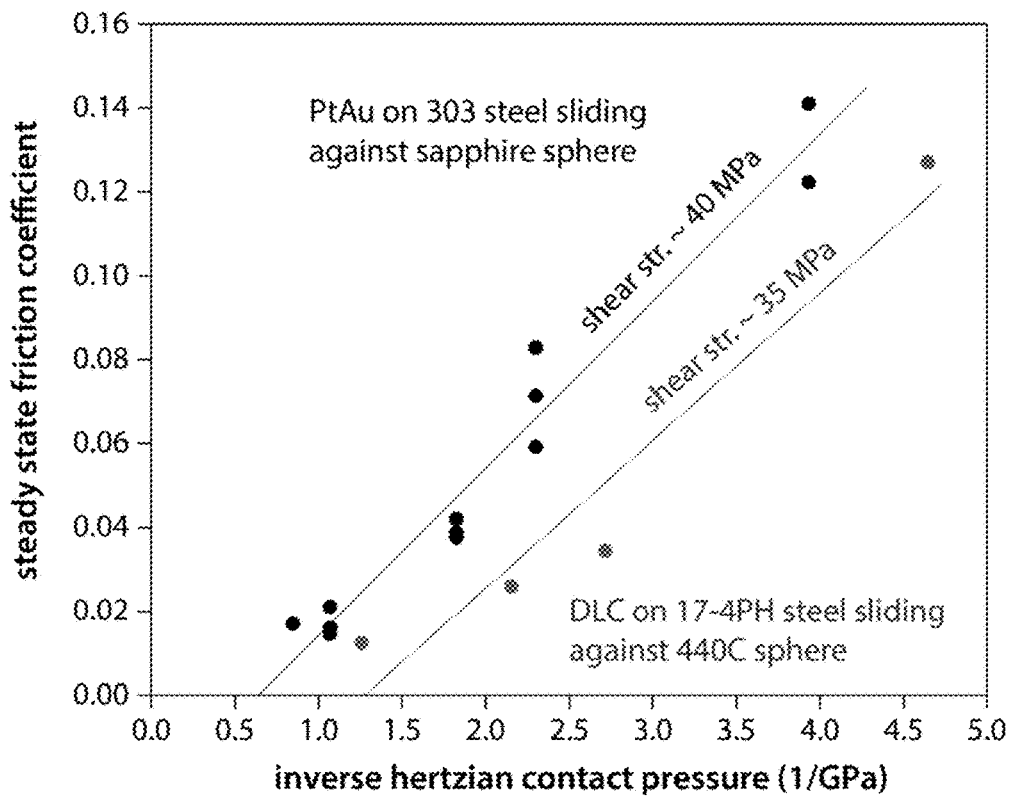
FIG. 13A-13C shows preliminary data characterizing load-dependent behavior of an exemplary DLC-PtAu tribofilm. Provided are (A) a graph showing that experimental determined shear strength for the DLC-PtAu tribofilm (shear stress ~40 MPa) is commensurate with commercial DLC films (shear stress ~35 MPa), (B) an SEM image and Raman spectroscopy image (inset) of the wear track obtained at a low load (about 10 mN), and (C) Raman spectra acquired on the wear track shown in FIG. 13B.
Figure 13B:
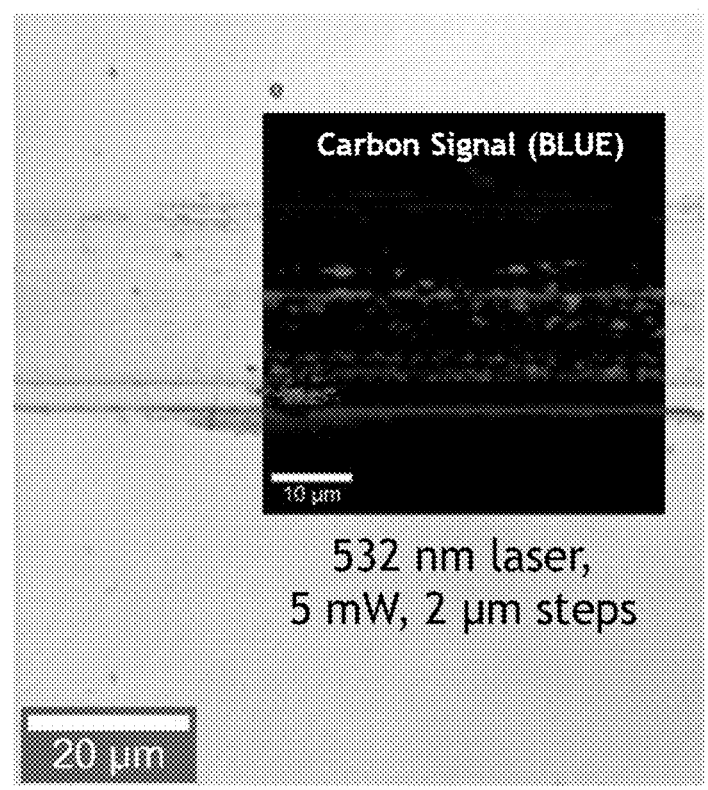
Figure 13C:
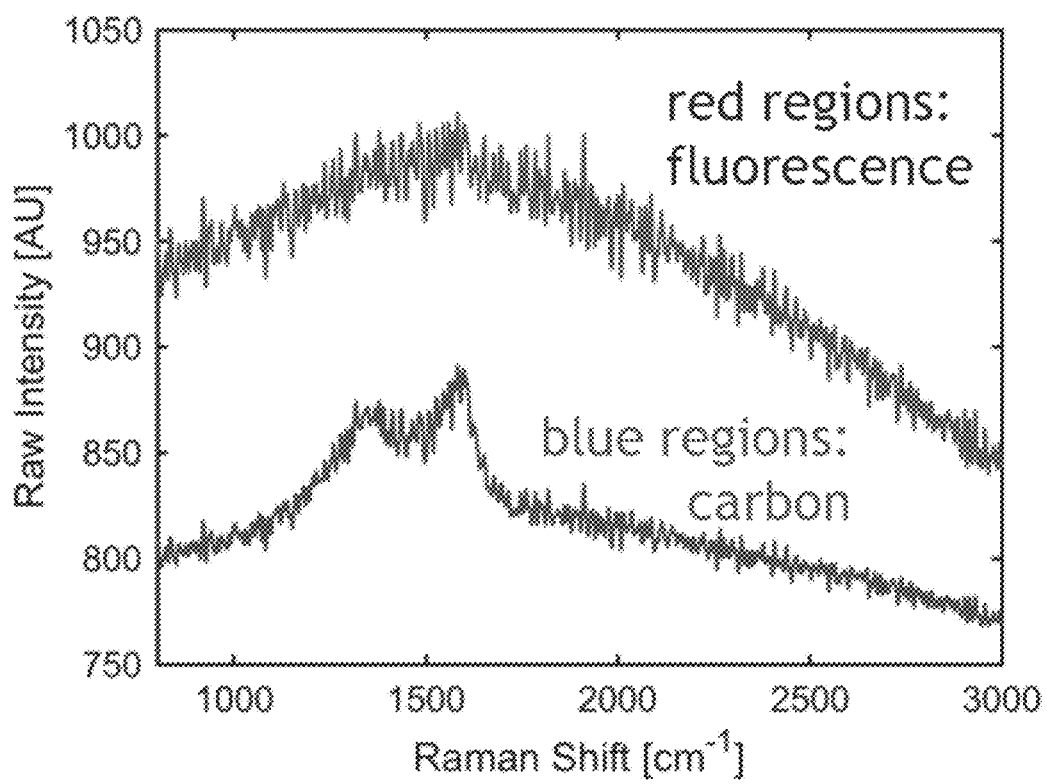

Further experiments were conducted to determine the shear strength of the DLC film obtained on the PtAu track. As seen in FIG. 13A, experimental shear strengths for the DLC-PtAu film were commensurate with commercial DLC films. Even at low loads, we observed DLC formation (FIG. 13B-13C). In fact, experiments were conducted with lower contact pressures and at a lower number of cycles (2,000 cycles), which still resulted in the formation of DLC, as confirmed by Raman spectroscopy.

REFERENCES

[1] Wang B, "Recent development of non-platinum catalysts for oxygen reduction reaction," *J. Power Sources* 2005;152:1-15.

[2] Burch R et al., "A review of the selective reduction of $NO_x$ with hydrocarbons under lean-burn conditions with non-zeolitic oxide and platinum group metal catalysts," *Appl. Catal. B Environ.* 2002;39:283-303.

[3] Serov A et al., "Review of non-platinum anode catalysts for DMFC and PEMFC application," *Appl. Catal. B Environ.* 2009;90:313-320.

[4] Periana R A et al., "Platinum catalysts for the high-yield oxidation of methane to a methanol derivative," *Science* 1998;280:560-564.

[5] Qi Y et al., "Theoretical modeling of tribochemical reaction on Pt and Au contacts: mechanical load and catalysis," *ACS Appl. Mater. Interfaces* 2016;8:7529-7535.

[6] Erdemir A et al., "Carbon-based tribofilms from lubricating oils," *Nature* 2016;536:67-71.

[7] Kajdas C et al., "Tribochemistry, tribocatalysis, and the negative-ion-radical action mechanism," *Proc. Inst. Mech. Eng. Part J: J. Eng. Tribol.* 2009;223:827-848.

[8] Hiratsuka K et al., "Tribo-catalysis in the synthesis reaction of carbon dioxide," *Tribol. Trans.* 2004;47:86-93.

[9] Gosvami N N et al., "Mechanisms of antiwear tribofilm growth revealed in situ by single-asperity sliding contacts," *Science* 2015;348:102-106.

[10] Crobu M et al., "Tribochemistry of bulk zinc metaphosphate glasses," *Tribol. Lett.* 2010;39:121-134.

[11] Zhang J et al., "On the mechanism of ZDDP antiwear film formation," *Tribol. Lett.* 2016;63:24 (15 pp.).

[12] Yang L et al., "Well-dispersed PtAu nanoparticles loaded into anodic titania nanotubes: a high antipoison and stable catalyst system for methanol oxidation in alkaline media," *J. Phys. Chem. C* 2007;111:16613-16617.

[13] Zhang J et al., "Highly active PtAu alloy nanoparticle catalysts for the reduction of 4-nitrophenol," *Nanoscale* 2014;6:2125-2130.

[14] Murdoch H A et al., "Stability of binary nanocrystalline alloys against grain growth and phase separation," *Acta Mater.* 2013;61:2121-2132.

[15] Curry J F et al., "Achieving ultralow wear with stable nanocrystalline metals," *Adv. Mater.* 2018;30:1802026 (7 pp.).

[16] Erdemir A et al., "Tribology of diamond-like carbon films: recent progress and future prospects," *J Phys. D. Appl. Phys.* 2006;39:R311-R327.

[17] Vetter J, "60 years of DLC coatings: historical highlights and technical review of cathodic arc processes to synthesize various DLC types, and their evolution for industrial applications," *Surf Coatings Technol.* 2014;257:213-240.

[18] Robertson J, "Diamond-like amorphous carbon," *Mater. Sci. Eng. R Rep.* 2002;37:129-281.

[19] Berman D et al., "Few layer graphene to reduce wear and friction on sliding steel surfaces," *Carbon* 2013;54:454-459.

[20] Scharf T W et al., "Solid lubricants: a review," *J. Mater. Sci.* 2013;48:511-531.

[21] Cui L et al., "Probing the low-friction mechanism of diamond-like carbon by varying of sliding velocity and vacuum pressure," *Carbon* 2014;66:259-266.

[22] Kim H I et al., "Environmental effects on the friction of hydrogenated DLC films," *Tribol. Lett.* 2006;21:51-56.

[23] Lu P et al., "On the thermal stability and grain boundary segregation in nanocrystalline PtAu alloys," *Materialia* 2019;6:100298 (9 pp.).

[24] Erickson G M et al., "Paleo-tribology: development of wear measurement techniques and a three-dimensional model revealing how grinding dentitions self-wear to enable functionality," *Surf Topogr. Metrol. Prop.* 2016;4:024001 (12 pp.).

[25] Schmitz T L et al., "Wear-rate uncertainty analysis," *J. Tribol.* 2004;126:802-808.

[26] Sutton D C et al., "The friction of diamond-like carbon coatings in a water environment," *Friction* 2013;1:210-221.

[27] Marino M J et al., "Is ultra-low friction needed to prevent wear of diamond-like carbon (DLC)? an alcohol vapor lubrication study for stainless steel/DLC interface," *Tribol. Lett.* 2011;42:285-291.

[28] Casiraghi C et al., "Raman spectroscopy of hydrogenated amorphous carbons," *Phys. Rev. B* 2005;72:085401 (14 pp.)

[29] Ferrari A C et al., "Interpretation of Raman spectra of disordered and amorphous carbon," *Phys. Rev. B* 2000;61:14095-14107.

[30] Barbour J C et al., "Elastic Recoil Detection: ERD," in *Handbook of Modern Ion Beam Materials Analysis* (J. R. Tesmer, M. Nastasi, eds.), Materials Research Society, Pittsburgh, Pa., 1995, pp. 83-138.

[31] Rose F et al., "Complete characterization by Raman spectroscopy of the structural properties of thin hydrogenated diamond-like carbon films exposed to rapid thermal annealing," *J. Appl. Phys.* 2014;116:123516 (12 pp.).

[32] Chen X et al., "Evolution of tribo-induced interfacial nanostructures governing superlubricity in a-C:H and a-C:H:Si films," *Nat. Commun.* 2017;8:1675 (13 pp.).

[33] McKenzie D R et al., "Compressive-stress-induced formation of thin-film tetrahedral amorphous carbon," *Phys. Rev. Lett.* 1991;67:773-776.

[34] Chenoweth K et al., "ReaxFF reactive force field for molecular dynamics simulations of hydrocarbon oxidation," *J. Phys. Chem. A* 2008;112:1040-1053.

[35] Asay D B et al., "Macro- to nanoscale wear prevention via molecular adsorption," *Langmuir* 2008;24:155-159.

[36] Padilla II H A et al., "A review of fatigue behaviors in nanocrystalline metals," *Exp. Mech.* 2010;50:5-23.

[37] Suh N P, "An overview of the delamination theory of wear," *Wear* 1977;44:1-16.

[38] Thompson C V, "Grain growth in thin films," *Annu. Rev. Mater. Sci.* 1990;20:245-268.

[39] Seki A et al., "Monte Carlo simulations of segregation at [001] twist boundaries in a Pt(Au) alloy—I. results," *Acta Metall. Mater.* 1991;39:3167-3177.

[40] Foiles S M, "Calculation of grain-boundary segregation in Ni—Cu alloys," *Phys. Rev. B* 1989;40:11502-11506.

Other embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method of forming a film, the method comprising: providing a first surface comprising a first binary alloy, wherein the first binary alloy comprises a plurality of columnar grains, and wherein at least one grain has a grain diameter of less than about 100 nm and/or an aspect ratio of at least one grain is 1:2 or greater; contacting the first surface with a second surface in the presence of one or more organic compounds; and generating a film disposed between first and second surfaces, wherein the film comprises diamond-like carbon.

2. The method of claim 1, wherein the contacting comprising providing a continuous flow of the one or more organic compounds.

3. The method of claim 2, wherein the one or more organic compounds comprises a volatile compound in combination with a gas.

4. The method of claim 3, wherein the gas has a partial pressure of oxygen and water of less than about 100 ppm each.

5. The method of claim 3, wherein the gas consists essentially of an inert gas or a combination of inert gases.

6. The method of claim 5, wherein the inert gas comprises helium, nitrogen, or argon.

7. The method of claim 1, wherein the one or more organic compounds comprises an optionally substituted alcohol, an optionally substituted carboxylic acid, an optionally substituted acid anhydride, an optionally substituted acetal, an optionally substituted alkane, an optionally substituted alkene, and/or an optionally substituted arene.

8. The method of claim 7, wherein the one or more organic compounds comprises an alkanol, a phenol, an aldehyde, a ketone, an alkene, and/or an alkane.

9. The method of claim 1, wherein the one or more organic compounds is present at a concentration of from about 0.001 ppb to about 10 ppb.

10. The method of claim 1, wherein the generating comprises sliding the first surface against the second surface for a plurality of cycles, and wherein the plurality of cycles comprises of from about 50 to about 100,000 cycles of bi-directional sliding.

11. The method of claim 1, wherein the generating comprises sliding the first surface against the second surface at a contact pressure of from about 200 MPa to about 2 GPa.

12. The method of claim 1, wherein the film has a thickness of from about 20 nm to about 500 nm.

13. The method of claim 12, wherein the film further comprises a plurality of nanoparticles comprising the first binary alloy.

14. The method of claim 1, wherein the first surface is disposed on a first electric contact and the second surface is disposed on a second electric contact.

15. The method of claim 1, wherein the binary alloy comprises one or more noble metals selected from the group consisting of Ag, Al, Au, Ba, Be, Bi, Ca, Cd, Co, Cr, Cs, Cu, Fe, Ga, Ge, Hf, In, Ir, K, La, Li, Mg, Mn, Mo, Na, Nb, Ni, Os, Pb, Pd, Pt, Rb, Re, Rh, Ru, Sb, Sc, Sn, Sr, Ta, Tc, Th, Ti, Tl, V, W, Y, Zn, and Zr.

16. The method of claim 15, wherein the binary alloy comprises Pt and Au.

17. The method of claim 16, wherein the binary alloy comprises less than about 50 atom percent of Au.

* * * * *